US012527192B2

(12) United States Patent
Ikeda et al.

(10) Patent No.: US 12,527,192 B2
(45) Date of Patent: Jan. 13, 2026

(54) DISPLAY APPARATUS, DISPLAY MODULE, ELECTRONIC DEVICE, AND METHOD FOR MANUFACTURING DISPLAY APPARATUS

(71) Applicant: SEMICONDUCTOR ENERGY LABORATORY CO., LTD., Atsugi (JP)

(72) Inventors: Takayuki Ikeda, Kanagawa (JP); Yoshiaki Oikawa, Kanagawa (JP); Natsuko Takase, Kanagawa (JP); Kensuke Yoshizumi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 607 days.

(21) Appl. No.: 17/735,683

(22) Filed: May 3, 2022

(65) Prior Publication Data
US 2022/0367575 A1   Nov. 17, 2022

(30) Foreign Application Priority Data

May 13, 2021 (JP) ................................. 2021-081730

(51) Int. Cl.
*H10K 59/35* (2023.01)
*H10K 59/12* (2023.01)
(Continued)

(52) U.S. Cl.
CPC ......... *H10K 59/353* (2023.02); *H10K 59/122* (2023.02); *H10K 59/38* (2023.02);
(Continued)

(58) Field of Classification Search
CPC ..... H10K 59/38; H10K 59/353; H10K 59/122
See application file for complete search history.

(56) References Cited

U.S. PATENT DOCUMENTS

| 5,953,985 A | 9/1999 | Kobayashi |
| 6,120,338 A | 9/2000 | Hirano et al. |

(Continued)

FOREIGN PATENT DOCUMENTS

| JP | 2000-036385 A | 2/2000 |
| JP | 2003-059663 A | 2/2003 |

(Continued)

OTHER PUBLICATIONS

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

(Continued)

*Primary Examiner* — Matthew L Reames
(74) *Attorney, Agent, or Firm* — NIXON PEABODY LLP; Jeffrey L. Costellia

(57) ABSTRACT

A high-resolution display apparatus is provided. The display apparatus includes a first to a fourth subpixels continuously lined up in this order, where the first and second subpixels emit light of a first color and the third and fourth subpixels emit light of a second color. The first color and the second color are different from each other. The first subpixel includes a first light-emitting device and a first coloring layer overlapping with the first light-emitting device; the second subpixel includes a second light-emitting device and the first coloring layer overlapping with the second light-emitting device; the third subpixel includes a third light-emitting device and a second coloring layer overlapping with the third light-emitting device; and the fourth subpixel includes a fourth light-emitting device and the second coloring layer overlapping with the fourth light-emitting device. The first to fourth light-emitting devices emit light of one color and are driven independently. Light transmitted (Continued)

through the first coloring layer and light transmitted through the second coloring layer exhibit different colors from each other.

18 Claims, 28 Drawing Sheets

(51) Int. Cl.
  *H10K 59/122* (2023.01)
  *H10K 59/38* (2023.01)
  *H10K 59/80* (2023.01)
  *H10K 71/40* (2023.01)

(52) U.S. Cl.
  CPC ....... *H10K 59/1201* (2023.02); *H10K 59/873* (2023.02); *H10K 71/40* (2023.02)

(56) References Cited

U.S. PATENT DOCUMENTS

| | | | |
|---|---|---|---|
| RE48,229 E * | 9/2020 | Peng | H10K 59/352 |
| 2002/0072139 A1 | 6/2002 | Kashiwabara | |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2015/0109188 A1 * | 4/2015 | Huang | G09G 3/3225 345/77 |
| 2016/0172595 A1 | 6/2016 | Malinowski et al. | |
| 2016/0315133 A1 | 10/2016 | Sato | |
| 2016/0329385 A1 * | 11/2016 | Qiu | H10K 59/352 |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2019/0081116 A1 * | 3/2019 | Kondo | H10K 71/00 |
| 2020/0203662 A1 | 6/2020 | Mollard et al. | |
| 2022/0209162 A1 | 6/2022 | Seo et al. | |

FOREIGN PATENT DOCUMENTS

| | | |
|---|---|---|
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| WO | WO-2018/087625 | 5/2018 |

OTHER PUBLICATIONS

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Papadopoulos.N et al., "AMOLED Displays with In-Pixel Photodetector", Liquid Crystals and Display Technology, Jul. 9, 2020, pp. 1-19.

Zakhidov.A et al., "Orthogonal processing: A new strategy for organic electronics", Chem. Sci. (Chemical Science), Apr. 7, 2011, vol. 2, No. 6, pp. 1178-1182.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Gather.M et al., "P-181: Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

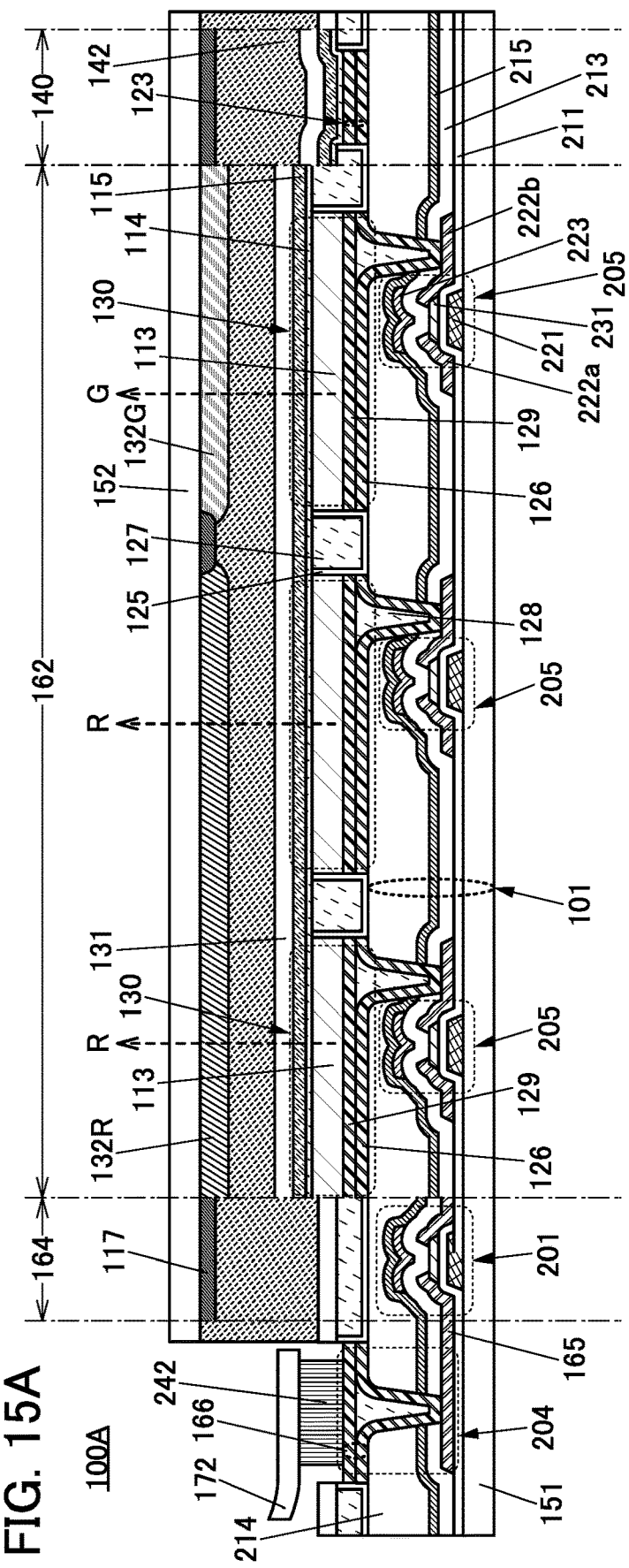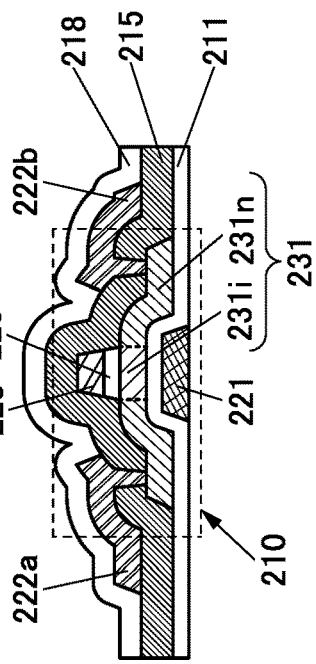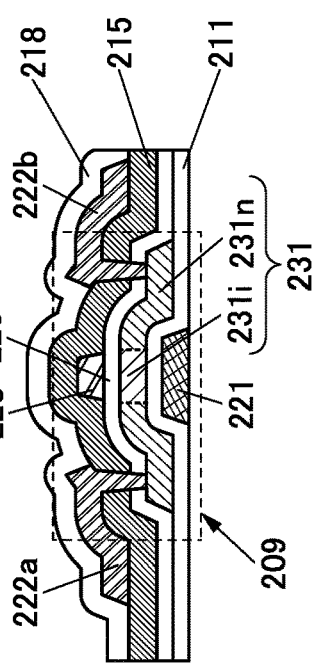
FIG. 15A
FIG. 15B
FIG. 15C

DISPLAY APPARATUS, DISPLAY MODULE, ELECTRONIC DEVICE, AND METHOD FOR MANUFACTURING DISPLAY APPARATUS

BACKGROUND OF THE INVENTION

1. Field of the Invention

One embodiment of the present invention relates to a display apparatus, a display module, and an electronic device. One embodiment of the present invention relates to a method for manufacturing a display apparatus.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof.

2. Description of the Related Art

Recent display apparatuses have been expected to be applied to a variety of uses. Usage examples of large-sized display apparatuses include a television device for home use (also referred to as TV or television receiver), digital signage, and a public information display (PID). In addition, a smartphone and a tablet terminal each including a touch panel, and the like, are being developed as portable information terminals.

In recent years, higher-resolution display apparatuses have been required. For example, devices for virtual reality (VR), augmented reality (AR), substitutional reality (SR), or mixed reality (MR) are given as devices required by high-resolution display apparatuses and have been actively developed in recent years.

Light-emitting apparatuses including light-emitting devices (also referred to as light-emitting elements) have been developed as display apparatuses, for example. Light-emitting devices utilizing electroluminescence (hereinafter referred to as EL; such devices are also referred to as EL devices or EL elements) have features such as ease of reduction in thickness and weight, high-speed response to input signals, and driving with a constant DC voltage power source, and have been used in display apparatuses.

Patent Document 1 discloses a display apparatus using an organic EL device (also referred to as organic EL element) for VR.

REFERENCE

[Patent Document 1] PCT International Publication No. 2018/087625

SUMMARY OF THE INVENTION

An object of one embodiment of the present invention is to provide a high-resolution display apparatus. An object of one embodiment of the present invention is to provide a high-definition display apparatus. An object of one embodiment of the present invention is to provide a highly reliable display apparatus.

An object of one embodiment of the present invention is to provide a method for manufacturing a high-resolution display apparatus. An object of one embodiment of the present invention is to provide a method for manufacturing a high-definition display apparatus. An object of one embodiment of the present invention is to provide a method for manufacturing a highly reliable display apparatus. An object of one embodiment of the present invention is to provide a method for manufacturing a display apparatus with a high yield.

Note that the description of these objects does not preclude the existence of other objects. One embodiment of the present invention does not need to achieve all of these objects. Other objects can be derived from the description of the specification, the drawings, and the claims.

One embodiment of the present invention is a display apparatus including a first subpixel, a second subpixel, a third subpixel, and a fourth subpixel, which are continuously lined up in this order in a first direction. The first subpixel and the second subpixel emit light of a first color, and the third subpixel and the fourth subpixel emit light of a second color. The first color and the second color are different from each other. The first subpixel includes a first light-emitting device and a first coloring layer overlapping with the first light-emitting device. The second subpixel includes a second light-emitting device and the first coloring layer overlapping with the second light-emitting device. The third subpixel includes a third light-emitting device and a second coloring layer overlapping with the third light-emitting device. The fourth subpixel includes a fourth light-emitting device and the second coloring layer overlapping with the fourth light-emitting device. The first to fourth light-emitting devices emit light of one color and are driven independently of each other. Light transmitted through the first coloring layer and light transmitted through the second coloring layer exhibit different colors from each other.

One embodiment of the present invention is a display apparatus including a first subpixel, a second subpixel, a third subpixel, a fourth subpixel, a fifth subpixel, and a sixth subpixel, where the first subpixel, the second subpixel, and the third subpixel emit light of a first color and the fourth subpixel, the fifth subpixel, and the sixth subpixel emit light of a second color. The first color and the second color are different from each other. The first subpixel is adjacent to the second subpixel in a first direction and adjacent to the third subpixel in a second direction. The fourth subpixel is adjacent to the fifth subpixel in the first direction and adjacent to the sixth subpixel in the second direction. The first direction and the second direction intersect with each other. The fifth subpixel is adjacent to the first subpixel in the first direction. The first subpixel includes a first light-emitting device and a first coloring layer overlapping with the first light-emitting device, the second subpixel includes a second light-emitting device and the first coloring layer overlapping with the second light-emitting device, and the third subpixel includes a third light-emitting device and the first coloring layer overlapping with the third light-emitting device. The fourth subpixel includes a fourth light-emitting device and a second coloring layer overlapping with the fourth light-emitting device, the fifth subpixel includes a fifth light-emitting device and the second coloring layer overlapping with the fifth light-emitting device, and the sixth subpixel includes a sixth light-emitting device and the second coloring layer overlapping with the sixth light-emitting device. The first to sixth light-emitting devices emit light of one color and are driven independently of each other. Light transmitted through the first coloring layer and light transmitted through the second coloring layer exhibit different colors from each other.

The first light-emitting device preferably emits white light.

The first light-emitting device preferably includes a first EL layer with an island shape, and the second light-emitting device preferably includes a second EL layer with an island shape.

The display apparatus with any of the above structures preferably includes an insulating layer covering at least a part of a side surface of the first EL layer and at least a part of a side surface of the second EL layer. The insulating layer preferably includes an inorganic insulating layer in contact with at least the part of the side surface of the first EL layer and at least the part of the side surface of the second EL layer. The insulating layer preferably includes an organic insulating layer overlapping with at least the part of the side surface of the first EL layer and at least the part of the side surface of the second EL layer with the inorganic insulating layer sandwiched therebetween.

The first light-emitting device preferably includes a common layer over the first EL layer, and the second light-emitting device preferably includes the common layer over the second EL layer. The common layer preferably includes at least one of a hole-injection layer, a hole-transport layer, a hole-blocking layer, an electron-blocking layer, an electron-transport layer, and an electron-injection layer.

One embodiment of the present invention is a display module including the display apparatus with any of the above structures. The display module is provided with a connector such as a flexible printed circuit (FPC) or a tape carrier package (TCP), or an integrated circuit (IC) by a chip on glass (COG) method, a chip on film (COF) method, or the like.

One embodiment of the present invention is an electronic device including the display module and at least one of a housing, a battery, a camera, a speaker, and a microphone.

One embodiment of the present invention is a method for manufacturing a display apparatus including the following steps: a step of forming a first pixel electrode, a second pixel electrode, a third pixel electrode, and a fourth pixel electrode so as to be arranged in this order in a first direction; a step of forming an EL layer over the first to fourth pixel electrodes; a step of processing the EL layer by a photolithography method to form a first EL layer, a second EL layer, a third EL layer, and a fourth EL layer over the first pixel electrode, the second pixel electrode, the third pixel electrode, and the fourth pixel electrode, respectively; a step of forming a common electrode over the first to fourth EL layers; and a step of forming a first coloring layer and a second coloring layer over the common electrode so that the first coloring layer overlaps with the first pixel electrode and the second pixel electrode and the second coloring layer overlaps with the third pixel electrode and the fourth pixel electrode.

One embodiment of the present invention can provide a high-resolution display apparatus. One embodiment of the present invention can provide a high-definition display apparatus. One embodiment of the present invention can provide a highly reliable display apparatus.

One embodiment of the present invention can provide a method for manufacturing a high-resolution display apparatus. One embodiment of the present invention can provide a method for manufacturing a high-definition display apparatus. One embodiment of the present invention can provide a method for manufacturing a highly reliable display apparatus. One embodiment of the present invention can provide a method for manufacturing a display apparatus with a high yield.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

FIG. 15A is a cross-sectional view illustrating an example of a display apparatus; FIGS. 15B and 15C are cross-sectional views each illustrating an example of a transistor.

DETAILED DESCRIPTION OF THE INVENTION

Figure 1:
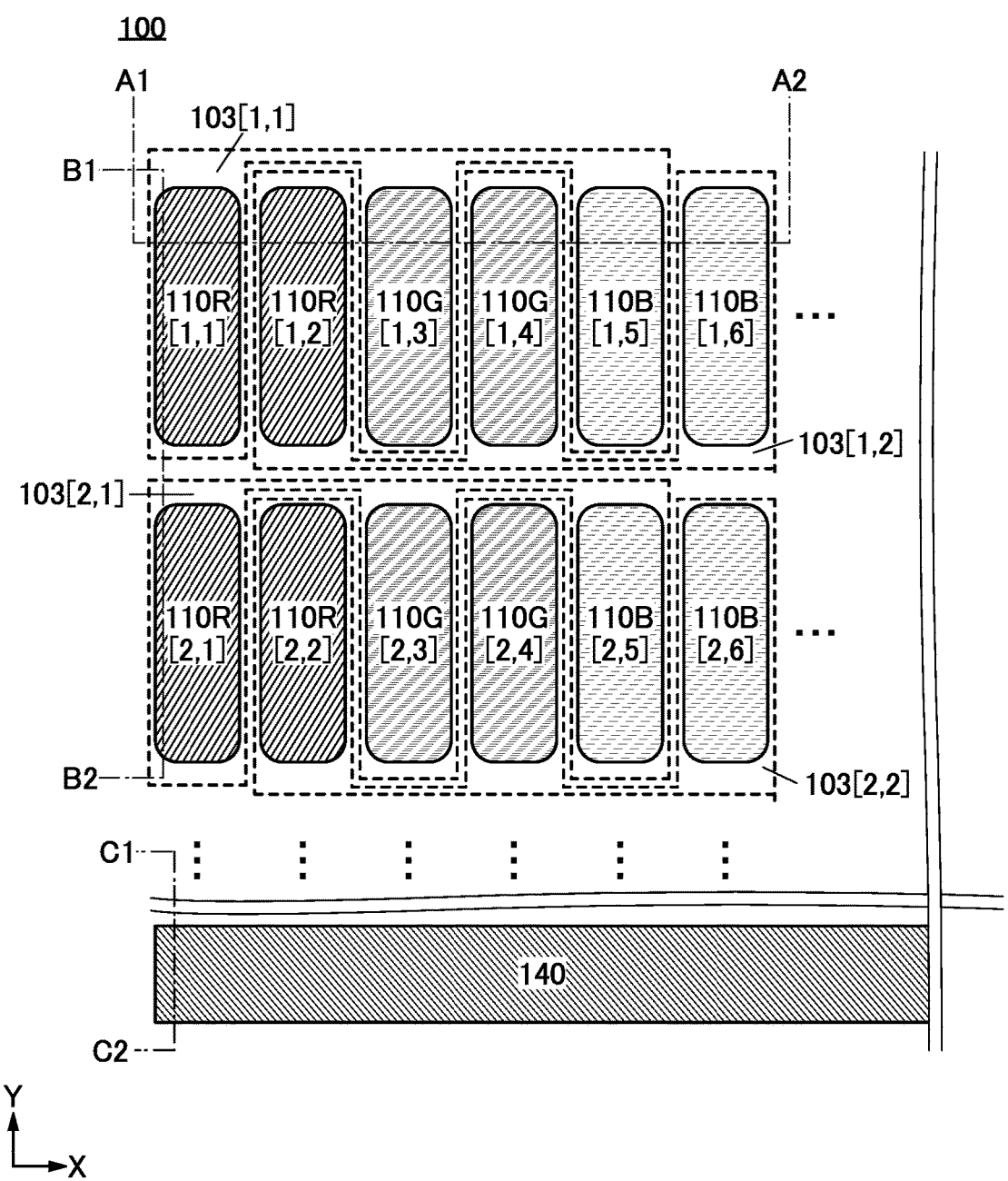
FIG. 1 is a top view illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the terms "film" and "layer" can be used interchangeably depending on the case or the circumstances. For example, the term "conductive layer" can be replaced with the term "conductive film". As another example, the term "insulating film" can be replaced with the term "insulating layer".

In this specification and the like, a device formed using a metal mask or a fine metal mask (FMM) may be referred to as a device having a FMM structure or a metal mask (MM) structure. In this specification and the like, a device formed without using a metal mask or an FMM may be referred to as a device having a metal maskless (MML) structure.

Embodiment 1

In this embodiment, a display apparatus of one embodiment of the present invention and a manufacturing method thereof will be described with reference to FIG. 1 to FIG. 13.

The display apparatus of one embodiment of the present invention includes a first subpixel, a second subpixel, a third subpixel, and a fourth subpixel, which are continuously lined up in this order in a first direction. The first subpixel and the second subpixel emit light of a first color, and the third subpixel and the fourth subpixel emit light of a second color. The first color and the second color are different from each other. In the display apparatus, each subpixel includes one light-emitting device, and the light-emitting devices can be driven independently of each other.

For example, a case where stripe arrangement is employed for a pixel layout in the display apparatus of one embodiment of the present invention is considered. When the first direction is the row direction, one row has a portion where a subpixel emitting light of the first color, another subpixel emitting light of the first color, a subpixel emitting light of the second color, and another subpixel emitting light of the second color are continuously lined up in this order. In other words, in one column, subpixels emitting light of the first color are arranged repeatedly, and in another column, subpixels emitting light of the second color are arranged repeatedly. Thus, the display apparatus of one embodiment of the present invention has such portions that the subpixels emitting light of the same color are adjacent to each other not only in the one direction but also in both the row direction and the column direction.

Specifically, the display apparatus of one embodiment of the present invention includes a first subpixel, a second subpixel, a third subpixel, a fourth subpixel, a fifth subpixel, and a sixth subpixel. The first, second, and third subpixels emit light of a first color, and the fourth, fifth, and sixth subpixels emit light of a second color. The first color and the second color are different from each other. The first subpixel is adjacent to the second subpixel in a first direction and adjacent to the third subpixel in a second direction. The fourth subpixel is adjacent to the fifth subpixel in the first direction and adjacent to the sixth subpixel in the second direction. The first direction and the second direction intersect with each other. For example, one of the first direction and the second direction can be a row direction, and the other can be a column direction. In the display apparatus, each subpixel includes one light-emitting element, and the light-emitting devices can be driven independently of each other.

In this specification and the like, subpixels adjacent in a row direction denote subpixels having the following coordinates: coordinates (X-coordinates) each representing a position in the row direction (also referred to as X direction) are the same as the X-coordinate of a reference subpixel; and coordinates (Y-coordinates) each representing a position in a column direction (also referred to as Y direction) are shifted one by one from the Y-coordinate of the reference subpixel. For example, a subpixel in the first row and the second column is adjacent, in the row direction, to a subpixel in the first row and the first column. Alternatively, subpixels adjacent in the column direction denote subpixels whose Y-coordinates are the same as that of the reference subpixel and whose X-coordinates are shifted one by one from that of the reference subpixel. For example, a subpixel in the second row and the first column is adjacent, in the column direction, to the subpixel in the first row and the first column. The same expression is also applied to components, other than subpixels, as long as they are arranged in matrix.

In the display apparatus of one embodiment of the present invention, each subpixel includes a light-emitting device emitting light of one color and a coloring layer overlapping with the light-emitting device. As the light-emitting device, a light-emitting device emitting white light is preferably used, for example. Coloring layers are provided so that colors of visible light transmitted through the coloring layers are different between the subpixels, whereby full color display can be performed.

It is not necessary to form separate light-emitting layers for a plurality of subpixels when light-emitting devices in the subpixels emit light of one color. Thus, a layer other than a pixel electrode included in the light-emitting device (e.g., a light-emitting layer) can be common between (can be shared by) a plurality of subpixels. However, some layers included in the light-emitting device have relatively high conductivity; when such a layer having high conductivity is shared by a plurality of subpixels, leakage current might be generated between the subpixels. Particularly when the increase in resolution or aperture ratio of a display apparatus reduces the distance between subpixels, the leakage current might become too large to ignore and cause a decrease in display quality of the display apparatus or the like. In view of the above, in the display apparatus of one embodiment of the present invention, at least part of the light-emitting device is formed to have an island shape in each subpixel. This enables the display apparatus to achieve both high resolution and high display quality.

For example, an island-shaped light-emitting layer can be formed by a vacuum evaporation method using a metal mask. However, this method causes a deviation from the designed shape and position of an island-shaped light-emitting layer due to various influences such as the low accuracy of the metal mask position, the positional deviation between the metal mask and a substrate, a warp of the metal mask, and the vapor-scattering-induced expansion of outline of the formed film; accordingly, it is difficult to achieve high resolution and high aperture ratio of the display apparatus. In addition, the outline of the layer may blur during vapor deposition, whereby the thickness of an end portion may be small. That is, the thickness of the island-shaped light-emitting layer may vary from area to area. In the case of manufacturing a display apparatus with a large size, high definition, or high resolution, the manufacturing yield might be reduced because of low dimensional accuracy of the metal mask and deformation due to heat or the like.

In view of the above, in manufacture of the display apparatus of one embodiment of the present invention, a light-emitting layer is formed across a plurality of pixel electrodes that have been formed independently for respective subpixels. After that, the light-emitting layer is processed by a photolithography method for example, so that one island-shaped light-emitting layer is formed per pixel electrode. Thus, the light-emitting layer can be divided into island-shaped semiconductor layers for respective subpixels.

Thus, in the method for manufacturing a display apparatus of one embodiment of the present invention, an island-shaped light-emitting layer is formed by processing a light-emitting layer formed on the entire surface, not by using a metal mask having a fine pattern. Specifically, the size of the island-shaped light-emitting layer is obtained by division and scale down of the light-emitting layer by a photolithography method or the like. Thus, its size can be made smaller than the size of the light-emitting layer formed using a metal mask. Accordingly, a high-resolution display apparatus or a display apparatus with a high aperture ratio, which has been difficult to be formed so far, can be obtained.

The small number of times of processing of the light-emitting layer with photolithography is preferable because a reduction in manufacturing cost and an improvement of manufacturing yield become possible. In the method for manufacturing a display apparatus of one embodiment of the present invention, the number of times of processing of the light-emitting layer with photolithography is one; thus, the display apparatus can be manufactured with high yield.

It is difficult to set the distance between adjacent light-emitting devices to be less than 10 μm with a formation method using a metal mask, for example. In contrast, with the above method, the distance can be decreased to be less than 10 μm, 5 μm or less, 3 μm or less, 2 μm or less, or 1 μm or less. For example, with use of an exposure tool for LSI, the distance can be decreased to be less than or equal to 500 nm, less than or equal to 200 nm, less than or equal to 100 nm, or less than or equal to 50 nm. Accordingly, the area of a non-light-emitting region that could exist between two light-emitting devices can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, a pattern of the light-emitting layer itself (also referred to as processing size) can be made much smaller than that in the case of using a metal mask. For example, in the case of using a metal mask for forming light-emitting layers separately, a variation in the thickness occurs between the center and the edge of the light-emitting layer. This causes a reduction in an effective area that can be used as a light-emitting region with respect to the area of the light-emitting layer. In contrast, in the above manufacturing method, the film with a uniform thickness is processed, so that island-shaped light-emitting layers can be formed to have a uniform thickness. Accordingly, even with a fine pattern, almost the all area of the light-emitting layer can be used as a light-emitting region. Thus, a display apparatus having both a high resolution and a high aperture ratio can be manufactured.

Furthermore, in the method for manufacturing a display apparatus of one embodiment of the present invention, it is preferable to form a sacrificial layer (which may be called a mask layer) over a layer including a light-emitting layer (which can also be referred to as an EL layer or part of an EL layer) after the EL layer is formed on an entire surface. Then, a resist mask is formed over the sacrificial layer, and the EL layer and the sacrificial layer are processed using the resist mask, whereby an island-shaped EL layer is preferably formed.

Provision of a sacrificial layer over an EL layer can reduce damage to the EL layer during a manufacturing process of the display apparatus and increase the reliability of the light-emitting device.

The island-shaped EL layer includes at least the light-emitting layer and preferably includes a plurality of layers. Specifically, one or more layers are preferably formed over the light-emitting layer. A layer between the light-emitting layer and the sacrificial layer can inhibit the light-emitting layer from being exposed on the outermost surface during the manufacturing process of the display apparatus and can reduce damage to the light-emitting layer. Thus, the reliability of the light-emitting device can be increased. Thus, the island-shaped EL layer preferably includes the light-emitting layer and a carrier-transport layer (electron-transport layer or hole-transport layer) over the light-emitting layer.

Note that in the light-emitting device, all layers included in the EL layer are not necessarily formed into island shapes. Some layers can be shared by (are common between) a plurality of light-emitting devices. Examples of layers in the EL layer include a light-emitting layer, carrier-injection layers (a hole-injection layer and an electron-injection layer), carrier-transport layers (a hole-transport layer and an electron-transport layer), carrier-blocking layers (a hole-blocking layer and an electron-blocking layer), and the like. In the method for manufacturing a display apparatus of one embodiment of the present invention, some of the layers included in the EL layer are formed to have an island shape for each subpixel, and then, at least part of the sacrificial layer is removed and the other layer(s) included in the EL layer (e.g., a carrier-injection layer) and a common electrode (also referred to as upper electrode) can be formed as shared layers by the plurality of light-emitting layer.

The carrier-injection layer is often a layer having relatively high conductivity in the EL layer. Therefore, when the carrier-injection layer is in contact with the side surface of the island-shaped EL layer or the side surface of the pixel electrode, the light-emitting device might be short-circuited. Note that also in the case where the carrier-injection layer is formed in an island shape and the common electrode is formed to be shared by the plurality of light-emitting devices, the light-emitting device might be short-circuited when the common electrode is in contact with the side surface of the island-shaped EL layer or the side surface of the pixel electrode.

Thus, the display apparatus of one embodiment of the present invention includes an insulating layer covering at least the side surface of the island-shaped light-emitting layer.

Thus, at least some layers in the island-shaped EL layer and the pixel electrode can be prevented from being in contact with the carrier-injection layer or the common electrode. Hence, a short circuit of the light-emitting device is suppressed, and the reliability of the light-emitting device can be increased.

Moreover, providing the insulating layer can fill the space between the adjacent island-shaped EL layers; hence, the formation surface of a layer (e.g., the carrier-injection layer or the common electrode) provided over the island-shaped EL layer has less unevenness and can be flatter. Consequently, the carrier-injection layer or the common electrode can more favorably cover the formation surface. As a result, disconnection of the common electrode can be prevented.

Note that in this specification and the like, disconnection refers to a phenomenon in which a layer, a film, or an electrode is split because of the shape of the formation surface (e.g., a level difference).

The insulating layer can be provided in contact with the island-shaped EL layer. Thus, the EL layer can be prevented from being peeled off. When the insulating layer and the island-shaped EL layer are in close contact with each other, the adjacent island-shaped EL layers can be fixed by or attached to the insulating layer. Furthermore, the insulating layer inhibits moisture from entering the interface between the pixel electrode and the EL layer, so that peeling off of the EL layer can be prevented. Thus, the reliability of the light-emitting device can be increased. The manufacturing yield of the light-emitting device can be increased.

The insulating layer preferably has a function of a barrier insulating layer against at least one of water and oxygen. Alternatively, the insulating layer preferably has a function of inhibiting the diffusion of at least one of water and oxygen. Alternatively, the insulating layer preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as function of less easily transmitting the substance). Alternatively, a barrier property refers to a function of capturing or fixing (also referred to as gettering) a particular sub stance.

When the insulating layer has a function of the barrier insulating layer or a gettering function, entry of impurities (typically, at least one of water and oxygen) that would diffuse into the light-emitting devices from the outside can be suppressed. With this structure, a highly reliable light-emitting device and a highly reliable display apparatus can be provided.

The display apparatus of one embodiment of the present invention includes a pixel electrode functioning as an anode; an island-shaped hole-injection layer, an island-shaped hole-transport layer, an island-shaped light-emitting layer, and an island-shaped electron-transport layer that are provided in this order over the pixel electrode; an insulating layer provided to cover side surfaces of the hole-injection layer, the hole-transport layer, the light-emitting layer, and the electron-transport layer; an electron-injection layer provided over the electron-transport layer; and a common electrode that is provided over the electron-injection layer and functions as a cathode.

Alternatively, the display apparatus of one embodiment of the present invention includes a pixel electrode functioning as a cathode; an island-shaped electron-injection layer, an island-shaped electron-transport layer, an island-shaped light-emitting layer, and an island-shaped hole-transport layer that are provided in this order over the pixel electrode; an insulating layer provided to cover side surfaces of the electron-injection layer, the electron-transport layer, the light-emitting layer, and the hole-transport layer; a hole-injection layer provided over the hole-transport layer; and a common electrode that is provided over the hole-injection layer and functions as an anode.

Alternatively, the display apparatus of one embodiment of the present invention includes a pixel electrode, a first light-emitting unit over the pixel electrode, a charge-generation layer (also referred to as intermediate layer) over the first light-emitting unit, a second light-emitting unit over the charge-generation layer, an insulating layer provided to cover side surfaces of the first light-emitting unit, the charge-generation layer, and the second light-emitting unit, and a common electrode provided over the second light-emitting unit. Note that a layer common to light-emitting devices of different colors may be provided between the second light-emitting unit and the common electrode.

The hole-injection layer, the electron-injection layer, and the charge-generation layer, for example, often have relatively high conductivity in the EL layer. Since the side surfaces of these layers are covered with the insulating layer in the display apparatus of one embodiment of the present invention, these layers can be prevented from being in contact with the common electrode or the like. Hence, a short circuit of the light-emitting device is suppressed, and the reliability of the light-emitting device can be increased.

The insulating layer that covers the side surface of the island-shaped EL layer may have a single-layer structure or a stacked-layer structure.

For example, an insulating layer having a single-layer structure using an inorganic material can be used as a protective insulating layer for the EL layer. In this way, the reliability of the display apparatus can be increased.

For example, when the insulating layer has a stacked structure, the first layer of the insulating layer is preferably formed using an inorganic insulating material because it is formed in contact with the EL layer. In particular, the first layer is preferably formed by an atomic layer deposition (ALD) method, by which damage due to deposition is small. Alternatively, an inorganic insulating layer is preferably formed by a sputtering method, a chemical vapor deposition (CVD) method, or a plasma-enhanced chemical vapor deposition (PECVD) method, which have higher deposition speed than an ALD method. In that case, a highly reliable display apparatus can be manufactured with high productivity. The second layer of the insulating layer is preferably formed using an organic material to fill a recess portion formed by the first layer of the insulating layer.

For example, an aluminum oxide film formed by an ALD method can be used as the first layer of the insulating layer, and an organic resin film can be used as the second layer of the insulating layer.

In the case where the side surface of the EL layer and the organic resin film are in direct contact with each other, the EL layer might be damaged by an organic solvent or the like that might be contained in the organic resin film. When the first layer of the insulating layer is formed using an inorganic insulating film such as an aluminum oxide film by an ALD method, a structure in which the organic resin film and the side surface of the EL layer are not in direct contact with other can be obtained. Thus, the EL layer can be inhibited from being dissolved by the organic solvent, for example.

In the display apparatus of one embodiment of the present invention, it is not necessary to provide an insulating layer that covers the end portion of the pixel electrode between the pixel electrode and the EL layer; thus, the distance between adjacent light-emitting devices can be made extremely small. Thus, a display apparatus with higher resolution or higher definition can be achieved. In addition, a mask for forming the insulating layer is not needed, which leads to a reduction in manufacturing cost of the display apparatus.

Furthermore, light emitted by the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display apparatus of one embodiment of the present invention can significantly reduce the viewing angle dependence. A reduction in the viewing angle dependence leads to an increase in visibility of an image on the display apparatus. For example, in the display apparatus of one embodiment of the present invention, the viewing angle (the maximum angle with a certain contrast ratio maintained when the screen is seen from an oblique direction) can be more than or equal to 100° and less than 180°, preferably more than or equal to 150° and less than or equal to 170°. Note that the viewing angle refers to that in both the vertical direction and the horizontal direction.

Structure Example 1 of Display Apparatus

FIG. 1 and FIGS. 2A to 2D illustrate a display apparatus of one embodiment of the present invention.

FIG. 1 is a top view of a display apparatus 100. The display apparatus 100 includes a display portion in which a plurality of pixels 103 are arranged in matrix, and a connection portion 140 outside the display portion. A plurality of subpixels are arranged in matrix in the display portion. FIG. 1 illustrates subpixels arranged in two rows and six columns, which form pixels in two rows and two columns. The connection portion 140 can also be referred to as a cathode contact portion.

The pixel 103 illustrated in FIG. 1 includes three subpixels, a subpixel 110R, a subpixel 110G, and a subpixel 110B.

For example, a pixel 103[1,1] includes three subpixels, a subpixel 110R[1,1], a subpixel 110G[1,3], and a subpixel 110B [1,5]. Similarly, a pixel 103[1,2] includes three subpixels, a subpixel 110R[1,2], a subpixel 110G[1,4], and a subpixel 110B[1,6]; a pixel 103[2,1] includes three subpixels, a subpixel 110R[2,1], a subpixel 110G[2,3], and a subpixel 110B[2,5]; and a pixel 103[2,2] includes three subpixels, a subpixel 110R[2,2], a subpixel 110G[2,4], and a subpixel 110B[2,6].

In this specification and the like, in some cases, [a,b] (a and b are each an integer greater than or equal to 1) is used as the reference numeral in order to distinguish a plurality of pixels from each other and a plurality of subpixels from each other. For the other elements, similar usage may be performed. For example, a position of an element denoted by [a,b] is referred to as coordinates in some cases. Furthermore, in the case of describing items common to a plurality of pixels or a plurality of subpixels, the term "pixel 103" or "subpixel 110" is used for the description in some cases. In the case where items common to components which are distinguished with use of one or both of the alphabet or coordinates are described, reference numerals without the alphabet or coordinates are used for the description in some cases.

The subpixel 110R emits red light, the subpixel 110G emits green light, and the subpixel 110B emits blue light. Note that in this embodiment, three colors of red (G), light (G), and blue (B) are given as colors of light emitted by subpixels; however, the subpixels may emit light of three colors of yellow (Y), cyan (C), and magenta (M). The number of types of subpixels is not limited to three, and four or more types of subpixels may be used. Examples of four subpixels include subpixels emitting light of four colors, R, G, B, and white (W), subpixels emitting light of four colors R, G, B, and Y, and subpixels emitting light of colors, R, G, and B and emitting infrared light (IR).

The top surface shapes of the subpixels illustrated in FIG. 1 correspond to top surface shapes of light-emitting regions.

The range of the circuit layout for forming the subpixels is not limited to the range of the subpixels illustrated in FIG. 1 and may be placed outside the subpixels. For example, part or all of transistors included in the subpixel 110R[1,2] may be positioned outside the range of the subpixel 110R[1,2] illustrated in FIG. 1. For example, the transistors included in the subpixel 110R[1,2] may have a portion placed within the range of the subpixel 110R[1,1], a portion placed within the range of the subpixel 110R[2,2], or a portion placed within the range of the subpixel 110G[1,3].

It also can be said that stripe arrangement is employed for the pixel 103 illustrated in FIG. 1.

In this specification and the like, the row direction is referred to as X direction and the column direction is referred to as Y direction. The X direction and the Y direction intersect with each other and are, for example, orthogonal to each other (see FIG. 1).

As illustrated in FIG. 1, the subpixels 110 in the first row and the first column, the first row and the second column, the second row and the first column, and the second row and the second column are each the subpixel 110R; the subpixels 110 in the first row and the third column, the first row and the fourth column, the second row and the third column, and the second row and the fourth column are each the subpixel 110G; and the subpixels in the first row and the fifth column, the first row and the sixth column, the second row and the fifth column, and the second row and the sixth column are each the subpixel 110B. In other words, the display apparatus 100 has portions where subpixels emitting the same color light are adjacent to each other not only in one direction but also in both the row direction and the column direction. Specifically, the subpixels 110 emitting the same color light are arranged to be adjacent to each other in two rows and two columns. In other words, a subpixel is divided into at least two subpixels emitting the same color light in the row direction and divided into at least two subpixels emitting the same color light in the column direction. Note that the subpixels 110 emitting the same color light may be arranged in three or more rows. Alternatively, the subpixels 110 emitting the same color light may be arranged in three or more columns.

In the pixel layout with stripe arrangement as illustrated in FIG. 1, the subpixels 110R emitting red light are arranged repeatedly in the first column and the second column, the subpixels 110G emitting green light are arranged repeatedly in the third column and the fourth column, and the subpixels 110B emitting blue light are arranged repeatedly in the fifth column and the sixth column.

Although the top view of FIG. 1 illustrates an example in which the connection portion 140 is positioned in the lower side of the display portion, one embodiment of the present invention is not limited thereto. The connection portion 140 may be provided in at least one of the upper side, the right side, the left side, and the lower side of the display portion 140 in the top view, and may be provided so as to surround the four sides of the display portion 140. The top surface shape of the connection portion 140 can be a belt-like shape, an L shape, an U shape, a frame-like shape, or the like. The number of the connection portions 140 can be one or more.

Figure 2A:
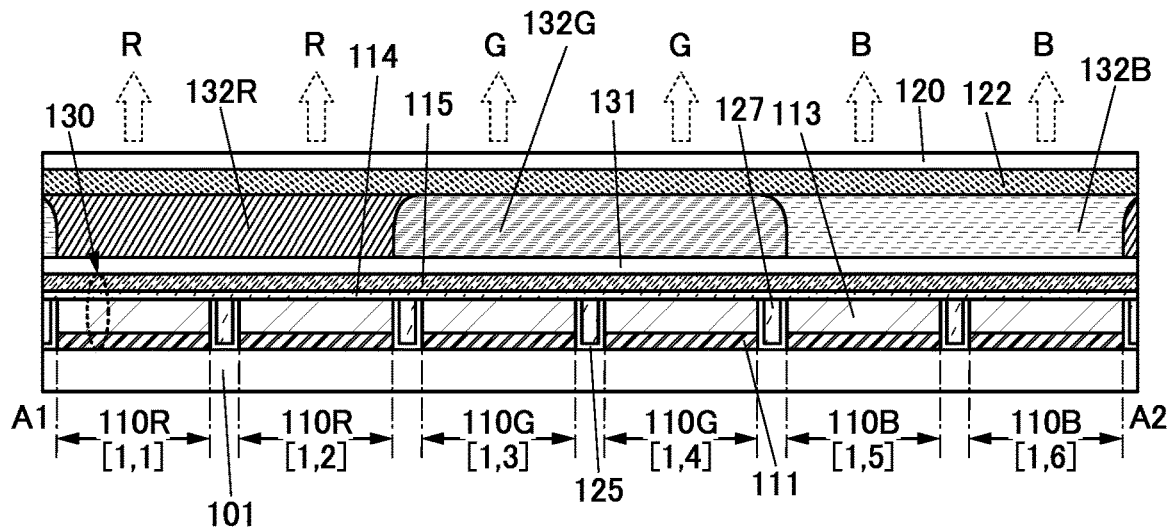
FIGS. 2A to 2D are cross-sectional views illustrating an example of a display apparatus.
Figure 2B:
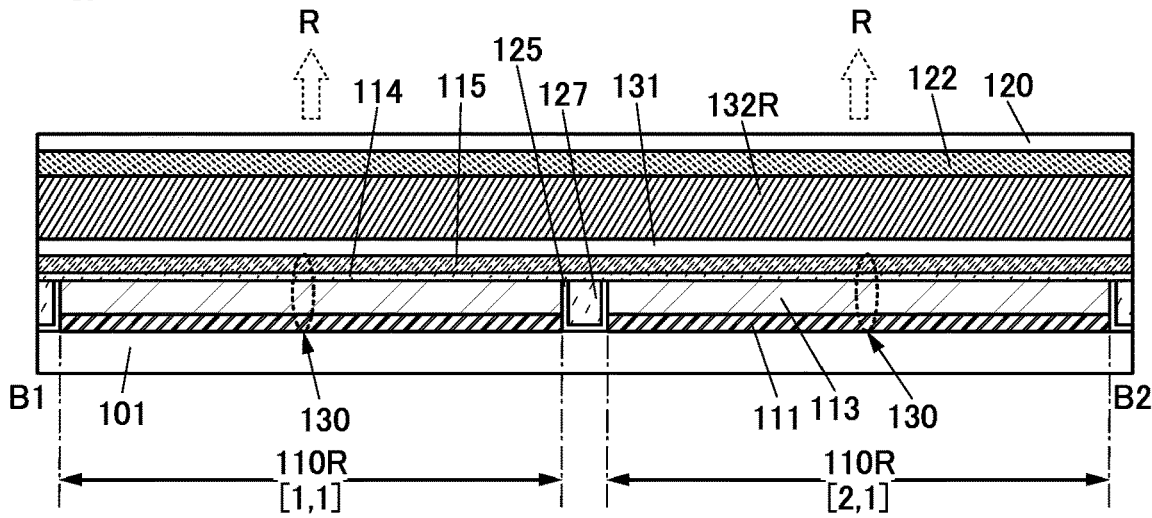
Figure 2C:
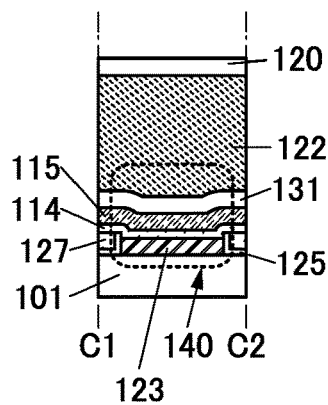
Figure 2D:
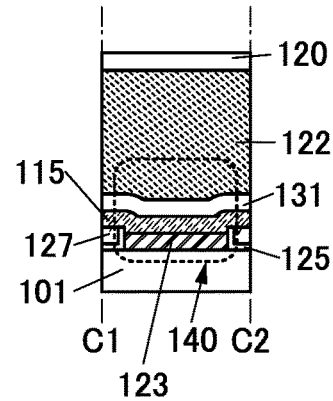

FIG. 2A is a cross-sectional view along dashed-dotted line A1-A2 in FIG. 1. FIG. 2B is a cross-sectional view taken along dashed-dotted line B1-B2 in FIG. 1. FIGS. 2C and 2D are each a cross-sectional view along dashed-dotted line C1-C2 in FIG. 1.

As illustrated in FIGS. 2A and 2B, the display apparatus 100 includes light-emitting devices 130 over a layer 101 including a transistor, and a protective layer 131 provided to cover these light-emitting devices. A substrate 120 is bonded to coloring layers 132R, 132G, and 132B, which are over the protective layer 131, with a resin layer 122. In a region between the adjacent light-emitting devices, an insulating layer 125 and an insulating layer 127 over the insulating layer 125 are provided.

Although FIGS. 2A and 2B show that a plurality of insulating layers 125 and a plurality of insulating layers 127 are provided, the display apparatus 100 can have a structure, when seen from above, such that the insulating layers 125 are connected to each other and the insulating layers 127 are connected to each other. In other words, the display apparatus 100 can have a structure such that one insulating layer 125 and one insulating layer 127 are provided, for example. Note that the display apparatus 100 may include a plurality of insulating layers 125 which are separated from each other and a plurality of insulating layers 127 which are separated from each other.

The display apparatus of one embodiment of the present invention can have any of the following structures: a top-emission structure in which light is emitted in a direction opposite to the substrate where the light-emitting device 130 is formed, a bottom-emission structure where light is emitted toward the substrate where the light-emitting device 130 is formed, and a dual-emission structure where light is emitted toward both surfaces.

The layer 101 including a transistor can employ a stacked-layer structure in which a plurality of transistors are provided over a substrate and an insulating layer is provided to cover these transistors, for example. The layer 101 including a transistor may have a depression portion between two adjacent light-emitting devices 130. For example, a depression portion may be provided in an insulating layer positioned at the outermost surface of the layer 101 including a transistor. Structure examples of the layer 101 including a transistor will be described in Embodiment 2 and Embodiment 3.

The light-emitting device 130 included in each subpixel can exhibit the same color. The light-emitting device 130 emits white (W) light, for example.

As the light-emitting device 130, an organic light-emitting diode (OLED) or a quantum-dot light-emitting diode (QLED) is preferably used, for example. Examples of a light-emitting substance (also referred to as a light-emitting material) included in the light-emitting device include a substance exhibiting fluorescence (a fluorescent material), a substance exhibiting phosphorescence (a phosphorescent material), and a substance exhibiting thermally activated delayed fluorescence (a thermally activated delayed fluorescent (TADF) material). As the TADF material, a material in which the singlet and triplet excited states are in thermal equilibrium may be used. Since such a TADF material has a short emission lifetime (excitation lifetime), it inhibits a reduction in the efficiency of a light-emitting device in a high-luminance region. An inorganic compound (e.g., a quantum dot material) may also be used as the light-emitting substance included in the light-emitting device.

The light-emitting device 130 includes an EL layer between a pair of electrodes. The EL layer includes at least a light-emitting layer. In this specification and the like, one of the pair of electrodes may be referred to as a pixel electrode and the other may be referred to as a common electrode.

The light-emitting device 130 includes a pixel electrode 111 over the layer 101 including a transistor, an EL layer 113 over the pixel electrode 111, a common layer 114 over the EL layer 113, and a common electrode 115 over the common layer 114. The EL layer 113 includes at least a light-emitting layer. The EL layer 113 may include one or more of a hole-injection layer, a hole-transport layer, a hole-blocking layer, an electron-blocking layer, an electron-transport layer, and an electron-injection layer. For example, the EL layer 113 can have a structure in which a hole-injection layer, a hole-transport layer, a light-emitting layer, and an electron-transport layer are stacked in this order. In this case, the pixel electrode 111 can function as an anode and the common electrode 115 can function as a cathode. Alternatively, the EL layer 113 can have a structure in which an electron-injection layer, an electron-transport layer, a light-emitting layer, and a hole-transport layer are stacked in this order. In this case, the pixel electrode 111 can function as a cathode and the common electrode 115 can function as an anode.

The common layer 114 includes, for example, an electron-injection layer or a hole-injection layer. Alternatively, the common layer 114 may be a stack of an electron-transport layer and an electron-injection layer, and may be a stack of a hole-transport layer and a hole-injection layer. The common layer 114 is shared by the plurality of light-emitting devices 130 and for example, is shared by all of the light-emitting devices 130.

There is no particular limitation on the structure of the light-emitting device in this embodiment, and the light-emitting device can have a single structure or a tandem structure. Note that structure examples of the light-emitting device will be described later in Embodiment 4.

The common electrode 115 is shared by the plurality of light-emitting devices 130 and for example, is shared by all the light-emitting devices 130. The common electrode 115 shared by the plurality of light-emitting devices 130 is electrically connected to a conductive layer 123 provided in the connection portion 140 (see FIGS. 2C and 2D). The conductive layer 123 can be formed using a conductive layer formed using the same material and through the same steps as the pixel electrode 111.

Note that FIG. 2C illustrates an example in which the common layer 114 is provided over the conductive layer 123 and the conductive layer 123 and the common electrode 115 are electrically connected to each other through the common layer 114. The common layer 114 is not necessarily provided in the connection portion 140. For example, FIG. 2D illustrates an example in which the common layer 114 is not provided over the conductive layer 123 and the conductive layer 123 and the common electrode 115 are directly connected to each other. For example, by using a mask for specifying a film formation area (also referred to as an area mask or a rough metal mask), the common layer 114 can be formed in a region different from a region where the common electrode 115 is formed.

Figure 3A:
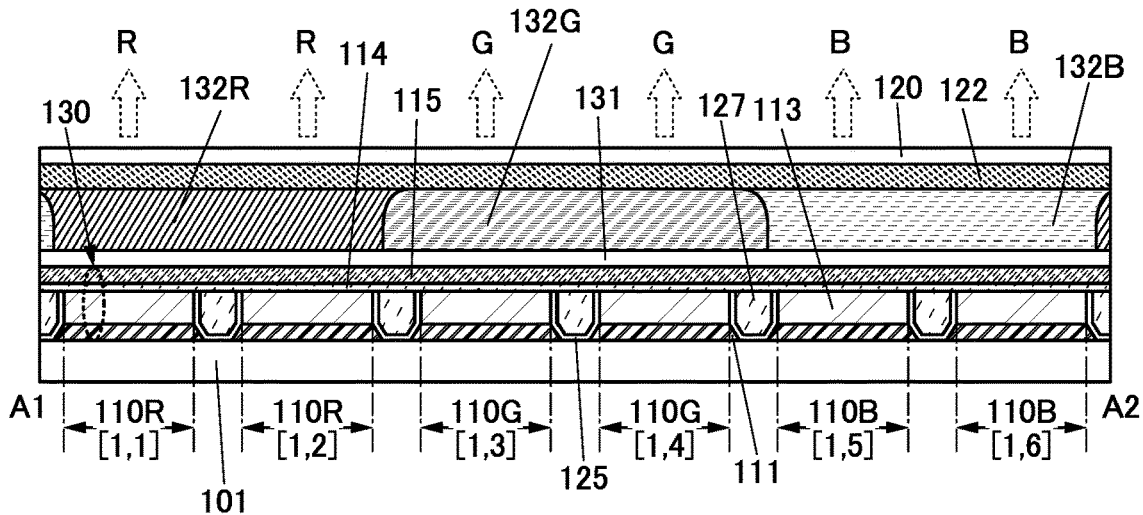
FIGS. 3A to 3C are cross-sectional views each illustrating an example of a display apparatus.
Figure 3B:
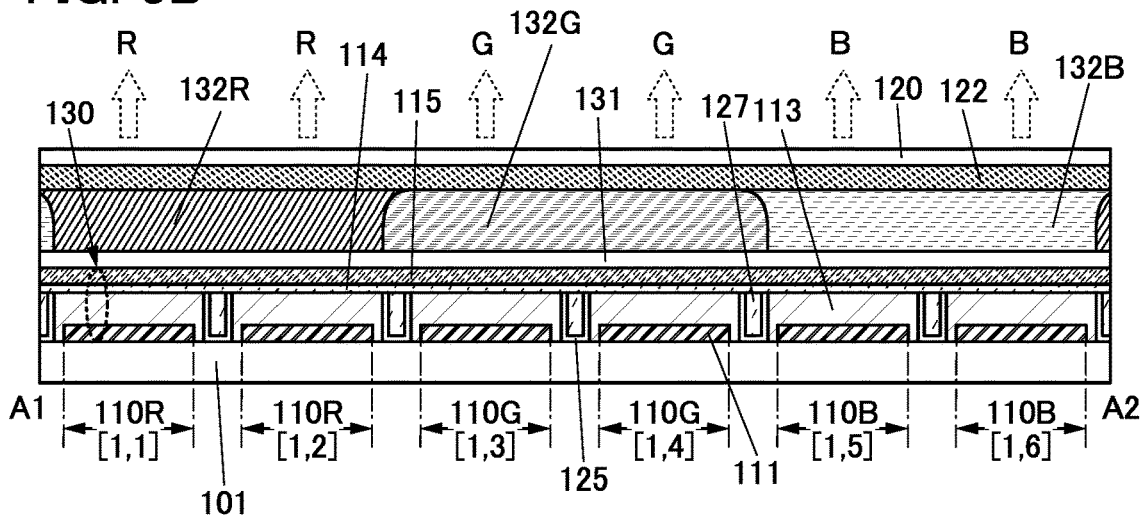

The sizes of the pixel electrode 111 and the EL layer 113 are not particularly limited. FIGS. 2A and 2B each illustrate an example in which the end portion of the pixel electrode 111 is aligned or substantially aligned with the end portion of the EL layer 113. FIG. 3A illustrates an example in which the end portion of the EL layer 113 is positioned on an inner side than the end portion of the pixel electrode 111. In FIG. 3A, the end portion of the EL layer 113 is positioned over the pixel electrode 111. FIG. 3B illustrates an example in which the end portion of the EL layer 113 is positioned on an outer side than the end portion of the pixel electrode 111. In FIG. 3B, the EL layer 113 is provided to cover the end portion of the pixel electrode 111. The end portion of the EL layer 113 may have both a part positioned on an outer side than the end portion of the pixel electrode 111 and a part positioned on an inner side than the end portion of the pixel electrode 111.

As illustrated in FIG. 3A, the end portions of the pixel electrode 111 may have tapered shapes. When the side surface of the pixel electrode 111 is tapered, coverage with the insulating layer 125 provided along the side surface of the pixel electrode 111 can be improved. Furthermore, when the side surface of the pixel electrode 111 is tapered, a material (such as dust or particles) in the manufacturing process is easily removed by processing such as cleaning, which is preferable. Note that in this specification and the like, a tapered shape refers to a shape such that at least part of a side surface of a component is inclined with respect to the substrate surface or the surface where the component is formed. For example, a tapered shape preferably includes a region where the angle between the inclined side surface and the substrate surface or the surface where a component is formed (such an angle is also referred to as a taper angle) is less than 90°.

In the case where end portions are aligned or substantially aligned with each other and the case where top surface shapes are the same or substantially the same, it can be said that outlines of stacked layers at least partly overlap with each other in a top view. For example, the case of patterning or partly patterning an upper layer and a lower layer with use of the same mask pattern is included in the expression. The expression "end portions are aligned or substantially aligned with each other" or "top surface shapes are the same or substantially the same" also includes the case where the outlines do not completely overlap with each other; for instance, the edge of the upper layer may be positioned on an inner side or an outer side than the edge of the lower layer.

The protective layer 131 is preferably provided over the light-emitting device 130. Providing the protective layer 131 can improve the reliability of the light-emitting devices. The protective layer 131 may have a single-layer structure or a layered structure including two or more layers.

There is no limitation on the conductivity of the protective layer 131. As the protective layer 131, at least one type of insulating films, semiconductor films, and conductive films can be used.

The protective layer 131 including an inorganic film can suppress deterioration of the light-emitting devices by preventing oxidation of the common electrode 115 and inhibiting entry of impurities (e.g., moisture and oxygen) into the light-emitting devices 130, for example; thus, the reliability of the display apparatus can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, a tantalum oxide film, and the like. Examples of the nitride insulating film include a silicon nitride film, an aluminum nitride film, and the like. Examples of the oxynitride insulating film include a silicon oxynitride film, an aluminum oxynitride film, and the like. Examples of the nitride oxide insulating film include a silicon nitride oxide film, an aluminum nitride oxide film, and the like.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

The protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can suppress entry of impurities (such as water and oxygen) into the EL layer.

Furthermore, the protective layer 131 may include an organic film. For example, the protective layer 131 may include both an organic film and an inorganic film.

The protective layer 131 may have a stacked structure of two layers which are formed by different formation methods. Specifically, the first layer of the protective layer 131 may be formed by an ALD method, and the second layer of the protective layer 131 may be formed by a sputtering method.

In the subpixel 110R (the subpixels 110R[1,1], 110R[1,2], and 110R[2,1] in FIGS. 2A and 2B), the coloring layer 132R transmitting red light is provided over the protective layer 131. Thus, from the subpixel 110R, light emitted by the light-emitting device 130 is extracted as red light to the outside of the display apparatus 100 through the coloring layer 132R. Note that the coloring layer 132R may be shared by a plurality of subpixels 110R adjacent to each other. For example, one coloring layer 132R may be shared by four subpixels 110R[1,1], 110R[1,2], 110R[2,1], and 110R[2,2] in FIG. 1. Alternatively, all of the subpixels 110R provided in the first column and the second column may share one coloring layer 132R. Further alternatively, the coloring layer 132R may be independently provided for each subpixel 110R.

Similarly, in the subpixel 110G (the subpixels 110G[1,3] and 110G[1,4] in FIG. 2A), the coloring layer 132G transmitting green light is provided over the protective layer 131. Thus, from the subpixel 110G, light emitted by the light-emitting device 130 is extracted as green light to the outside of the display apparatus 100 through the coloring layer 132G.

In the subpixel 110B (the subpixels 110B[1,5] and 110B[1,6] in FIG. 2A), the coloring layer 132B transmitting blue light is provided over the protective layer 131. Thus, from the subpixel 110B, light emitted by the light-emitting device 130 is extracted as blue light to the outside of the display apparatus 100 through the coloring layer 132B.

FIGS. 2A and 2B each illustrate an example in which the coloring layer 132R, 132G, or 132B is directly provided for the light-emitting device 130 with the protective layer 131 provided therebetween. With such a structure, the alignment accuracy of the light-emitting device 130 and the coloring layer can be improved. It is preferable that the distance between the light-emitting device 130 and the coloring layer be decreased, in which case color mixing can be suppressed and the viewing angle characteristics can be improved.

Figure 3C:
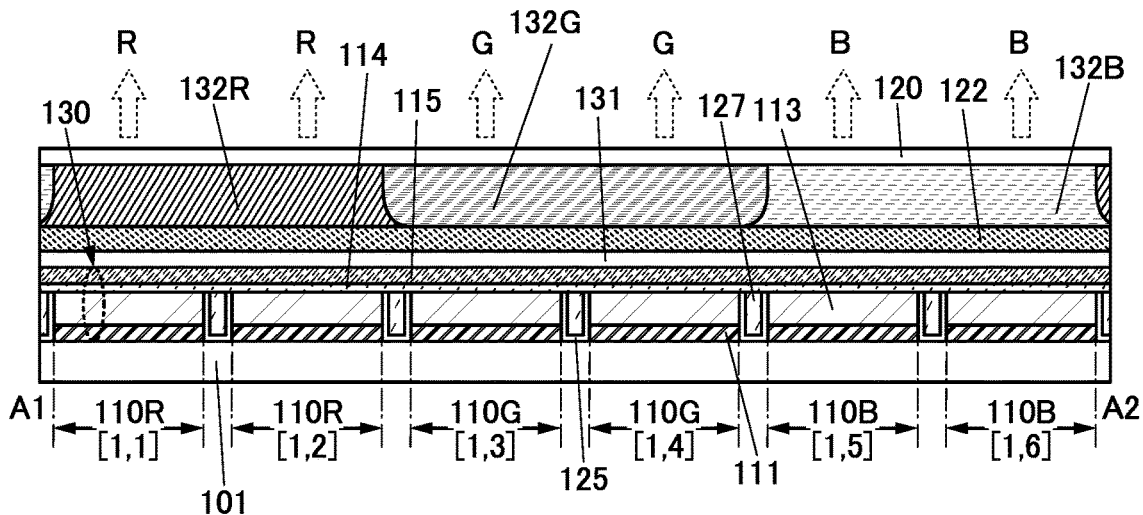

Alternatively, as illustrated in FIG. 3C, the substrate 120 provided with the coloring layers 132R, 132G, and 132B may be attached to the protective layer 131 with the resin layer 122. The coloring layers 132R, 132G, and 132B are provided on the substrate 120, whereby heat treatment for forming these layers can be increased.

In FIGS. 2A and 2B, the end portion of the top surface of the pixel electrode 111 is not covered with an insulating layer. Thus, the distance between adjacent light-emitting devices can be extremely shortened. Accordingly, the display apparatus can have high resolution or high definition.

Figure 4A:
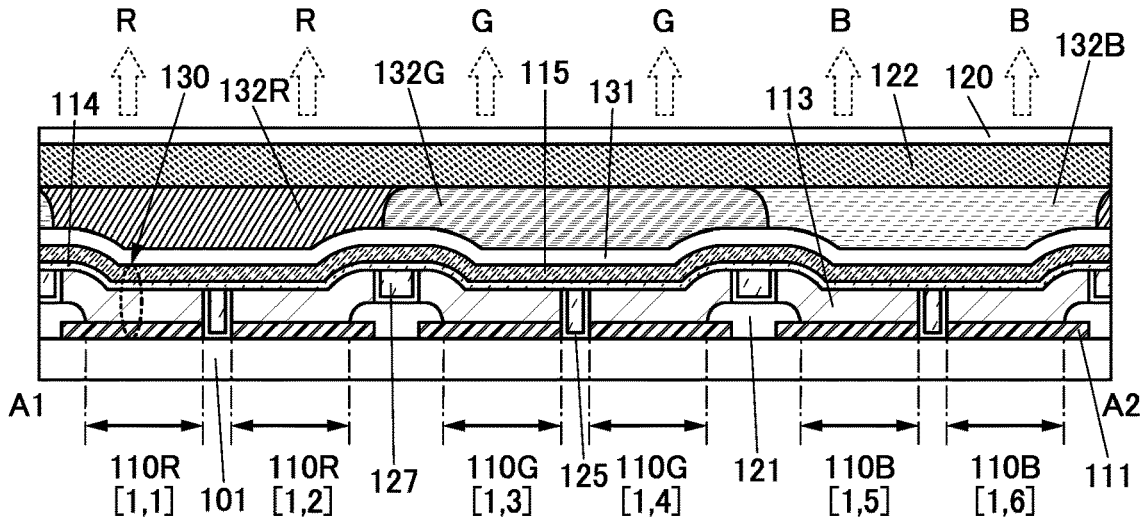
FIGS. 4A to 4C are cross-sectional views each illustrating an example of a display apparatus.
Figure 4B:
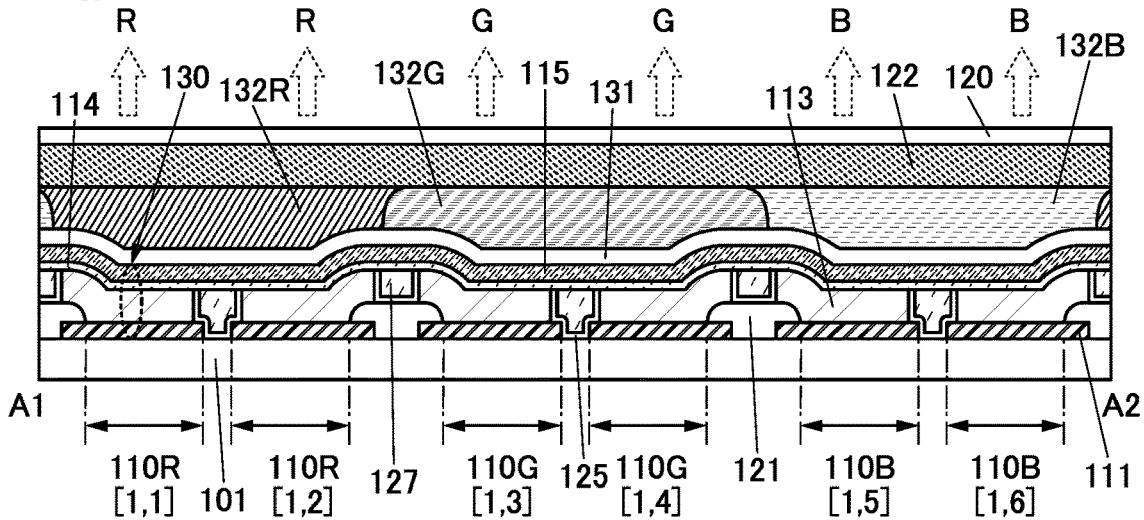
Figure 4C:
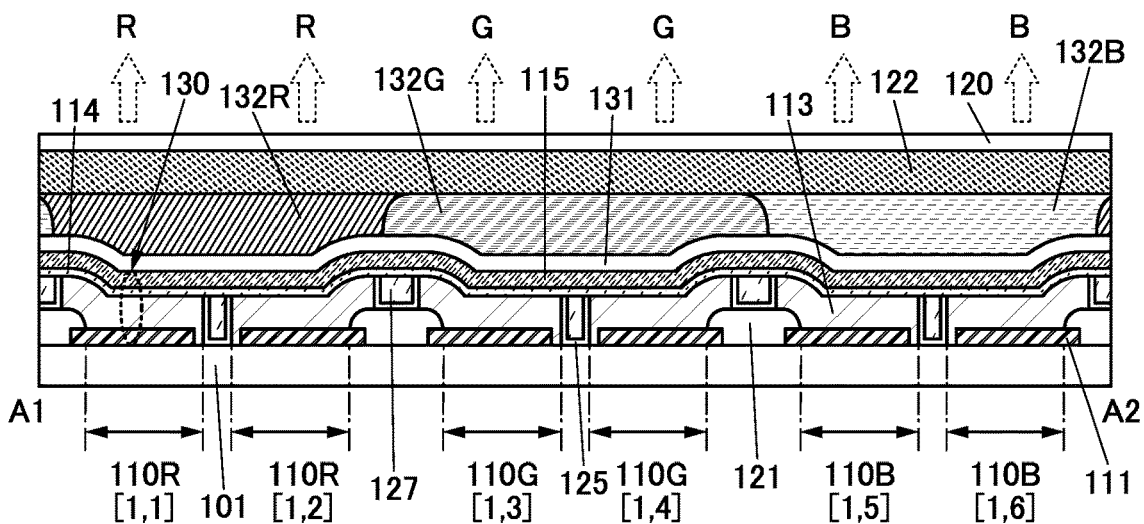

Note that as illustrated in FIGS. 4A to 4C, an insulating layer 121 covering an end portion of the top surface of the pixel electrode 111 may be provided.

FIGS. 4A to 4C each illustrate an example in which the insulating layer 121 is provided between the subpixels exhibiting different colors. Specifically, the insulating layer 121 covers an end portion of the pixel electrode 111, which is on the subpixel 110G[1,3] side, in the subpixel 110R[1,2] and does not cover an end portion of the pixel electrode 111, which is on the subpixel 110R[1,1] side, in the subpixel 110R[1,2]. The layout of the insulating layer 121 is not limited to the above. For example, the insulating layer 121 may cover an end portion of one side of the pixel electrode 111, end portions of two or more sides thereof, or end portions of four sides thereof.

In the example illustrated in FIG. 4A, the end portions of the pixel electrode 111 and the EL layer 113, which are on the subpixel 110R[1,1] side, in the subpixel 110R[1,2] are aligned or substantially aligned with each other. In the example illustrated in FIG. 4B, the end portion of the EL layer 113, which is on the subpixel 110R[1,1] side, in the subpixel 110R[1,2] is positioned on an inner side than the end portion of the pixel electrode 111. In the example illustrated in FIG. 4C, the end portion of the EL layer 113, which is on the subpixel 110R[1,1] side, in the subpixel 110R[1,2] is positioned on an outer side than the end portion of the pixel electrode 111.

The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layer 131 can be used.

When an inorganic insulating film is used as the insulating layer 121 covering the end portion of the pixel electrode 111, impurities are less likely to enter the light-emitting device 130 as compared with the case where an organic insulating film is used; therefore, the reliability of the light-emitting device 130 can be improved. When an organic insulating film is used as the insulating layer 121 covering the end portion of the pixel electrode 111, a short circuit in the light-emitting device 130 can be prevented because the organic insulating film has higher step coverage and is less likely to be influenced by the shape of the pixel electrode than the inorganic insulating film. Specifically, when an organic insulating film is used as the insulating layer 121, the insulating layer 121 can be processed into a tapered shape or the like.

In the structures illustrated in FIGS. 2A and 2B and FIGS. 3A to 3C, the side surfaces of the pixel electrode 111 and the EL layer 113 are covered with the insulating layer 125 and the insulating layer 127. In the structures illustrated in FIGS. 4A to 4C, the side surface of the pixel electrode 111 is covered with the insulating layer 121, and the side surface of the EL layer 113 is covered with the insulating layer 125 and the insulating layer 127. In the structure illustrated in FIG. 5A, the side surfaces of the pixel electrode 111 and the EL layer 113 are covered with the insulating layer 127. In the structure illustrated in FIG. 5B, the side surfaces of the pixel electrode 111 and the EL layer 113 are covered with the insulating layer 125. Thus, the common layer 114 (or the common electrode 115) can be prevented from being in contact with side surfaces of the pixel electrode 111 and side surfaces of the EL layer 113, so that a short-circuit of light-emitting device can be suppressed. Thus, the reliability of the light-emitting device can be increased.

The insulating layer 125 preferably covers at least one of the side surface of the pixel electrode 111 and the side surface of the EL layer 113, and further preferably covers both the side surface of the pixel electrode 111 and the side surface of the EL layer 113. The insulating layer 125 can be in contact with the side surface of the pixel electrode 111 and the side surface of the EL layer 113.

The insulating layer 127 is provided over the insulating layer 125 to fill a recess portion in the insulating layer 125. The insulating layer 127 can have a structure overlapping with the side surface of the pixel electrode 111 and the side surface of the EL layer 113 with the insulating layer 125 sandwiched therebetween (also referred to as a structure covering the side surfaces thereof).

The insulating layer 125 and the insulating layer 127 can fill a gap between the adjacent island-shaped layers, whereby the formation surface of a layer (e.g., the common electrode) provided over the island-shaped layers can be less uneven and can be flatter. Thus, the coverage with the common electrode can be increased and disconnection of the common electrode can be prevented.

The common layer 114 and the common electrode 115 are provided over the EL layer 113, the insulating layer 125, and the insulating layer 127. Before the insulating layer 125 and the insulating layer 127 are provided, a step is generated due to a difference between a region where the pixel electrode 111 and the EL layer 113 are provided and a region where neither the pixel electrode 111 nor the EL layer 113 is provided (region between the light-emitting devices). In the display apparatus of one embodiment of the present invention, the step can be planarized with the insulating layer 125 and the insulating layer 127, and the coverage with the common layer 114 and the common electrode 115 can be improved. Consequently, it is possible to inhibit a connection defect due to disconnection of the common electrode 115. Alternatively, an increase in electrical resistance, which is caused by a reduction in thickness locally of the common electrode 115 due to the step, can be prevented.

To improve the planarity of a surface over which the common layer 114 and the common electrode 115 are formed, the levels of the top surfaces of the insulating layer 125 and the insulating layer 127 are aligned or substantially aligned with the level of the top surface of the EL layer 113 at its end portion (also referred to as the level of the end portion of the top surface of the EL layer 113). The top surface of the insulating layer 127 preferably has a flat surface; however, it may include a projection portion, a convex surface, a concave surface, or a depression portion.

The insulating layer 125 and the insulating layer 127 can be provided in contact with the island-shaped EL layer 113. When the insulating layer and the EL layer 113 are in close contact with each other, the adjacent EL layers 113 can be fixed by or attached to the insulating layer. Thus, separation of the EL layer 113 can be prevented and the reliability of the light-emitting device can be increased. The manufacturing yield of the light-emitting device can be increased.

Note that one of the insulating layer 125 and the insulating layer 127 is not necessarily provided. For example, a single-layer insulating layer 125 using an inorganic material can be used as a protective insulating layer of the EL layer 113. In this way, the reliability of the display apparatus can be increased. For another example, a single-layer insulating layer 127 using an organic material can fill a gap between the adjacent EL layers 113 and planarization can be performed. In this way, the coverage with the common electrode 115 (the upper electrode) formed over the EL layer 113 and the insulating layer 127 can be increased.

Figure 5A:
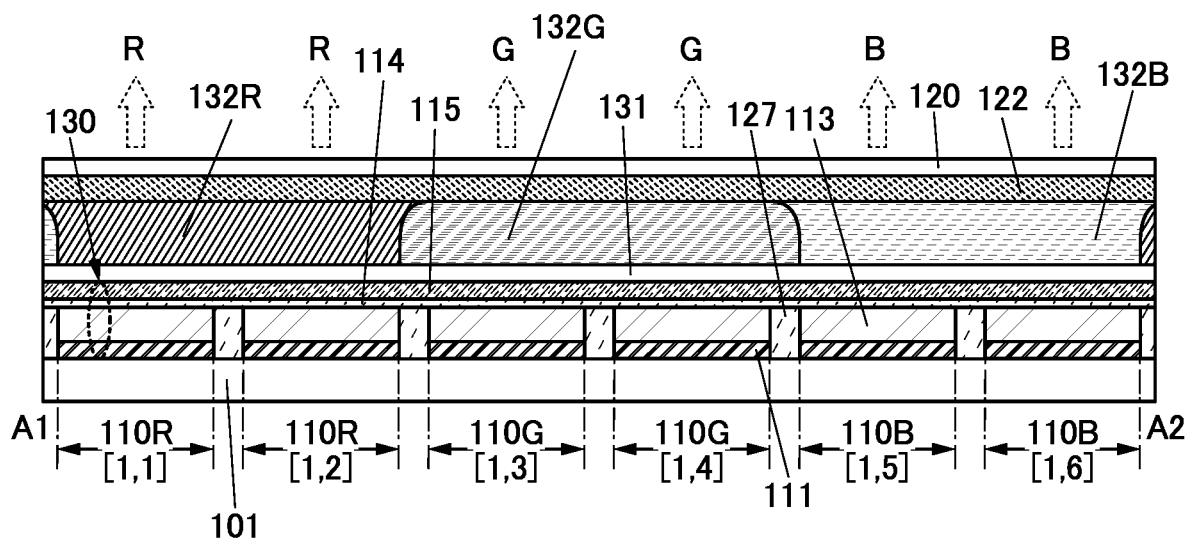
FIGS. 5A and 5B are cross-sectional views each illustrating an example of a display apparatus.

FIG. 5A illustrates an example in which the insulating layer 125 is not provided. In the case where the insulating layer 125 is not provided, the insulating layer 127 can be in contact with the side surfaces of the pixel electrode 111 and the EL layer 113. The insulating layer 127 can be provided to fill gaps between the EL layers 113 of the light-emitting devices 130.

In this case, an organic material which causes less damage to the EL layer 113 is preferably used for the insulating layer 127. For example, it is preferable to use, for the insulating layer 127, an organic material such as polyvinyl alcohol (PVA), polyvinyl butyral, polyvinyl pyrrolidone, polyethylene glycol, polyglycerin, pullulan, water-soluble cellulose, or alcohol-soluble polyamide resin.

Figure 5B:
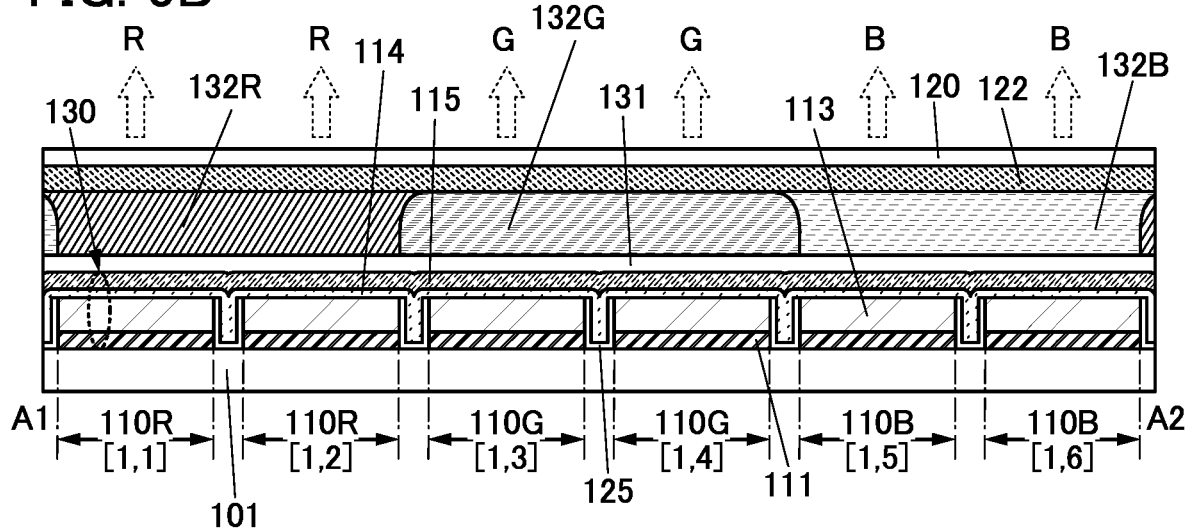

FIG. 5B illustrates an example in which the insulating layer 127 is not provided.

Note that although FIG. 5B illustrates an example in which the common layer 114 is provided in the depression portion of the insulating layer 125, spaces may be formed in the regions.

The insulating layer 125 has a region in contact with the side surface of the EL layer 113 and functions as a protective insulating layer of the EL layer 113. With the insulating layer 125, entry of impurities (such as oxygen and moisture) from the side surface of the EL layer 113 into its inside can be prevented, and thus a highly reliable display apparatus can be obtained.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 to be described later is formed. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating layer against at least one of water and oxygen. Alternatively, the insulating layer 125 preferably has a function of inhibiting the diffusion of at least one of water and oxygen. Alternatively, the insulating layer 125 preferably has a function of capturing or fixing (also referred to as gettering) at least one of water and oxygen.

When the insulating layer 125 has a function of the barrier insulating layer or a gettering function, entry of impurities (typically, at least one of water and oxygen) that would diffuse into the light-emitting devices from the outside can be suppressed. In this structure, a highly reliable light-emitting device, furthermore, a highly reliable display apparatus can be provided.

The insulating layer 125 preferably has a low impurity concentration. Accordingly, degradation of the EL layer, which is caused by entry of impurities into the EL layer from the insulating layer 125, can be suppressed. In addition, when the impurity concentration is reduced in the insulating layer 125, a barrier property against at least one of water and oxygen can be increased. For example, one or both of the hydrogen concentration and the carbon concentration in the insulating layer 125 are preferably low.

The insulating layer 125 can be formed by a sputtering method, a CVD method, a pulsed laser deposition (PLD) method, an ALD method, or the like. The insulating layer 125 is preferably formed by an ALD method achieving good coverage.

When the substrate temperature at the time when the insulating layer 125 is formed is increased, the formed insulating layer 125, even with a small thickness, can have a high impurity concentration and a high barrier property against at least one of water and oxygen. Therefore, the substrate temperature is preferably higher than or equal to 60° C., further preferably higher than or equal to 80° C., still further preferably higher than or equal to 100° C., yet still further preferably higher than or equal to 120° C. Meanwhile, the insulating layer 125 is formed after formation of an island-shaped EL layer, it is preferable that the insulating layer 125 be formed at a temperature lower than the allowable temperature limit of the EL layer. Therefore, the substrate temperature is preferably lower than or equal to 200° C., further preferably lower than or equal to 180° C., still further preferably lower than or equal to 160° C., still further preferably lower than or equal to 150° C., yet still further preferably lower than or equal to 140° C.

Examples of indicators of the allowable temperature limit are the glass transition point, the softening point, the melting point, the thermal decomposition temperature, and the 5% weight loss temperature. The allowable temperature limit of the EL layer can be, for example, any of the above temperatures, preferably the lowest temperature thereof.

The insulating layer 127 over the insulating layer 125 has a function of reducing the depression portion of the insulating layer 125 formed between adjacent light-emitting devices. In other words, the insulating layer 127 brings an effect of improving the planarity of a surface where the common electrode 115 is formed. As the insulating layer 127, an insulating layer containing an organic material can be favorably used. Examples of materials used for the insulating layer 127 include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Examples of organic materials used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. Alternatively, a photosensitive resin can be used for the insulating layer 127. A photoresist may be used for the photosensitive resin. As the photosensitive resin, a positive photosensitive material or a negative photosensitive material can be used.

The insulating layer 127 may be formed using a material absorbing visible light. When the insulating layer 127 absorbs light emitted by the light-emitting device, leakage of light (stray light) from the light-emitting device to the adjacent light-emitting device through the insulating layer 127 can be inhibited. Thus, the display quality of the display apparatus can be improved.

FIGS. 6A to 6F each illustrate a cross-sectional structure of a region 139 including the insulating layer 127 and its surroundings.

Figure 6A:
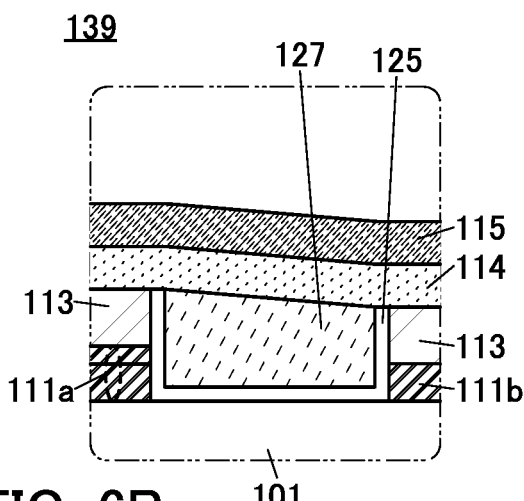
FIGS. 6A to 6F are cross-sectional views each illustrating an example of a display apparatus.

FIG. 6A illustrates an example in which the thickness of the pixel electrode differs between subpixels of different colors. Specifically, the thickness of a pixel electrode 111a and the thickness of a pixel electrode 111b are different from each other. FIG. 6A illustrates an example where the pixel electrode 111a has a two-layer structure and the pixel electrode 111b has a single-layer structure. Since the EL layer 113 is formed in common between the subpixels of different colors, the thickness of the EL layer 113 over the pixel electrode 111a and the thickness of the EL layer 113 over the pixel electrode 111b are the same or substantially the same as each other. Therefore, the level of the top surface of the EL layer 113 over the pixel electrode 111a is different from that over the pixel electrode 111b. On both the pixel electrode 111a side and the pixel electrode 111b side, the top surface of the insulating layer 125 is at the same level or substantially the same level as that of the EL layer 113. The top surface of the insulating layer 127 has a gentle slope such that the side closer to the pixel electrode 111a is higher and the side closer to the pixel electrode 111b is lower. In this manner, the levels of the insulating layers 125 and 127 are preferably equal to the levels of the top surfaces of the adjacent EL layers. Alternatively, the top surface of the insulating layer 125 or the top surface of the insulating layer 127 may include a flat portion that is level with the top surface of any of adjacent EL layers.

Figure 6D:
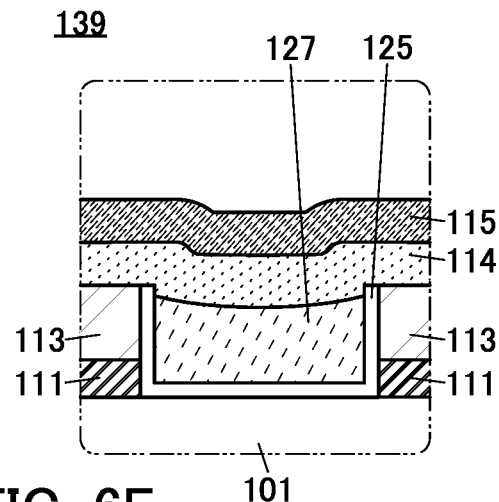
Figure 6B:
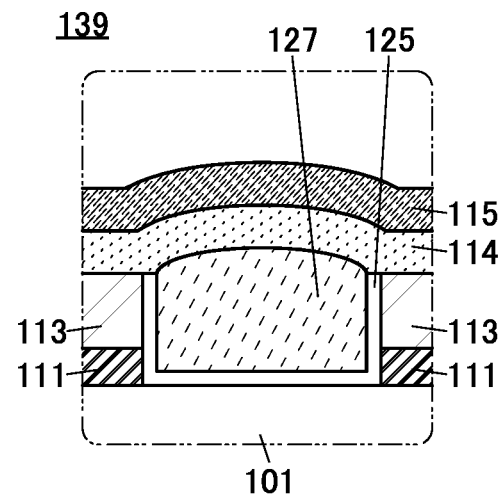

In FIG. 6B, the top surface of the insulating layer 127 has a region whose level is higher than that of top surface of the EL layer 113. As illustrated in FIG. 6B, it can be said that the top surface of the insulating layer 127 has a shape in which its center and vicinity thereof rise, i.e., a shape including a convex surface, in the cross-sectional view.

Figure 6E:
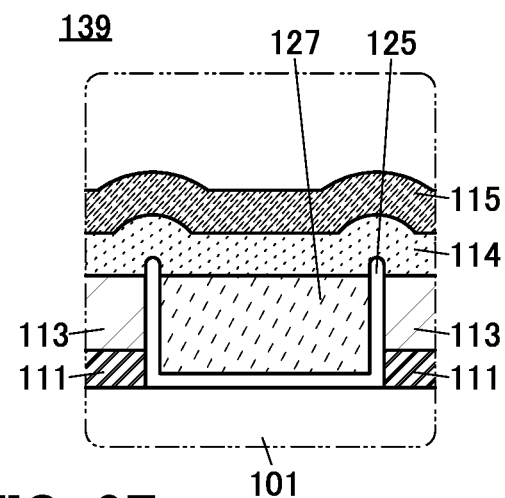
Figure 6C:
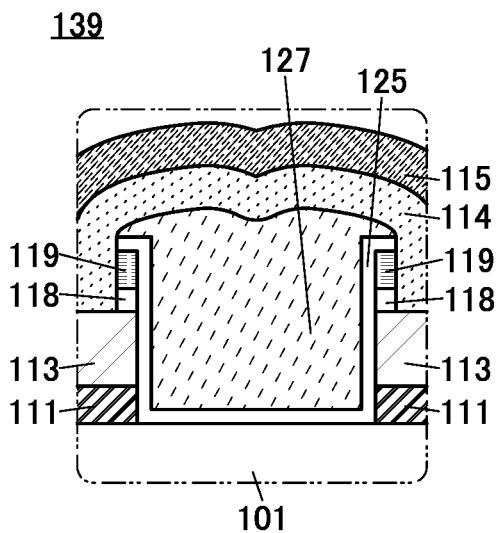

In the cross-sectional view of FIG. 6C, the top surface of the insulating layer 127 gently rises from its end portions toward the center, i.e., has convexities, and has a depression portion in the center and its vicinity, i.e., has a concavity. The insulating layer 127 has a region whose level is higher than that of the top surface of the EL layer 113. In the region 139, the display apparatus includes at least one of a sacrificial layer 118 and a sacrificial layer 119. The end portions of the insulating layer 125 and the insulating layer 127 overlap with the top surface of the EL layer 113 and are positioned over at least one of the sacrificial layer 118 and the sacrificial layer 119.

In FIG. 6D, the top surface of the insulating layer 127 includes a region whose level is lower than that of the top surface of the EL layer 113. In the cross-sectional view, the top surface of the insulating layer 127 has a depression portion in the center and its vicinity, i.e., has a concavity.

In FIG. 6E, the top surface of the insulating layer 125 includes a region whose level is lower than that of the top surface of EL layer 113. That is, the insulating layer 125 protrudes from the formation surface of the common layer 114 and forms a projection.

For example, when the insulating layer 125 is formed so that its level is equal to or substantially equal to the level of the sacrificial layer, the insulating layer 125 may protrude as illustrated in FIG. 6E.

Figure 6F:
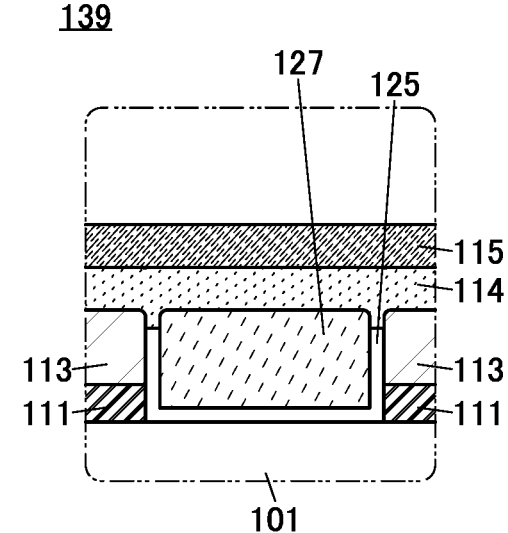

In FIG. 6F, the top surface of the insulating layer 125 includes a region whose level is lower than that of the top surface of the EL layer 113. That is, the insulating layer 125 forms a depression portion on the formation surface of the common layer 114.

As described above, the insulating layer 125 and the insulating layer 127 can have a variety of shapes.

As the sacrificial layer, one or more of inorganic films such as a metal film, an alloy film, a metal oxide film, a semiconductor film, and an inorganic insulating film can be used, for example.

For example, a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials can be used for the sacrificial layer.

For the sacrificial layer, a metal oxide such as In—Ga—Zn oxide can be used. As the sacrificial layer, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—

Ga—Sn—Zn oxide), or the like can be used. Indium tin oxide containing silicon, or the like can also be used.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial layer, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer. As the sacrificial layer, an aluminum oxide film can be formed by an ALD method, for example. The use of an ALD method is preferable, in which case damage to a base (in particular, the EL layer or the like) can be reduced. For example, a silicon nitride film can be formed by a sputtering method.

For example, the sacrificial layer can employ a stacked-layer structure of an inorganic insulating film (e.g., an aluminum oxide film) formed by an ALD method and an In—Ga—Zn oxide film formed by a sputtering method. Alternatively, the sacrificial layer can employ a stacked-layer structure of an inorganic insulating film (e.g., an aluminum oxide film) formed by an ALD method and an aluminum film, a tungsten film, or an inorganic insulating film (e.g., a silicon nitride film) formed by a sputtering method.

In the display apparatus of this embodiment, the distance between the light-emitting devices can be narrowed. Specifically, the distance between the light-emitting devices, the distance between the EL layers, or the distance between the pixel electrodes can be less than 10 μm, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display apparatus of this embodiment includes a region where a distance between two EL layers 113 adjacent to each other is less than or equal to 1 μm, preferably less than or equal to 0.5 μm (500 nm), further preferably less than or equal to 100 nm.

A light-blocking layer may be provided on the surface of the substrate 120 on the resin layer 122 side. Moreover, a variety of optical members can be provided on the outer side of the substrate 120. Examples of optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be provided as a surface protective layer on the outer surface of the substrate 120. For example, it is preferable to provide, as the surface protective layer, a glass layer or a silica layer ($SiO_x$ layer) because the surface contamination or damage can be prevented from being generated. The surface protective layer may be formed using diamond like carbon (DLC), alumina ($AlO_x$), a polyester-based material, a polycarbonate-based material, or the like. For the surface protective layer, a material having a high transmitting property with respect to visible light is preferably used. The surface protective layer is preferably formed using a material with high hardness.

For the substrate 120, glass, quartz, ceramic, sapphire, a resin, a metal, an alloy, a semiconductor or the like can be used. The substrate on the side from which light from the light-emitting device is extracted is formed using a material which transmits the light. When a flexible material is used for the substrate 120, the display apparatus can have increased flexibility and a flexible display can be obtained. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

Next, a material that can be used for a light-emitting device will be described.

A conductive film that transmits visible light is used as the electrode through which light is extracted, which is either the pixel electrode or the common electrode. A conductive film that reflects visible light is preferably used as the electrode through which light is not extracted. In the case where a display apparatus includes a light-emitting element emitting infrared light, a conductive film which transmits visible light and infrared light is used as the electrode through which light is extracted, and a conductive film that reflects visible light and infrared light is preferably used as the electrode through which light is not extracted.

For the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1 \times 10^{-2}$ Ωcm or lower.

The plurality of EL layers 113 are each provided into an island shape. The plurality of EL layers 113 can have the same structure. The plurality of EL layers 113 each include a light-emitting layer. Each of the plurality of EL layers 113 preferably emits white light. For example, when the EL layer 113 includes a plurality of light-emitting layers whose emission colors are complementary to each other, the light-emitting device 130 can emit white light.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the EL layer 113 may also include a layer containing any of a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron- and hole-transport property or a bipolar material), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the EL layer 113 may include at least one of a hole-injection layer, a hole-transport layer, a hole-blocking layer, an electron-blocking layer, an electron-transport layer, and an electron-injection layer.

The common layer 114 can include one or more of a hole-injection layer, a hole-transport layer, a hole-blocking layer, an electron-blocking layer, an electron-transport layer, and an electron-injection layer. For example, a carrier-injection layer (a hole-injection layer or an electron-injection layer) may be formed as the common layer 114. Note that the light-emitting device 130 does not necessarily include the common layer 114.

It is preferable that the EL layer 113 include a light-emitting layer and a carrier-transport layer over the light-emitting layer. Accordingly, the light-emitting layer is prevented from being exposed on the outermost surface in the process of manufacturing the display apparatus 100, so that damage to the light-emitting layer can be reduced. Thus, the reliability of the light-emitting device can be increased.

The hole-injection layer injects holes from the anode to the hole-transport layer and contains a substance with a high hole-injection property. Examples of a substance with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material. The hole-transport material preferably has a hole mobility of $1 \times 10^{-6}$ cm$^2$/Vs or higher. Note that other substances can also be used as long as the substances have a hole-transport property higher than an electron-transport property. As the hole-transport material, substances with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility of $1 \times 10^{-6}$ cm$^2$/Vs or higher. Note that other substances can also be used as long as the substances have an electron-transport property higher than a hole-transport property. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_x$, where x is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a tandem light-emitting device, a charge-generation layer (also referred to as intermediate layer) is provided between two light-emitting units. The intermediate layer has a function of injecting electrons into one of the two light-emitting units and injecting holes to the other when voltage is applied between the pair of electrodes.

For example, the charge-generation layer can be favorably formed using a material that can be used for the electron-injection layer, such as lithium. As another example, the charge-generation layer can be favorably formed using a material that can be used for the hole-injection layer. Moreover, the charge-generation layer can be a layer containing a hole-transport material and an acceptor material (electron-accepting material). The charge-generation layer can be a layer containing an electron-transport material and a donor material. Forming the charge-generation layer including such a layer can suppress an increase in the driving voltage that would be caused when the light-emitting units are stacked.

Example 1 of Method for Manufacturing Display Apparatus

Next, an example of a method for manufacturing the display apparatus will be described with reference to FIGS. 7A to 7D and FIGS. 8A to 8C. FIGS. 7A to 7D and FIGS. 8A to 8C each illustrate a cross section along dashed-dotted line A1-A2 and a cross section along dashed-dotted line C1-C2 in FIG. 1 side by side.

Thin films included in the display apparatus (e.g., insulating films, semiconductor films, and conductive films) can be formed by a sputtering method, a CVD method, a vacuum evaporation method, a PLD method, an ALD method, or the like. Examples of a CVD method include a PECVD method and a thermal CVD method. An example of a thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Thin films included in the display apparatus can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are two typical methods in a photolithography method. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the K-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when exposure is performed by scanning with a beam such as an electron beam.

For etching of thin films, a dry etching method, a wet etching method, a sandblast method, or the like can be used.

Figure 7A:
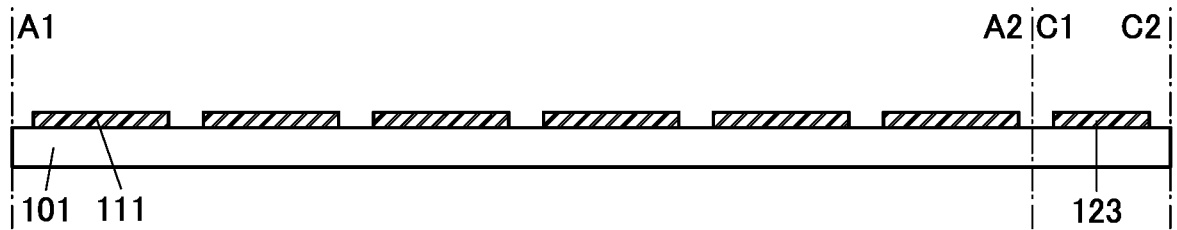
FIGS. 7A to 7D are cross-sectional views illustrating an example of a method for manufacturing a display apparatus.

First, the pixel electrode 111 and the conductive layer 123 are formed over the layer 101 including a transistor (FIG. 7A). The pixel electrode 111 can be formed by a sputtering method or a vacuum evaporation method, for example.

Figure 7B:
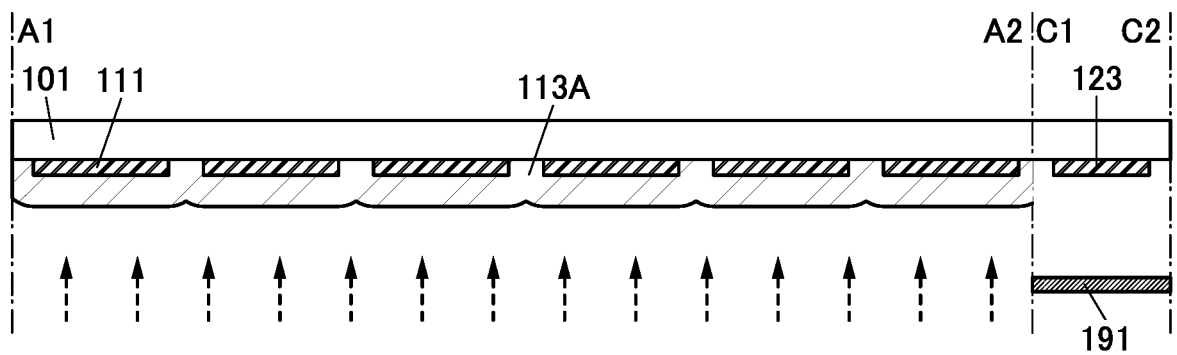

Next, an EL layer 113A that is to be the EL layer 113 later is formed on the pixel electrode 111 and the layer 101 including a transistor (FIG. 7B).

As illustrated in FIG. 7B, the EL layer 113A is not formed on the conductive layer 123 in the cross section along dashed-dotted line C1-C2. For example, a mask 191 for specifying a film formation area (also referred to as an area mask or a rough metal mask to distinguish from a fine metal mask) is used, so that the EL layer 113A can be formed only in a desired region. In one embodiment of the present invention, the light-emitting device is formed using a resist mask; with a combination of a resist mask and an area mask as described above, the light-emitting device can be formed in a relatively simple process.

The EL layer 113A can be formed by an evaporation method, specifically a vacuum evaporation method, for example. FIG. 7B illustrates film formation performed in a state where the substrate is inverted so that the film formation surface faces downward, i.e., film formation performed with a face-down system.

The EL layer 113A may be formed by a transfer method, a printing method, an inkjet method, a coating method, or the like.

Figure 7C:
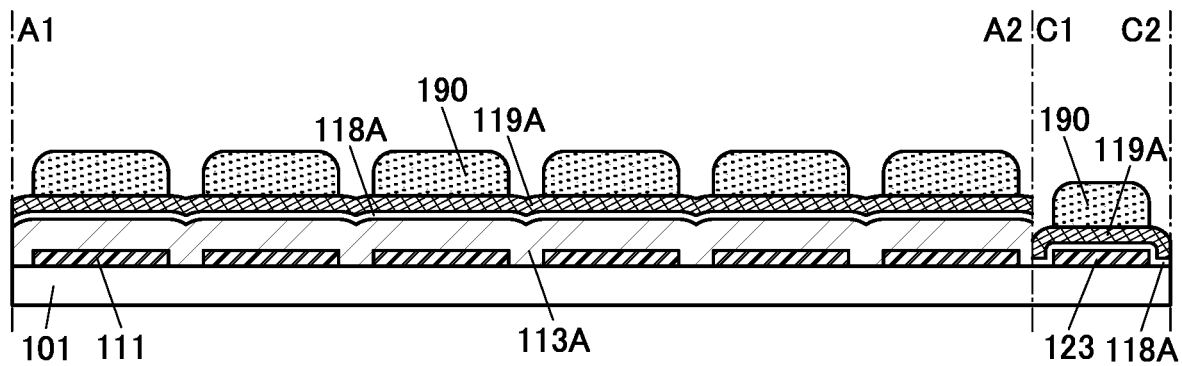

Next, over the EL layer 113A and the conductive layer 123, a sacrificial layer 118A that is to be the sacrificial layer 118 and a sacrificial layer 119A that is to be the sacrificial layer 119 are sequentially formed (FIG. 7C). For the sacrificial layer 118A and the sacrificial layer 119A, a film that is highly resistant to the process conditions for the EL layer 113A, specifically, a film having high etching selectivity with the EL layer 113A is used.

The sacrificial layer 118A and the sacrificial layer 119A can be formed by a sputtering method, an ALD method (including a thermal ALD method or a PEALD method), a CVD method, or a vacuum evaporation method, for example. The sacrificial layer 118A, which is formed on and in contact with the EL layer 113A, is preferably formed by a formation method that causes less damage to the EL layer 113A than a formation method for the sacrificial layer 119A. For example, the sacrificial layer 118A is preferably formed by an ALD method or a vacuum evaporation method rather than a sputtering method. The sacrificial layer 118A and the sacrificial layer 119A are formed at a temperature lower than the allowable temperature limit of the EL layer 113A. The typical substrate temperatures in formation of the sacrificial layer 118A and the sacrificial layer 119A are each lower than or equal to 200° C., preferably lower than or equal to 150° C., further preferably lower than or equal to 120° C., still further preferably lower than or equal to 100° C., yet still further preferably lower than or equal to 80° C.

The sacrificial layer 118A and the sacrificial layer 119A are preferably films that can be removed by a wet etching method. The use of a wet etching method can reduce damage to the EL layer 113A in processing of the sacrificial layer 118A and the sacrificial layer 119A, compared to the case of using a dry etching method.

The sacrificial layer 118A is preferably a film having high etching selectivity with the sacrificial layer 119A.

In the method for manufacturing the display apparatus of this embodiment, it is preferred that the layers (e.g., the hole-injection layer, the hole-transport layer, the light-emitting layer, the electron-transport layer, and the like) included in the EL layer not be easily processed in the step of processing the sacrificial layers, and that the sacrificial layers not be easily processed in the steps of processing the layers included in the EL layer. In consideration of the above, the materials and a processing method for the sacrificial layers and processing methods for the EL layer are preferably selected.

Although this embodiment shows an example in which the sacrificial layer is formed with a two-layer structure of the sacrificial layer 118A and the sacrificial layer 119A, the sacrificial layer may have a single-layer structure or a stacked-layer structure of three or more layers.

As the sacrificial layer 118A and the sacrificial layer 119A, it is preferable to use an inorganic film such as a metal film, an alloy film, a metal oxide film, a semiconductor film, or an inorganic insulating film, for example.

For the sacrificial layer 118A and the sacrificial layer 119A, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the sacrificial layer 118A and the sacrificial layer 119A is preferable, in which case the EL layer can be prevented from being irradiated with ultraviolet light and deteriorating.

For the sacrificial layer 118A and the sacrificial layer 119A, a metal oxide such as In—Ga—Zn oxide can be used. As the sacrificial layer 118A or the sacrificial layer 119A, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Indium tin oxide containing silicon, or the like can also be used.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial layer 118A and the sacrificial layer 119A, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer 118A and the sacrificial layer 119A. As the sacrificial layer 118A or the sacrificial layer 119A, an aluminum oxide film can be formed by an ALD method, for example. The use of an ALD method is preferable, in which case damage to a base (in particular, the EL layer or the like) can be reduced.

For example, an inorganic insulating film (e.g., an aluminum oxide film) formed by an ALD method can be used as the sacrificial layer 118A, and an inorganic film (e.g., an In—Ga—Zn oxide film, an aluminum film, or a tungsten film) formed by a sputtering method can be used as the sacrificial layer 119A.

Note that the same inorganic insulating film can be used for both the sacrificial layer 118A and the insulating layer 125 that is to be formed later. For example, an aluminum oxide film formed by an ALD method can be used for both the sacrificial layer 118A and the insulating layer 125. For the sacrificial layer 118A and the insulating layer 125, the same film-formation condition may be used or different film-formation conditions may be used. For example, when the sacrificial layer 118A is formed under conditions similar to those of the insulating layer 125, the sacrificial layer 118A can be an insulating layer having a high barrier property against at least one of water and oxygen. Meanwhile, since the sacrificial layer 118A is a layer almost or all of which is to be removed in a later step, it is preferable that the processing of the sacrificial layer 118A be easy. Therefore, the sacrificial layer 118A is preferably formed with a substrate temperature lower than that for formation of the insulating layer 125.

A material dissolvable in a solvent that is chemically stable with respect to at least a film on the outermost side of the EL layer 113A may be used for one or both of the sacrificial layer 118A and the sacrificial layer 119A. Specifically, a material that will be dissolved in water or alcohol can be suitably used. In forming a film of such a material, it is preferable to apply the material dissolved in a solvent such as water or alcohol by a wet process and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The sacrificial layer 118A and the sacrificial layer 119A may be formed by a wet process such as spin coating, dipping, spray coating, ink-jetting, dispensing, screen printing, offset printing, doctor blade coating, slit coating, roll coating, curtain coating, or knife coating.

The sacrificial layer 118A and the sacrificial layer 119A may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

Next, a resist mask 190 is formed over the sacrificial layer 119A (FIG. 7C). The resist mask 190 can be formed by application of a photosensitive resin (photoresist), exposure, and development.

The resist mask may be formed using either a positive resist material or a negative resist material.

The resist mask 190 is provided at a position overlapping with the pixel electrode 111. As the resist mask 190, one island-shaped pattern is preferably provided for one subpixel 110.

Note that the resist mask 190 is preferably provided also at a position overlapping with the conductive layer 123. This can prevent the conductive layer 123 from being damaged during the process of manufacturing the display apparatus. Note that the resist mask 190 is not necessarily provided over the conductive layer 123.

Figure 7D:
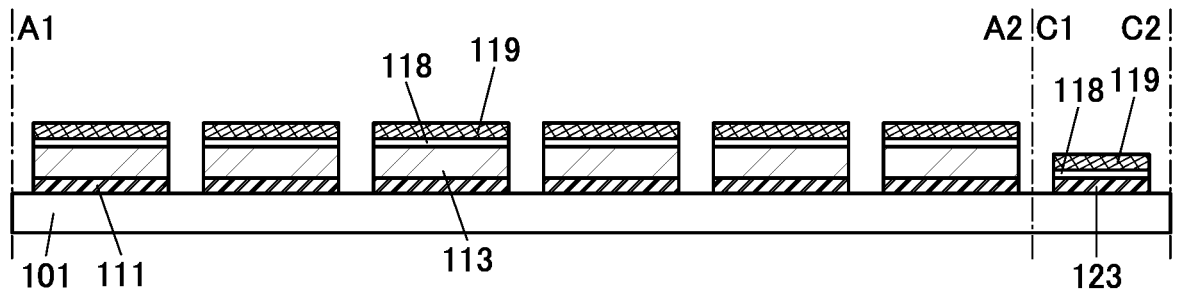

Next, part of the sacrificial layer 119A is removed with use of the resist mask 190, so that the sacrificial layer 119 is formed (FIG. 7D). The sacrificial layer 119 partly remains over the pixel electrode 111 and the conductive layer 123.

In the etching of the sacrificial layer 119A, an etching condition with high selectively is preferably employed so that the sacrificial layer 118A is not removed by the etching. Since the EL layer 113A is not exposed in processing the sacrificial layer 119A, the range of choices of the processing method is wider than that for processing the sacrificial layer 118A. Specifically, deterioration of the EL layer 113A can be further suppressed even when a gas containing oxygen is used as an etching gas for processing the sacrificial layer 119A.

After that, the resist mask 190 is removed. The resist mask 190 can be removed by ashing using oxygen plasma or the like, for example. Alternatively, an oxygen gas and any of $CF_4$, $C_4F_8$, $SF_6$, $CHF_3$, $Cl_2$, $H_2O$, $BCl_3$, or a noble gas (also referred to as rare gas) such as He. Alternatively, the resist mask 190 may be removed by wet etching. At this time, the sacrificial layer 118A is positioned on the outermost surface, and the EL layer 113A is not exposed; thus, the EL layer 113A can be prevented from being damaged in the step of removing the resist mask 190. In addition, the range of choices of the method for removing the resist mask 190 can be widened.

Next, part of the sacrificial layer 118A is removed with use of the sacrificial layer 119 as a mask (also referred to as hard mask) to form the sacrificial layer 118 (FIG. 7D).

The sacrificial layer 118A and the sacrificial layer 119A can be processed by a wet etching method or a dry etching method. The sacrificial layer 118A and the sacrificial layer 119A are preferably processed by anisotropic etching.

The use of a wet etching method can reduce damage to the EL layer 113A in processing of the sacrificial layer 118A and the sacrificial layer 119A, compared to the case of using a dry etching method. In the case of using a wet etching method, it is preferable to use a chemical solution of a developer, an aqueous solution of tetramethylammonium hydroxide (TMAH), dilute hydrofluoric acid, oxalic acid, phosphoric acid, nitric acid, acetic acid, a mixed solution thereof, or the like, for example.

In the case of using a dry etching method, deterioration of the EL layer 113A can be suppressed by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as rare gas) such as He as the etching gas, for example.

For example, when an aluminum oxide film formed by an ALD method is used as the sacrificial layer 118A, the sacrificial layer 118A can be processed by a dry etching method using $CHF_3$ and He. In the case where an In—Ga—Zn oxide film formed by a sputtering method is used as the sacrificial layer 119A, the sacrificial layer 119A can be processed by a wet etching method using a diluted phosphoric acid. Alternatively, the sacrificial layer 119A may be processed by a dry etching method using $CH_4$ and Ar. Alternatively, the sacrificial layer 119A can be processed by a wet etching method using a diluted phosphoric acid. When a tungsten film formed by a sputtering method is used as the sacrificial layer 119A, the sacrificial layer 119A can be processed by a dry etching method using a combination of $SF_6$, $CF_4$, and $O_2$ or a combination of $CF_4$, $Cl_2$ and $O_2$.

Next, the EL layer 113A is processed to form the EL layer 113. For example, part of the EL layer 113A is removed with use of the sacrificial layer 119 and the sacrificial layer 118 as a hard mask to form the EL layer 113 (FIG. 7D).

The EL layer 113A is processed as illustrated in FIG. 7D, whereby a plurality of EL layers 113 can be formed. That is, the EL layer 113A can be divided into a plurality of EL layers 113. Note that the EL layer 113A is not necessarily divided in either the row direction or the column direction. In that case, each EL layer 113 can made into a belt-like shape.

The EL layer 113A is preferably processed by anisotropic etching. In particular, an anisotropic dry etching method is preferably used. Alternatively, a wet etching method may be used.

In the case of using a dry etching method, deterioration of the EL layer 113A can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the EL layer 113A can be suppressed. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas (also referred to as rare gas) such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

As described above, in one embodiment of the present invention, the sacrificial layer 119 is formed in the following manner: the resist mask 190 is formed over the sacrificial layer 119A; and part of the sacrificial layer 119A is removed with use of the resist mask 190. After that, part of the EL layer 113A is removed with use of the sacrificial layer 119 as a hard mask, so that the EL layer 113 is formed. In other words, the EL layer 113 can be formed by processing the EL layer 113A with a photolithography method. Note that part of the EL layer 113A may be removed using the resist mask 190. Then, the resist mask 190 may be removed.

The island-shaped EL layer 113 is provided for each subpixel, whereby generation of leakage current between the subpixels can be inhibited. Accordingly, degradation of the display quality of the display apparatus can be suppressed. In addition, both the higher resolution and higher display quality of the display apparatus can be achieved.

Figure 8A:
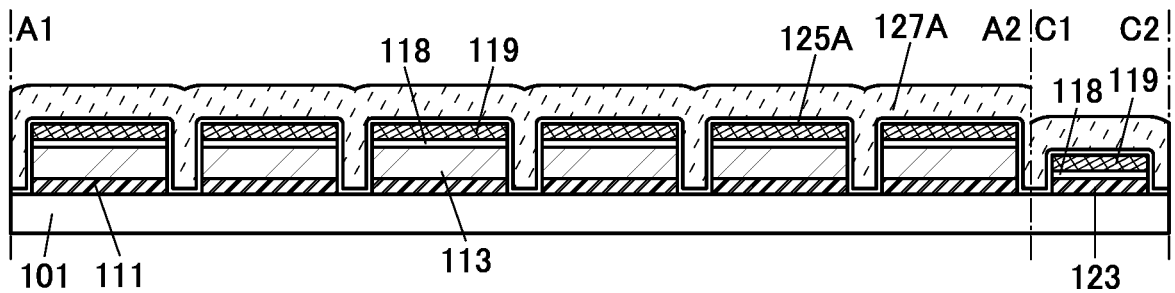
FIGS. 8A to 8C are cross-sectional views illustrating an example of a method for manufacturing a display apparatus.

Next, an insulating film 125A that is to be the insulating layer 125 later is formed to over the pixel electrode 111, the EL layer 113, the sacrificial layer 118, and the sacrificial layer 119 (FIG. 8A).

As the insulating film 125A, an insulating film is preferably formed at a substrate temperature higher than or equal to 60° C., higher than or equal to 80° C., higher than or equal to 100° C., or higher than or equal to 120° C. and lower than or equal to 200° C., lower than or equal to 180° C., lower than or equal to 160° C., lower than or equal to 150° C., or lower than or equal to 140° C. to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

As the insulating film 125A, an aluminum oxide film is preferably formed by an ALD method, for example.

Then, an insulating film 127A is formed over the insulating film 125A (FIG. 8A). A photosensitive material, for example, a photosensitive resin, can be used for the insulating film 127A. For example, the insulating film 127A can be formed by a wet film-formation method such as spin coating, dipping, spray coating, ink-jetting, dispensing, screen printing, offset printing, doctor blade coating, slit coating, roll coating, curtain coating, or knife coating. Specifically, an organic insulating film that is to be the insulating film 127 is preferably formed by spin coating.

The insulating film 125A and the insulating film 127A are preferably formed by a formation method by which the EL layer 113 is less damaged. In particular, the insulating film 125A, which is formed in contact with a side surface of the EL layer 113, is preferably formed by a formation method that causes less damage to the EL layer 113 than the method of forming the insulating film 127A. The insulating film 125A and the insulating film 127A are each formed at a temperature lower than the allowable temperature limit of the EL layer 113. The typical substrate temperatures in formation of the insulating film 125A and the insulating film 127A are each lower than or equal to 200° C., preferably lower than or equal to 180° C., further preferably lower than or equal to 160° C., still further preferably lower than or equal to 150° C., yet still further preferably lower than or equal to 140° C. As the insulating film 125A, an aluminum oxide film can be formed by an ALD method, for example. The use of an ALD method is preferable, in which case damage by the deposition is reduced and a film with good coverage can be formed.

Figure 8B:
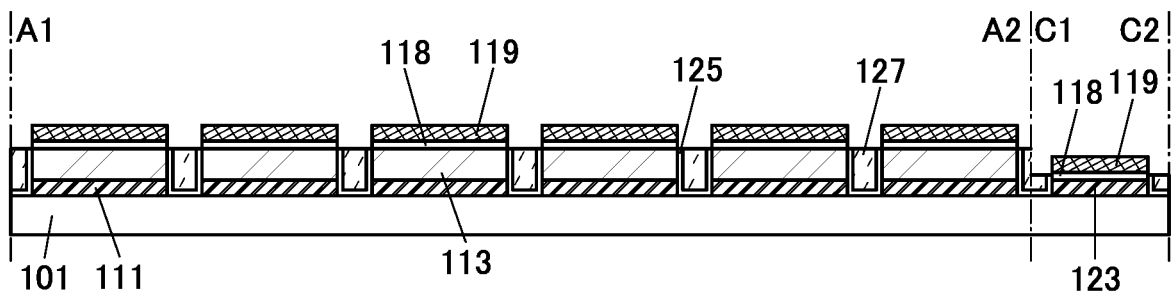

Next, the insulating film 127A is processed to form the insulating layer 127 (FIG. 8B). For example, in the case where a photosensitive material is used as the insulating film 127A, exposure and development treatments are performed on the insulating film 127A, whereby the insulating layer 127 can be formed. Etching may be performed so that the surface level of the insulating layer 127 is adjusted. The insulating layer 127 may be processed by ashing using oxygen plasma, for example.

Next, at least part of the insulating film 125A is removed, so that the insulating layer 125 is formed (FIG. 8B).

The insulating film 125A is preferably processed by a dry etching method. The insulating film 125A is preferably processed by anisotropic etching. The insulating film 125A can be processed using an etching gas that can be used for processing the sacrificial layer.

After that, the sacrificial layer 119 and the sacrificial layer 118 are removed. Accordingly, at least part of the top surface of the EL layer 113 and the top surface of the conductive layer 123 are exposed.

For the removal of the sacrificial layer, a wet etching method is preferably used. With this method, damage given to the EL layer 113 in removal of the sacrificial layer can be reduced as compared to the case where the sacrificial layer is removed by a dry etching method, for example.

The sacrificial layer may be removed by being dissolved in a solvent such as water or alcohol. Examples of alcohol include ethyl alcohol, methyl alcohol, isopropyl alcohol (IPA), and glycerin.

After the sacrificial layer is removed, drying treatment may be performed to remove water included in the EL layer and water adsorbed on the surface of the EL layer. For example, heat treatment in an inert gas atmosphere or a reduced-pressure atmosphere can be performed. The heat treatment can be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Next, the common layer 114 is formed over the insulating layer 125, the insulating layer 127, and the EL layer 113. Then, the common electrode 115 is formed over the common layer 114 (FIG. 8C).

The common layer 114 can be formed by an evaporation method (including a vacuum evaporation method), a transfer method, a printing method, an inkjet method, a coating method, or the like. As described above, the common layer 114 can include an electron-injection layer or a hole-injection layer, for example.

The common electrode 115 can be formed by a sputtering method or a vacuum evaporation method, for example. Alternatively, the common electrode 115 may be a stack of a film formed by an evaporation method and a film formed by a sputtering method.

Figure 8C:
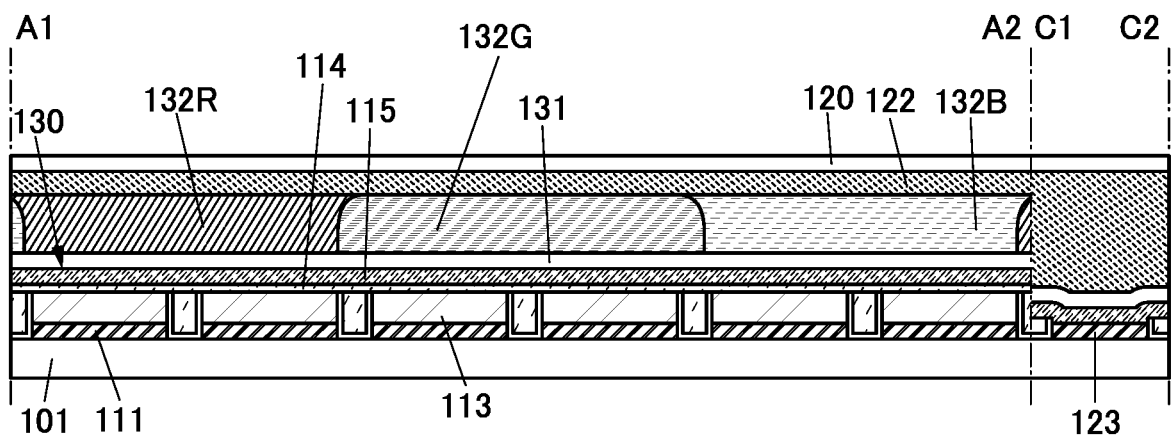

Next, the protective layer 131 is formed over the common electrode 115, and the coloring layers 132R, 132G, and 132B are formed over the protective layer 131 (FIG. 8C). In addition, the substrate 120 is bonded to the protective layer 131 and the coloring layers 132R, 132G, and 132B with the resin layer 122, whereby the display apparatus 100 illustrated in FIGS. 2A and 2C can be formed.

Examples of methods for forming the protective layer 131 include a vacuum evaporation method, a sputtering method, a CVD method, and an ALD method. The protective layer 131 may have a single-layer structure or a stacked-layer structure.

Example 2 of Method for Manufacturing Display Apparatus

Although an example in which the EL layer 113A is formed by an evaporation method is described in the above Example 1, one embodiment of the present invention is not limited thereto. In Example 2, an example of forming an EL layer 180 using a wet process, specifically, an inkjet method is described with reference to FIGS. 9A and 9B.

Figure 9A:
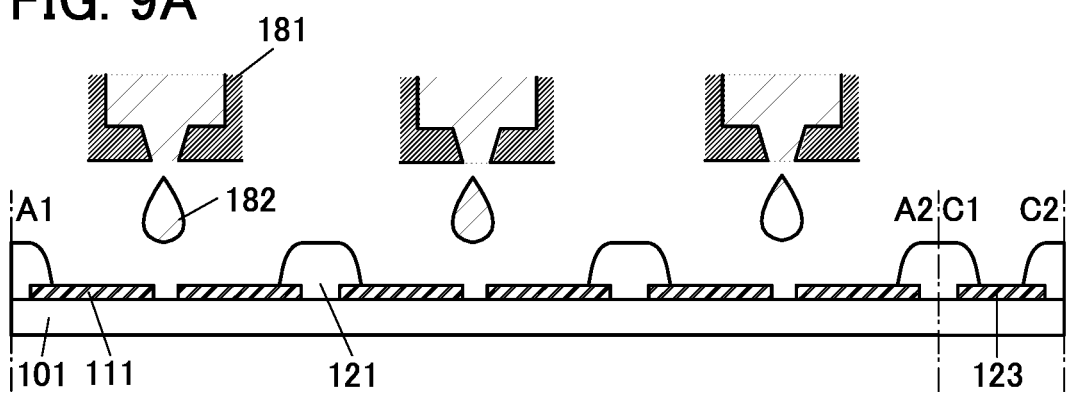
FIGS. 9A to 9D are cross-sectional views illustrating an example of a method for manufacturing a display apparatus.

FIG. 9A illustrates a state where droplets 182 that are to be EL layers 180a, 180b, and 180c are dropped by an inkjet method. A nozzle 181 of an inkjet apparatus is placed to face the layer 101 including a transistor, and the droplets 182 are dropped from the nozzle 181 onto the layer 101 including a transistor and the pixel electrode 111.

The droplet 182 includes an organic compound for forming an EL layer and a solvent. Examples of the organic compound included in the droplet 182 include a hole-injection material, a hole-transport material, a hole-blocking material, a light-emitting material, an electron-blocking material, and an electron-transport material.

Figure 9B:
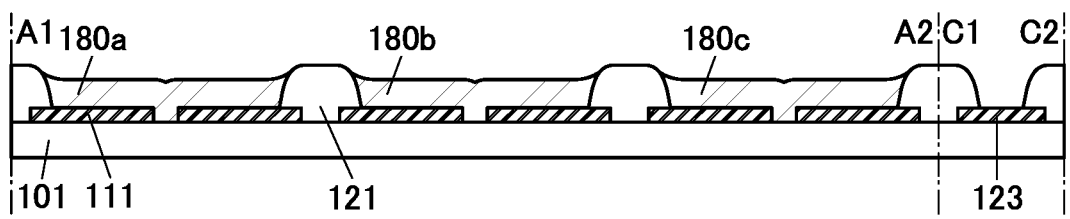

As illustrated in FIG. 9B, the EL layers 180a, 180b, and 180c are formed over the layer 101 including a transistor and the pixel electrode 111. At this time, in the EL layers 180a, 180b, and 180c, the solvents included in the droplets are preferably vaporized through a drying step. Heat may be added in the drying step.

At least surfaces of the EL layers 180a, 180b, and 180c are preferably cured through a light irradiation step or the like. As the light, ultraviolet light or infrared light can be used.

Figure 9C:
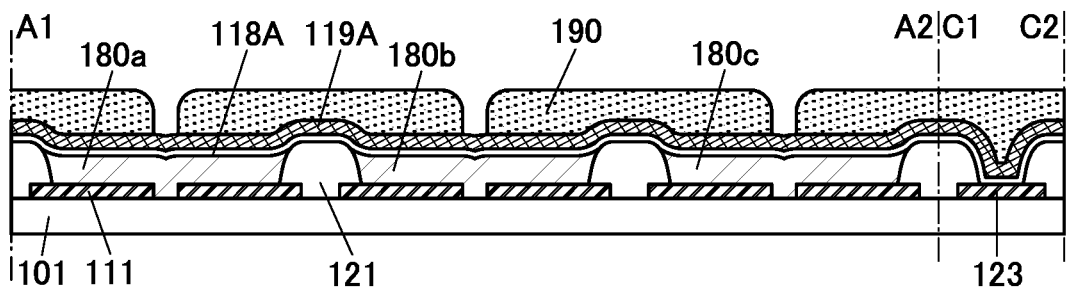
Figure 9D:
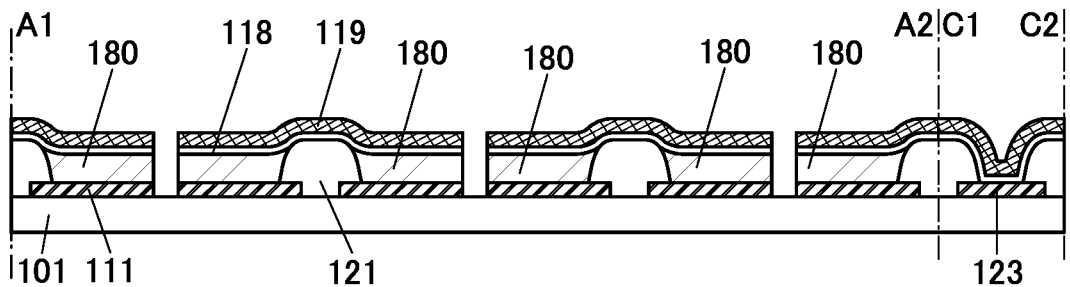

Next, in a manner similar to Example 1, the sacrificial layer 118A, the sacrificial layer 119A, and the resist mask 190 are formed in this order over the EL layers 180a, 180b, and 180c (FIG. 9C). Then, as illustrated in FIG. 9D, the EL layers 180a, 180b, and 180c are processed, so that one island-shaped EL layer 180 is formed with respect to one pixel electrode 111.

The island-shaped EL layer 180 is provided for each subpixel, whereby generation of leakage current between the subpixels can be inhibited. Accordingly, degradation of the display quality of the display apparatus can be suppressed. In addition, both the higher resolution and higher display quality of the display apparatus can be achieved.

Example of Driving Method for Display Apparatus

Figure 10A:
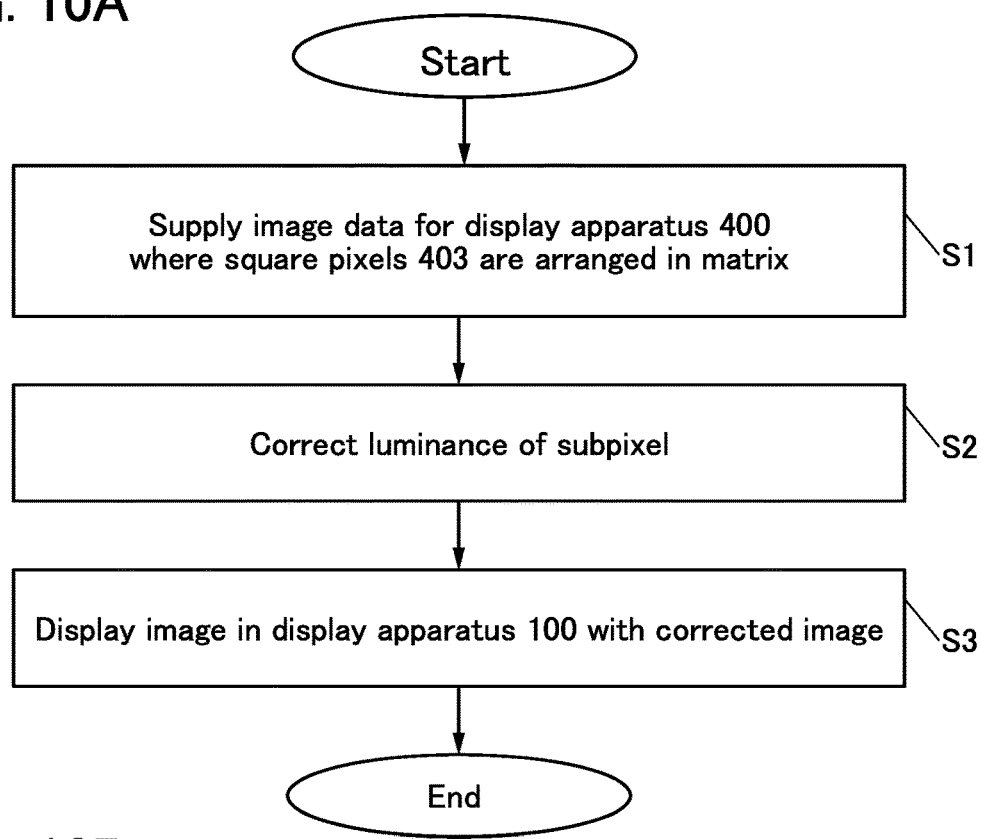
FIG. 10A is a flowchart showing an example of a method for driving a display apparatus.

FIG. 10A is a flowchart showing an example of a method for driving the display apparatus 100. Specifically, this flowchart shows an example in which image data supplied to the display apparatus 100 or an electronic device including the display apparatus 100 is corrected in a processing unit or the like in the display apparatus 100 or the electronic device, and the corrected image data is used to display an image on the display apparatus 100.

Figure 10B:
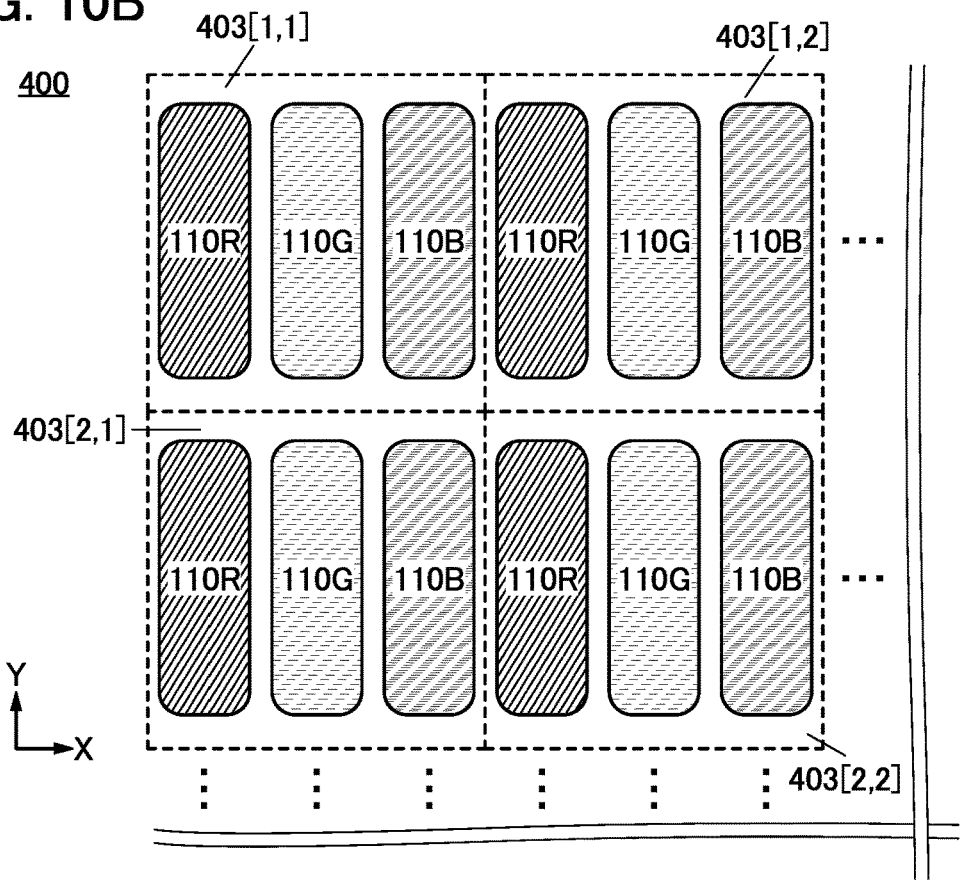
FIG. 10B is a top view of an example of the display apparatus.

First, image data for a display apparatus 400 illustrated in FIG. 10B is supplied to the display apparatus 100 or an electronic device including the display apparatus 100 (Step S1). The image data has a value indicating luminance of light emitted by each of the subpixels 110. The value is referred to as a luminance value or a gray scale value. The luminance value can be a digital value, for example. In the case where one luminance value is represented by 8-bit digital data, for example, the luminance value can be any of 0 to 255. For example, as the luminance value is increased, the luminance of light emitted by the subpixel 110 can be increased. The following description is made under the condition where the luminance of light emitted by the subpixel 110 is increased as the luminance value is increased. However, even when the luminance of light emitted by the subpixel 110 is decreased as the luminance value is increased, which is caused by, for example, reversing the magnitude relationship of luminance values, the following description can be employed.

FIG. 10B is a top view illustrating a structure example of the display apparatus 400. The display apparatus 400 includes square pixels 403 arranged in matrix. In the pixel 403, the subpixel 110R emitting red light, the subpixel 110G emitting green light, and the subpixel 110B emitting blue light are lined up in the X direction in this order. FIG. 10B illustrates a pixel 403[1,1], a pixel 403[1,2], a pixel 403[2,1], and a pixel 403 [2,2]. In the case where the display apparatus 100 includes the pixels 103 arranged in m rows and n columns (m and n are each an integer greater than or equal to 1), the display apparatus 400 includes the pixels 403 arranged in m rows and n columns.

The display apparatus 100 illustrated in FIG. 1 and the display apparatus 400 illustrated in FIG. 10B are compared. Specifically, the pixel 103[1,1] and the pixel 103[1,2] included in the display apparatus 100 and the pixel 403[1,1] and the pixel 403[1,2] included in the display apparatus 400 are compared.

In both the display apparatus 100 and the display apparatus 400, the subpixel in the first row and the first column is the subpixel 110R. Meanwhile, the subpixel in the first row and the second column is the subpixel 110R in the display apparatus 100, whereas that is the subpixel 110G in the display apparatus 400. The subpixel in the first row and the third column is the subpixel 110G in the display apparatus 100, whereas that is the subpixel 110B in the display apparatus 400. The subpixel in the first row and the fourth column is the subpixel 110G in the display apparatus 100, whereas that is the subpixel 110R in the display apparatus 400. The subpixel in the first row and the fifth column is the subpixel 110B in the display apparatus 100, whereas that is the subpixel 110G in the display apparatus 400. In both the display apparatus 100 and the display apparatus 400, the subpixel in the first row and the sixth column is the subpixel 110B.

As described above, in terms of colors of light emitted from the subpixels, some coordinates of the display apparatus 100 do not match those of the display apparatus 400. Therefore, in the image data allocated to the subpixels with such coordinates in the display apparatus 400, luminance values are required to change so as to have compatibility for the subpixels arranged in the display apparatus 100.

For example, the luminance value in the corrected image data allocated to the coordinates of the first row and the second column is preferably determined on the basis of the luminance value in the supplied image data allocated to the coordinates of the first row and the fourth column. Thus, the luminance value of the subpixel 110R[1,2] in the display apparatus 100 can be comparable to the luminance value of the subpixel 110R in the first row and the fourth column in the display apparatus 400.

Similarly, the luminance values in the corrected image data allocated to coordinates in the first row and third column, in the first row and fourth column, and in the first row and fifth column are preferably determined on the basis of the luminance values in the supplied image data allocated to coordinates in the first row and second column, in the first row and fifth column, and in the first row and third column. Thus, the luminance values of the subpixel 110G[1,3], the subpixel 110G[1,4], and the subpixel 110B[1,5] in the display apparatus 100 can be comparable to the luminance values of the subpixel 110G in the first row and the second column, the subpixel 110G in the first row and the fifth column, and the subpixel 110B in the first row and the third column in the display apparatus 400, respectively.

The luminance values in the supplied image data allocated to coordinates may be used, without any changes, as the luminance values in the corrected image data allocated to corresponding coordinates. In other words, luminance values for coordinates may be replaced between the two display apparatuses depending on a difference level in pixel layout.

However, in some cases, a change occurs in an image to be displayed due to a difference in pixel layout when the luminance values for coordinates are just replaced between two display apparatuses. In such a case, a user of the display apparatus 100 may feel uncomfortable. Thus, it is preferable to correct the luminance values of subpixels whose coordinates greatly change between the display apparatus 100 and the display apparatus 400. By this, the display apparatus 100 can display natural images (also referred to as desired images or intended images). The correction processing described above can also be called anti-aliasing or smoothing. With this processing, jaggy is not noticeable, and high quality image display can be achieved.

The subpixel 110R[1,2] in the display apparatus 100 can be regarded as being placed at the coordinates in the first row and the fourth column in the display apparatus 400. In other words, the subpixel 110R[1,2] can be regarded as moving forward the X direction by two. Furthermore, the subpixel 110G[1,3] can be regarded as being placed at the coordinates in the first row and the second column in the display apparatus 400. In other words, the subpixel 110G[1,3] can be regarded as moving backward the X direction by one. Furthermore, the subpixel 110G[1,4] can be regarded as being placed at the coordinates in the first row and the fifth column in the display apparatus 400. In other words, the subpixel 110G[1,4] can be regarded as moving forward the X direction by one. Furthermore, the subpixel 110B[1,5] can be regarded as being placed at the coordinates in the first row and the third column in the display apparatus 400. In other words, the subpixel 110B[1,5] can be regarded as moving backward the X direction by two.

From the above, the following can be found: no shift of coordinates occurs in the subpixel 110R[1,1] and the subpixel 110B[1,6]; shift by one in X-coordinate occurs in the subpixel 110G[1,3] and the subpixel 110G[1,4]; and shift in X-coordinates by two occurs in the subpixel 110R[1,2] and the subpixel 110B[1,5]. The same applies to the subpixels 110 in the two and subsequent rows.

Next, luminance of the subpixels 110 whose coordinates are regarded as being shifted to a certain extent or more from comparison between the display apparatus 400 and the display apparatus 100 is corrected (Step S2). Specifically, the luminance value in the image data is corrected with the processing unit or the like in the display apparatus 100 or an electronic device thereof. For example, the luminance of the subpixel 110 whose coordinates are shifted by two or more according to the comparison between the display apparatus 400 and the display apparatus 100 is corrected. Note that the luminance of the subpixel 110 whose coordinates are shifted by one or more may be corrected.

Note that the step of correcting the luminance of the subpixel 110 whose coordinates are shifted to a certain extent or more (Step S2) can be called a step of controlling brightness. That is, the driving method of the display apparatus of one embodiment of the present invention has a function of controlling the brightness of the subpixel, a function of controlling color tone of the subpixel, or a function of varying the brightness of the subpixel.

The following description is made for correction of the luminance of the subpixel 110 whose coordinates are shifted by two according to the comparison between the display apparatus 400 and the display apparatus 100. As a specific example, a luminance value corresponding to light emitted from the subpixel 110R in the first row and the fourth column in the display apparatus 400 is corrected to be a luminance value corresponding to light emitted from the subpixel 110R[1,2] in the display apparatus 100. As another example, a luminance value corresponding to light emitted from the subpixel 110B in the first row and the third column in the display apparatus 400 is corrected to be a luminance value corresponding to light emitted from the subpixel 110B[1,5] in the display apparatus 100.

For example, a luminance value corresponding to light emitted from the subpixel 110R in the first row and the fourth column in the display apparatus 400 can be corrected on the basis of the luminance value and a luminance value corresponding to light emitted from the subpixel 110R in the first row and the first column in the display apparatus 400. In other words, on the basis of the luminance values, a luminance value corresponding to light emitted from the subpixel 110R[1,2] in the display apparatus 100 can be generated. For example, a luminance value corresponding to light emitted from the subpixel 110B in the first row and the third column in the display apparatus 400 can be corrected on the basis of the luminance value and a luminance value corresponding to light emitted from the subpixel 110B in the first row and the sixth column in the display apparatus 400. In other words, on the basis of the luminance values, a luminance value corresponding to light emitted from the subpixel 110B[1,5] in the display apparatus 100 can be generated.

As described above, a luminance value of each subpixel 110 in the display apparatus 100 can be determined on the basis of both of luminance values of the following subpixels 110 in the display apparatus 400: the subpixel 110 with corresponding coordinates and its neighboring subpixel 110 emitting the same color light.

For example, a luminance value corresponding to light emitted from the subpixel 110R[1,2] in the display apparatus 100 can be represented by the following formula (1). In the formula, $a_1$ and $b_1$ each denotes a coefficient (weight). In addition, $L_{400[i,j]}$ (i and j are each an integer greater than or equal to 1) denotes a luminance value corresponding to light emitted from the subpixel 110[ij] in the display apparatus 400.

[Formula 1]

$$a_1 \cdot L_{400[1,1]} + b_1 \cdot L_{400[1,4]} \qquad (1)$$

For example, "$a_1+b_1$" can be 1, and $a_1$ can be a value greater than $b_1$. Alternatively, "$a_1+b_1$" may be greater than 1 or smaller than 1, and $a_1$ may be a value smaller than $b_1$. A luminance value corresponding to light emitted from the subpixel 110B[1,5] in the display apparatus 100 can be represented by the following formula (2).

[Formula 2]

$$a_2 \cdot L_{400[1,3]} + b_2 \cdot L_{400[1,6]} \qquad (2)$$

For example, "$a_2+b_2$" can be 1, and $a_2$ can be a value smaller than $b_2$. Alternatively, "$a_2+b_2$" may be greater than 1 or smaller than 1, and $a_2$ may be a value greater than $b_2$.

Accordingly, the weight of the luminance value of the subpixel 110 whose coordinates are greatly shifted according to the comparison between the display apparatus 400 and the display apparatus 100 can be made small. Note that in the formula (1) and the formula (2), a constant may be added.

With the above described method, the image data can be corrected so as to be accommodated to the pixel layout of the display apparatus of one embodiment of the present invention. Consequently, image data for a pixel layout of another display apparatus can be used for the display apparatus of one embodiment of the present invention.

Next, an image is displayed in the display apparatus 100 with use of the corrected image data (Step S3). Specifically, the subpixel 110 in the display apparatus 100 emits light of luminance corresponding to the luminance value in the image data, whereby an image can be displayed on the display portion of the display apparatus 100. The above is an example of the driving method of the display apparatus 100.

Although the pixel 103 in the display apparatus 100 illustrated in FIG. 1 has a shape more complicated than a square shape, the display apparatus 100 enables natural images to be displayed when the display apparatus 100 is driven with the driving method described in the above example.

In the case where image data is written to the subpixels 110 in the display apparatus 100 so that an image is displayed, the display apparatus 100 may be driven with a progressive method in which image data is written to the subpixels 110 in the second row immediately after image data is written to the subpixels 110 in the first row, and in a similar manner, image data is written to the subpixels 110 in rows sequentially up to the last row (m-th row). Alternatively, the display apparatus 100 may be driven with an interlaced method in which image data is not written to some rows of the subpixels 110.

In the interlaced method, for example, after writing image data to the subpixels 110 in the first row, writing image data to the subpixels 110 in the second row is skipped, and image data is written to the subpixels 110 in the third row. In this manner, the image data is written sequentially up to the subpixels 110 in the (m−1)-th row. Then, after writing image data to the subpixels 110 in the second row, image data is written to the subpixels 110 in the fourth row. In this manner, the image data is written sequentially up to the subpixels 110 in the m-th row. In other words, after image data is written to the subpixels 110 in all odd-numbered rows, image data is written to the subpixels 110 in all even-numbered rows, for example. Note that when the display apparatus 100 is driven with an interlaced method, this method is not limited to the above example where image data is written to the subpixels 110 in every other line, image data may be written to the subpixels 110 in every third line.

When the display apparatus 100 is driven with a progressive method, the display apparatus 100 can display an image with few flickers. On the other hand, the display apparatus 100 is driven with an interlaced method, which enables a pseudo increase in frame frequency and results in displaying a smooth moving image.

Note that the driving system may be set so that a user of the display apparatus 100 can switch the driving method optionally between the progressive method and the interlaced method. With such a structure, an image according to the user's preference can be displayed.

Structure Example 2 of Display Apparatus

Figure 11:
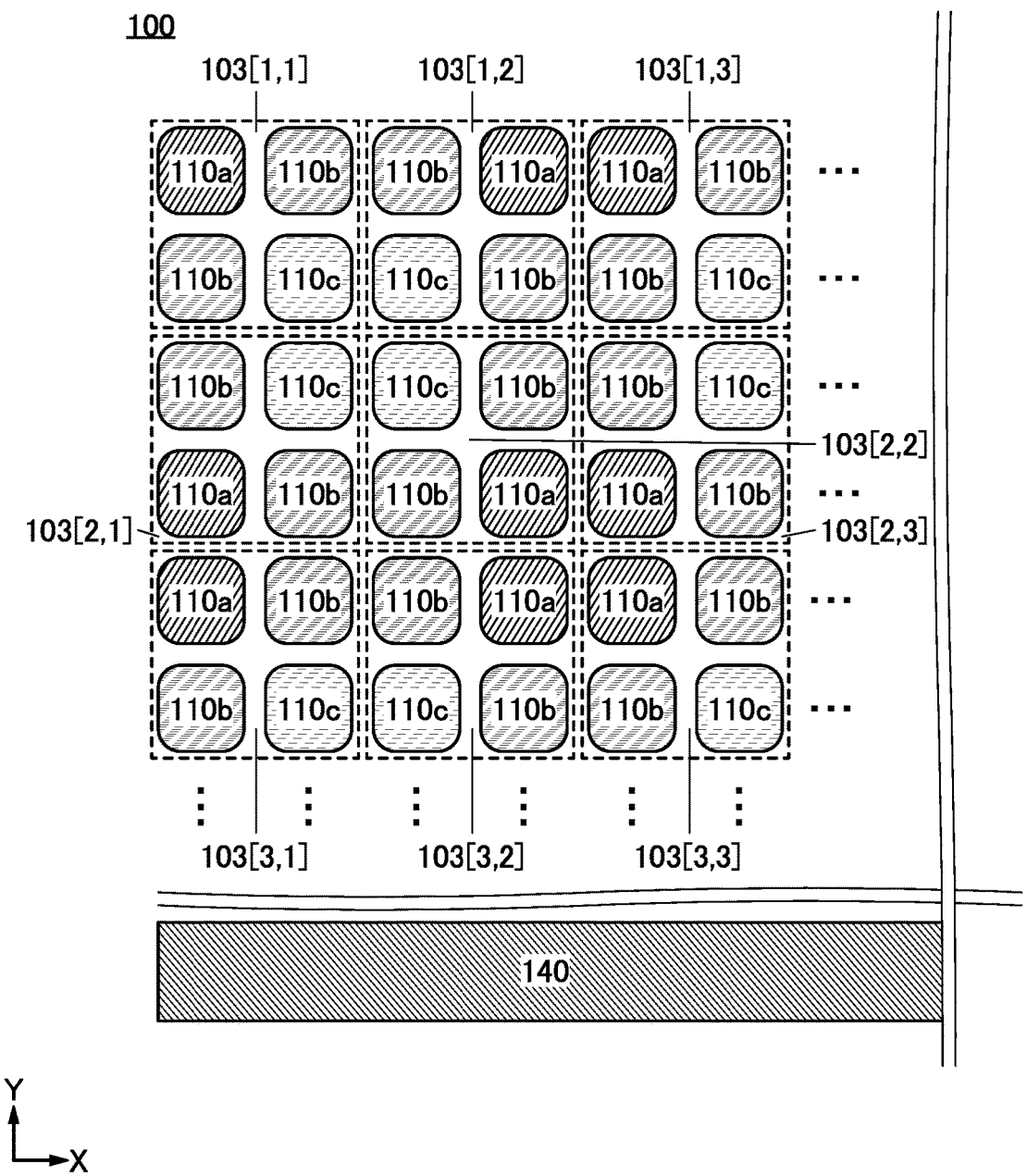
FIG. 11 is a top view illustrating an example of a display apparatus.

Although pixel arrangement of the display apparatus 100 in FIG. 1 is stripe arrangement, one embodiment of the present invention is not limited thereto. FIG. 11 is a top view illustrating a structure example of the display apparatus 100 whose pixel arrangement is Bayer arrangement.

FIG. 11 illustrates subpixels 110 in six rows and six columns which form pixels 103 in three rows and three columns. Note that one pixel 103 illustrated in FIG. 11 has a structure including two subpixels 110*b*.

The pixel 103 includes three types of subpixels 110*a*, 110*b*, and 110*c*. The subpixels 110*a*, 110*b*, and 110*c* emit light of different colors from each other. The subpixels 110*a*, 110*b*, and 110*c* can be of three colors of red (R), green (G), and blue (B) or of three colors of yellow (Y), cyan (C), and magenta (M), for example.

The display apparatus in FIG. 11 has a portion where a first arrangement pattern with two rows and a second arrangement pattern with two rows are repeatedly located in the column direction (Y direction). In the first arrangement pattern, two subpixels 110*a* and two subpixels 110*b* are repeatedly located in the row direction (X direction). In the second arrangement, the two subpixels 110*b* and two subpixels 110*c* are repeatedly located in the row direction (X direction).

Furthermore, the display apparatus in FIG. 11 has a portion where a third arrangement pattern with two columns and a fourth arrangement pattern with two columns are repeatedly located in the row direction (X direction). In the third arrangement pattern, two subpixels 110*a* and two subpixels 110*b* are repeatedly located in the column direction (Y direction). In the fourth arrangement pattern, two subpixels 110*b* and two subpixels 110*c* are repeatedly located in the column direction (the Y direction).

As illustrated in FIG. 11, for example, the subpixels 110 in the second row and the second column, in the second row and the third column, in the third row and the second column, and in the third row and the third column are each the subpixel 110*c*. For example, the subpixels 110 in the second row and the fourth column, in the second row and the fifth column, in the third row and the fourth column, and in the third row and the fifth column are each the subpixel 110*b*. For example, the subpixels 110 in the fourth row and the fourth column, in the fourth row and the fifth column, in the fifth row and the fourth column, and in the fifth row and the fifth column are each the subpixel 110*a*. Thus, the subpixels 110 emitting light of one color are arranged at least in two rows and two columns to be adjacent to each other. Note that the subpixels 110 emitting light of one color may be arranged in three or more rows to be continuously lined up or arranged in three or more columns to be continuously lined up.

Structure Example 3 of Display Apparatus

Figure 12:
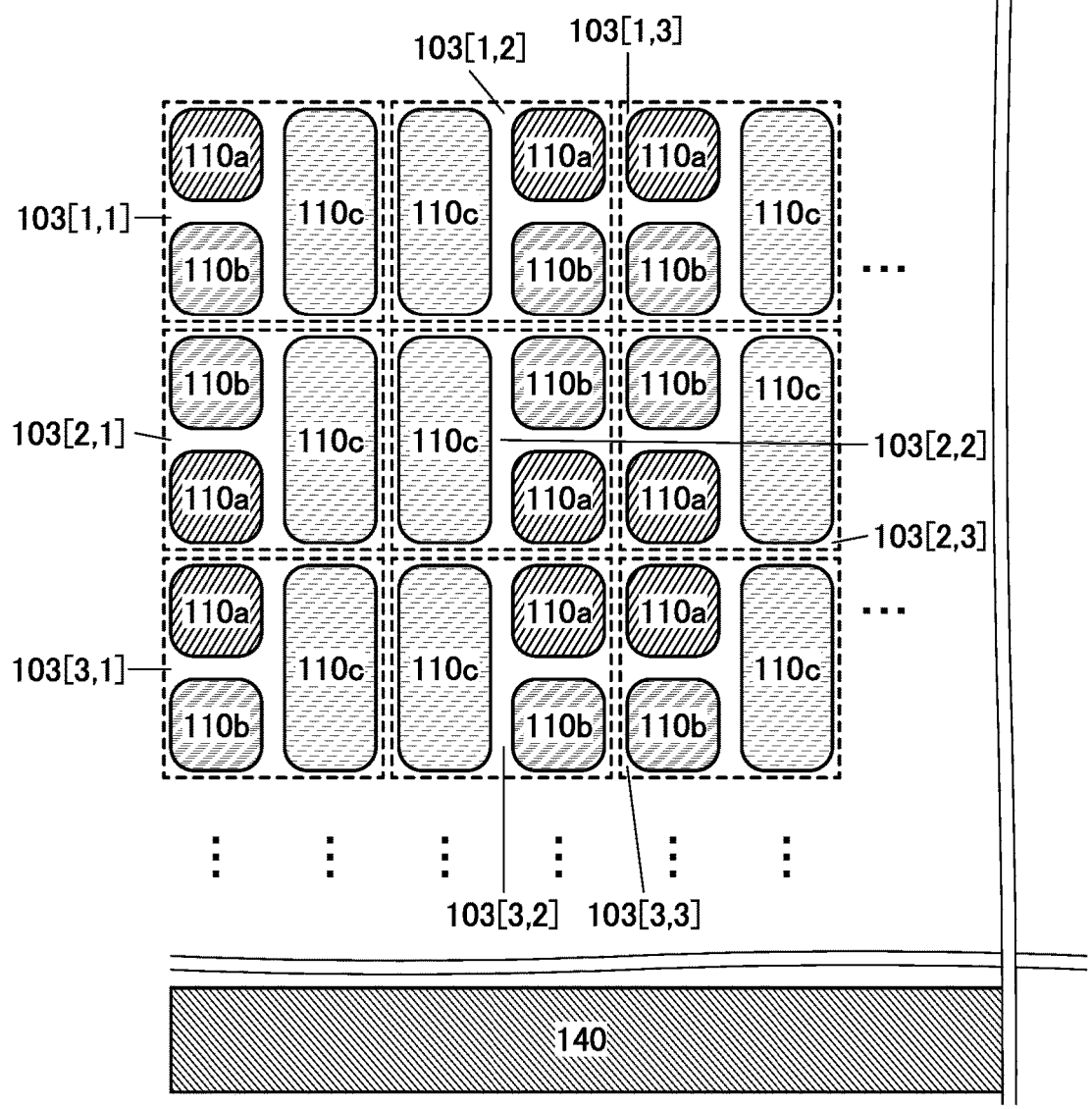
FIG. 12 is a top view illustrating an example of a display apparatus.

FIG. 12 is a top view illustrating a structure example of the display apparatus 100 whose pixel arrangement is S-stripe arrangement.

FIG. 12 illustrates the pixels 103 in three rows and three columns. The subpixels 110 in the first column, the fourth column, and the fifth column are the subpixels 110*a* and the subpixels 110*b*, and the subpixels 110 in the second column, the third column, and the sixth column are the subpixels 110*c*.

The display apparatus in FIG. 12 has a portion where a first arrangement pattern with two rows and a second arrangement pattern with two rows are repeatedly located in the column direction (Y direction). In the first arrangement pattern, two subpixels 110*a* and two subpixels 110*c* are repeatedly located in the row direction (X direction). In the second arrangement pattern, the two subpixels 110*b* and two subpixels 110*c* are repeatedly located in the row direction (X direction).

Furthermore, the display apparatus in FIG. 12 has a portion where a third arrangement pattern with two columns and a fourth arrangement pattern with two columns are repeatedly located in the row direction (X direction). In the third arrangement pattern, two subpixels 110*a* and two subpixels 110*b* are repeatedly located in the column direction (Y direction). In the fourth arrangement pattern, the subpixel 110*c* is repeatedly located in the column direction (the Y direction).

As illustrated in FIG. 12, for example, the subpixels 110 in the second row and the fourth column, in the second row and the fifth column, in the third row and the fourth column, and in the third row and the fifth column are each the subpixel 110*b*. For example, the subpixels 110 in the fourth row and the fourth column, in the fourth row and the fifth column, in the fifth row and the fourth column, and in the fifth row and the fifth column are each the subpixel 110*a*. Thus, the subpixels 110*a* are arranged in two rows and two column to be adjacent to each other, and the subpixels 110*b* are arranged in two rows and two column to be adjacent to each other. In addition, as described above, the subpixels 110 in the second column and the third column are the subpixels 110*c*; accordingly, the subpixels 110*c* are arranged at least in two columns to be adjacent. Note that the subpixels 110*a* may be arranged in three or more rows to be adjacent, and the subpixels 110*b* may be arranged in three or more of rows to be adjacent. Furthermore, the following arrangements may be made: arrangement of the subpixels 110*a* in three or more columns which are continuously lined up, arrangement of the subpixels 110*b* in three or more columns which are continuously lined up, and arrangement of the subpixels 110*c* in three or more columns which are continuously lined up.

Structure Example 4 of Display Apparatus

Figure 13:
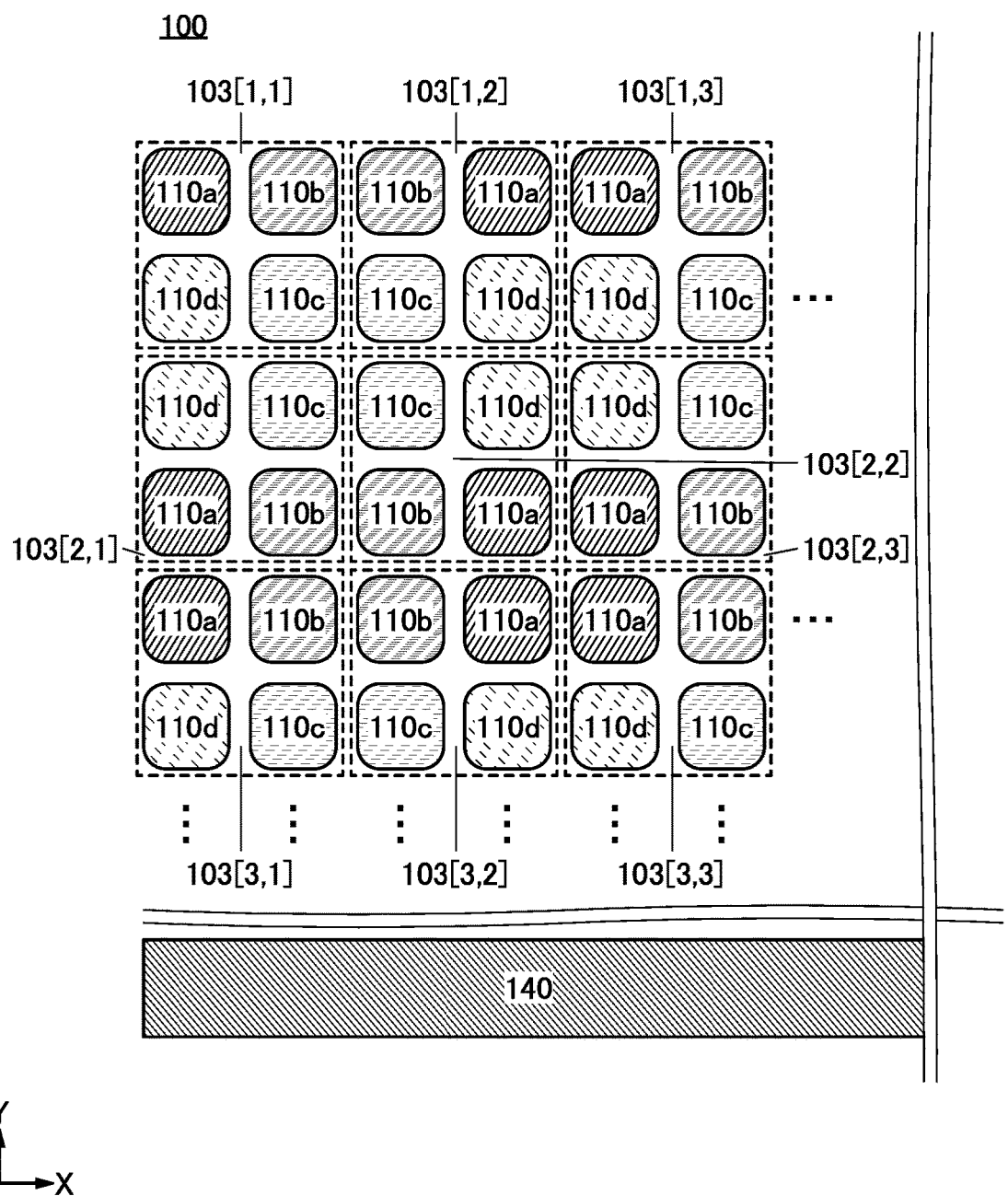
FIG. 13 is a top view illustrating an example of a display apparatus.

FIG. 13 illustrates a modification example of the display apparatus 100 illustrated in FIG. 11, where the pixel 103 includes a subpixel 110*d* besides the subpixels 110*a*, 110*b*, and 110*c*. The pixel 103 in FIG. 13 has a structure including one subpixel 110*a*, one subpixel 110*b*, one subpixel 110*c*, and one subpixel 110*d*.

The pixel 103 includes four types of subpixels 110*a*, 110*b*, 110*c*, and 110*d*. The subpixels 110*a*, 110*b*, 110*c*, and 110*d* emit light of colors different from each other. The subpixels 110*a*, 110*b*, 110*c*, and 110*d* can be of four colors of R, G, B, and white (W), of three colors of R, G, and B and infrared light (IR), or the like.

As illustrated in FIG. 13, for example, the subpixels 110 in the second row and the second column, in the second row and the third column, in the third row and the second column, and in the third row and the third column are each the subpixel 110c. For example, the subpixels 110 in the second row and the fourth column, in the second row and the fifth column, in the third row and the fourth column, and in the third row and the fifth column are each the subpixel 110d. For example, the subpixels 110 in the fourth row and the second column, in the fourth row and the third column, in the fifth row and the second column, and in the fifth row and the third column are each the subpixel 110b. For example, the subpixels 110 in the fourth row and the fourth column, in the fourth row and the fifth column, in the fifth row and the fourth column, and in the fifth row and the fifth column are each the subpixel 110a. Thus, arrangements of the subpixels 110a, the subpixels 110b, the subpixels 110c, and the subpixels 110d are each in two rows and two columns which are adjacent. Furthermore, the following arrangements may be made: arrangement of the subpixels 110a in three or more rows which are continuously lined up or in three or more columns which are continuously lined up; arrangement of the subpixels 110b in three or more rows which are continuously lined up or in three or more columns which are continuously lined up; arrangement of the subpixels 110c in three or more rows which are continuously lined up or in three or more columns which are continuously lined up; and arrangement of the subpixels 110d in three or more rows which are continuously lined up or in three or more columns which are continuously lined up.

As described above, in the method for manufacturing a display apparatus of one embodiment of the present invention, an island-shaped EL layer is formed by processing an EL layer formed on the entire surface, not by using a metal mask having a fine pattern. Thus, the EL layer can be made smaller than that formed with use of a metal mask. Accordingly, a high-resolution display apparatus or a display apparatus with a high aperture ratio, which has been difficult to be formed so far, can be obtained.

Each subpixel includes an island-shaped EL layer, which can inhibit generation of leakage current between the subpixels. Accordingly, degradation of the display quality of the display apparatus can be inhibited. In addition, both the higher definition and higher display quality of the display apparatus can be achieved.

This embodiment can be combined with any of the other embodiments as appropriate. In this specification, in the case where a plurality of structure examples are shown in one embodiment, the structure examples can be combined as appropriate.

Embodiment 2

In this embodiment, a display apparatus of one embodiment of the present invention will be described with reference to FIG. 14, FIGS. 15A and 15B, FIG. 16, and FIGS. 17A to 17D.

The display apparatus in this embodiment can be a high-definition display apparatus or a large-sized display apparatus. Accordingly, the display apparatus in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Apparatus 100A]

Figure 14:
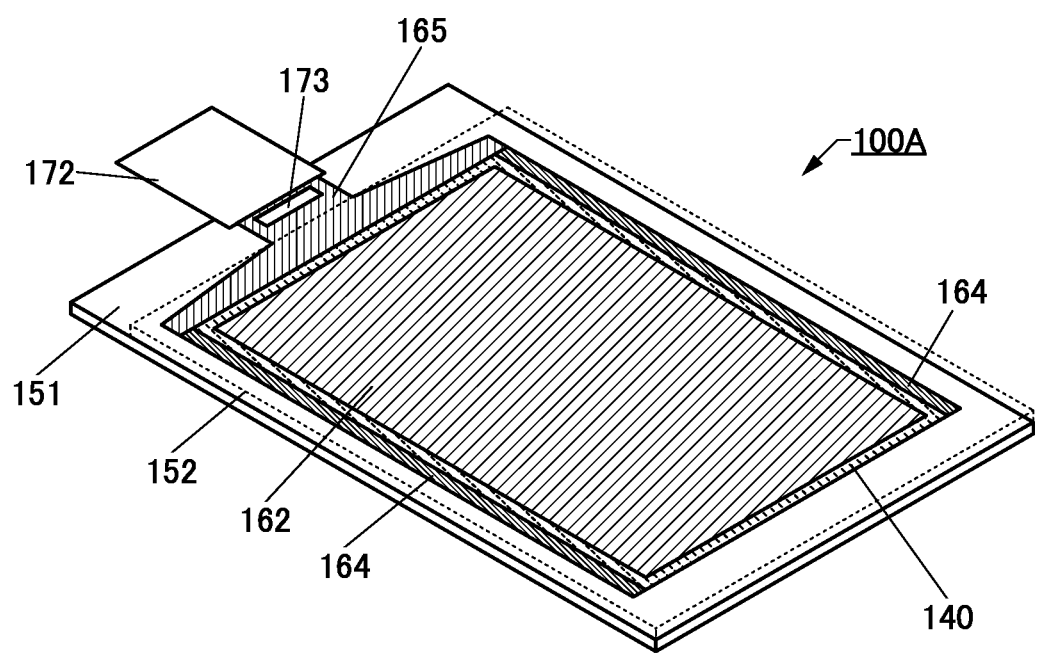
FIG. 14 is a perspective view illustrating an example of a display apparatus.

FIG. 14 is a perspective view of a display apparatus 100A, and FIG. 15A is a cross-sectional view of the display apparatus 100A.

In the display apparatus 100A, a substrate 152 and a substrate 151 are attached to each other. In FIG. 14, the substrate 152 is denoted by a dashed line.

The display apparatus 100A includes a display portion 162, the connection portion 140, a circuit 164, a wiring 165, and the like. FIG. 14 illustrates an example in which an IC 173 and an FPC 172 are implemented onto the display apparatus 100A. Thus, the structure illustrated in FIG. 14 can be regarded as a display module including the display apparatus 100A, the IC (integrated circuit), and the FPC.

The connection portion 140 is provided outside the display portion 162. The connection portion 140 can be provided along one or more sides of the display portion 162. The number of the connection portions 140 may be one or more. FIG. 14 illustrates an example in which the connection portion 140 is provided to surround the four sides of the display portion. The common electrode of the light-emitting device is electrically connected to a conductive layer in the connection portion 140, and thus a potential can be supplied to the common electrode.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 14 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 15A illustrates an example of cross sections of part of a region including the FPC 172, part of the circuit 164, part of the display portion 162, part of the connection portion 140, and part of a region including an end portion of the display apparatus 100A.

The display apparatus 100A illustrated in FIG. 15A includes a transistor 201, a transistor 205, the light-emitting device 130, the coloring layer 132R transmitting red light, the coloring layer 132G transmitting green light, and the like between the substrate 151 and the substrate 152. The light-emitting device 130 emits white light. Light emitted by the light-emitting device 130 overlapping with the coloring layer 132R is extracted as red light to the outside of the display apparatus 100A through the coloring layer 132R. Similarly, light emitted by the light-emitting device 130 overlapping with the coloring layer 132G is extracted as green light to the outside of the display apparatus 100A through the coloring layer 132G.

For the display apparatus 100A, the pixel layout shown in Embodiment 1 can be employed. Thus, the display portion 162 includes a portion where a subpixels emitting light of the same color are provided to be adjacent to each other. FIG. 15A illustrates a portion where two subpixels emitting red light are adjacent to each other.

The two subpixels share one coloring layer 132R. The light-emitting devices 130 in the two subpixels includes the separate EL layers 113. The light-emitting devices in the two subpixels can be driven independently of each other.

The light-emitting devices in the subpixels emitting light of different colors can have the same structure in which white light can be emitted, for example. Specifically, the EL layers 113 included in the light-emitting devices can have the same structure. Meanwhile, the EL layers 113 in the light-emitting devices are separated from each other, which can inhibit generation of leakage current between the light-emitting devices. Thus, the display quality of the display apparatus can be improved.

Other than a difference in the structure of pixel electrode, the light-emitting device 130 has a structure similar to the stacked structure illustrated in FIG. 2A. Embodiment 1 can be referred to for the details of the light-emitting devices.

The light-emitting device 130 includes a conductive layer 126 and a conductive layer 129 over the conductive layer 126. One or both of the conductive layer 126 and the conductive layer 129 can be referred to as a pixel electrode.

The conductive layer 126 is connected to a conductive layer 222b included in the transistor 205 through an opening provided in an insulating layer 214. In the display apparatus 100A, end portions of the conductive layer 126 and the conductive layer 129 are aligned or substantially aligned with each other; however, one embodiment of the present invention is not limited thereto. For example, the conductive layer 129 may be provided so as to cover an end portion of the conductive layer 126. The conductive layer 126 and the conductive layer 129 each preferably include a conductive layer functioning as a reflective electrode. The one or both of the conductive layer 126 and the conductive layer 129 may include a conductive layer functioning as a transparent electrode.

The conductive layer 126 is formed to cover the opening provided in the insulating layer 214. A layer 128 is embedded in a depression portion of the conductive layer 126.

The layer 128 has a function of planarizing the depression portions of the conductive layer 126. The conductive layer 129 electrically connected to the conductive layer 126 is provided over the conductive layer 126 and the layer 128. Thus, a region overlapping with the depression portion of the conductive layer 126 can also be used as the light-emitting region, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer including an organic material can be favorably used as the layer 128. For example, an acrylic resin, a polyimide resin, an epoxy resin, a polyamide resin, a polyimide-amide resin, a siloxane resin, a benzocyclobutene-based resin, a phenol resin, and precursors of these resins can be used for the layer 128. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching, wet etching, or the like on the surfaces of the conductive layer 126. When the layer 128 is formed using a negative photosensitive resin, the layer 128 can sometimes be formed using the same photomask (light-exposure mask) as the photomask used for forming the opening in the insulating layer 214.

The top surface of the conductive layer 129 is covered with the EL layer 113. Accordingly, a region provided with the conductive layer 129 can be entirely used as the light-emitting region of the light-emitting device 130, increasing the aperture ratio of the pixels. Note that the EL layer 113 may cover the side surface of the conductive layer 129. The EL layer 113 may cover only part of the top surface of the conductive layer 129. In other words, part of the top surface of the conductive layer 129 is not necessarily covered with the EL layer 113.

The side surface of the EL layer 113 is covered with the insulating layer 125 and overlaps with the insulating layer 127 with the insulating layer 125 provided therebetween. The common layer 114 is provided over the EL layer 113, the insulating layer 125, and the insulating layer 127, and the common electrode 115 is provided over the common layer 114. The common layer 114 and the common electrode 115 are each one continuous film shared by a plurality of light-emitting devices.

The protective layer 131 is provided over the light-emitting device 130. Providing the protective layer 131 that covers the light-emitting device can inhibit entry of impurities such as water into the light-emitting device, thereby increasing the reliability of the light-emitting devices.

The protective layer 131 and the substrate 152 are bonded to each other with an adhesive layer 142. A solid sealing structure, a hollow sealing structure, or the like can be employed to seal the light-emitting device. In FIG. 15A, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In this case, the adhesive layer 142 may be provided not to overlap with the light-emitting device. Alternatively, the space may be filled with a resin other than the frame-like adhesive layer 142.

The conductive layer 123 is provided over the insulating layer 214 in the connection portion 140. An example is illustrated in which the conductive layer 123 has a stacked-layer structure of a conductive film obtained by processing the same conductive film as the conductive layer 126 and a conductive film obtained by processing the same conductive film as the conductive layer 129. The side surface of the conductive layer 123 is covered with the insulating layer 125 and overlaps with the insulating layer 127 with the insulating layer 125 provided therebetween. The common layer 114 is provided over the conductive layer 123, and the common electrode 115 is provided over the common layer 114. The conductive layer 123 and the common electrode 115 are electrically connected to each other through common layer 114. Note that the common layer 114 is not necessarily formed in the connection portion 140. In this case, the conductive layer 123 and the common electrode 115 are directly and electrically connected to each other.

The display apparatus 100A has a top-emission structure. Light emitted by the light-emitting device is emitted toward the substrate 152. For the substrate 152, a material having a high visible-light-transmitting property is preferably used.

The pixel electrode contains a material that reflects visible light, and the counter electrode (the common electrode 115) contains a material that transmits visible light.

A stacked-layer structure including the substrate 151 and the components thereover up to the insulating layer 214 corresponds to the layer 101 including a transistor in Embodiment 1.

The transistor 201 and the transistor 205 are formed over the substrate 151. These transistors can be fabricated using the same materials in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating layer and an inorganic insulating film. The outermost layer of the insulating layer 214 preferably functions as an etching protective film. Thus, the formation of a depression portion in the insulating layer 214 can be inhibited in processing the conductive layer 126, the conductive layer 129, or the like. Alternatively, a depression portion may be formed in the insulating layer 214 in processing the conductive layer 126, the conductive layer 129, or the like.

Each of the transistors 201 and 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, an inverted staggered transistor, or the like can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment.

As the oxide semiconductor having crystallinity, a c-axis aligned crystalline oxide semiconductor (CAAC-OS), a nanocrystalline oxide semiconductor (nc-OS), and the like are given.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in a semiconductor layer (such a transistor is referred to as an LTPS transistor below) can be used. The LTPS transistor has high field-effect mobility and excellent frequency characteristics.

With use of the Si transistor such as the LTPS transistor, a circuit required to drive at a high frequency (e.g., a source driver circuit) can be formed on the same substrate as the display portion. This allows simplification of an external circuit mounted on the display apparatus and a reduction in costs of parts and mounting costs.

The OS transistor has much higher field-effect mobility than a transistor containing amorphous silicon. In addition, the OS transistor has an extremely low leakage current between a source and a drain in an off state (the leakage current is also referred to as an off-state current below), and charge accumulated in a capacitor that is connected in series to the transistor can be held for a long period. Furthermore, the power consumption of the display apparatus can be reduced with the OS transistor.

The off-state current per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). That is, the off-state current of the OS transistor is lower than the off-state current of the Si transistor by approximately 10 digits.

To increase the emission luminance of the light-emitting device included in a pixel circuit, it is necessary to increase the amount of current flowing through the light-emitting device. For this, it is necessary to increase the source-drain voltage of a driving transistor included in the pixel circuit. Since the OS transistor has a higher withstand voltage between the source and the drain than a Si transistor, a high voltage can be applied between the source and the drain of the OS transistor. Thus, with use of an OS transistor as a driving transistor included in the pixel circuit, the amount of current flowing through the light-emitting device can be increased, resulting in an increase in emission luminance of the light-emitting device.

Assuming that the transistor operates in a saturation region, a change in the amount of current between the source and the drain, with respect to a fluctuation in the gate-source voltage, in the OS transistor can be smaller than that in the Si transistor. Thus, with use of an OS transistor as a driving transistor included in the pixel circuit, the amount of current flowing between the source and the drain can be accurately specified based on a fluctuation of the gate-source voltage, which enables the amount of current flowing through the light-emitting device to be controlled. Accordingly, the gray level in the pixel circuit can be increased.

As saturation characteristics of current flowing when the transistor operates in a saturation region, the OS transistor can make current (saturation current) flow more stably than the Si transistor even when the source-drain voltage gradually increases. Thus, with use of an OS transistor as a driving transistor, current can be made flow stably through the light-emitting device, for example, even when a variation in current-voltage characteristics of the EL device occurs. In other words, the amount of current between the source and the drain is less changed in the OS transistor operating in the saturation region even when the source-drain voltage is made higher. As a result, the emission luminance of the light-emitting device can be stabilized.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

The metal oxide used in the semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5: 1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the circuit 164 and the transistors included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion 162 may be OS transistors and the others may be Si transistors.

For example, when both the LTPS transistor and the OS transistor are used in the display portion 162, the display apparatus can have low power consumption and high drive capability. Note that a structure in which the LTPS transistor and the OS transistor are combined is referred to as LTPO in some cases. As a favorable example, it is preferable that the OS transistor be used as a transistor functioning as a switch for controlling conduction or non-conduction between wirings and the LTPS transistor be used as a transistor for controlling current.

For example, one transistor included in the display portion 162 may function as a transistor for controlling current flowing through the light-emitting device and be referred to as a driving transistor. One of a source and a drain of the driving transistor is electrically connected to the pixel electrode of the light-emitting device. The LTPS transistor is preferably used as the driving transistor. Thus, current flowing through the light-emitting device in the pixel circuit can be increased.

In contrast, another transistor included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). The OS transistor is preferably used as the selection transistor. Thus, the gray level of the pixel can be maintained even when the frame frequency is extremely reduced (e.g., 1 fps or lower), whereby power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having a metal maskless (MML) structure. This structure can extremely reduce the leakage current that might flow through a transistor, and the leakage current that might flow between adjacent light-emitting devices (also referred to as side leakage current or the like). With the structure, a viewer can observe any one or more of the image clearness, the image sharpness, a high chroma, and a high contrast ratio in an image displayed on the display apparatus. Note that when the leakage current that might flow through a transistor and the side leakage current between light-emitting devices are extremely low, light leakage or the like that might occur in black display can be reduced as much as possible.

FIG. 15B and FIG. 15C illustrate other structure examples of the transistor.

Transistors 209 and 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between at least the conductive layer 223 and the channel formation region 231i. Furthermore, an insulating layer 218 covering the transistor may be provided.

FIG. 15B illustrates an example of the transistor 209 in which the insulating layer 225 covers the top surface and the side surface of the semiconductor layer 231. The conductive layer 222a and the conductive layer 222b are connected to the corresponding low-resistance regions 231n through openings provided in the insulating layer 225 and the insulating layer 215. One of the conductive layers 222a and 222b functions as a source, and the other functions as a drain.

In the transistor 210 illustrated in FIG. 15C, the insulating layer 225 overlaps with the channel formation region 231i of the semiconductor layer 231 and does not overlap with the low-resistance regions 231n. The structure illustrated in FIG. 15C is obtained by processing the insulating layer 225 with the conductive layer 223 as a mask, for example. In FIG. 15C, the insulating layer 215 is provided to cover the insulating layer 225 and the conductive layer 223, and the conductive layer 222a and the conductive layer 222b are connected to the corresponding low-resistance regions 231n through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layer 126 and a conductive film obtained by processing the same conductive film as the conductive layer 129. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. In addition, the coloring layers 132R and 132G may be provided on the surface of the substrate 152 that faces the substrate 151. In FIG. 15A, when the substrate 152 is considered as the bottom, the coloring layers 132R and 132G are provided to cover part of the light-blocking layer 117.

The substrates 151 and 152 can be each formed using any of the materials given in Embodiment 1 as examples of the material that can be used for the substrate 120. In addition, a variety of members that can be placed outside the substrate 120 can also be used at the outside of the substrate 151 or the substrate 152.

A material that can be used for the resin layer 122 described in Embodiment 1 can be used for the adhesive layer 142.

As the connection layer 242, an anisotropic conductive film (ACF), an anisotropic conductive paste (ACP), or the like can be used.

As materials for a gate, a source, and a drain of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. These materials can also be used for conductive layers such as wirings and electrodes included in the display apparatus, and conductive layers (e.g., a conductive layer functioning as the pixel electrode or the common electrode) included in the light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

[Display Apparatus 100B]

Figure 16:
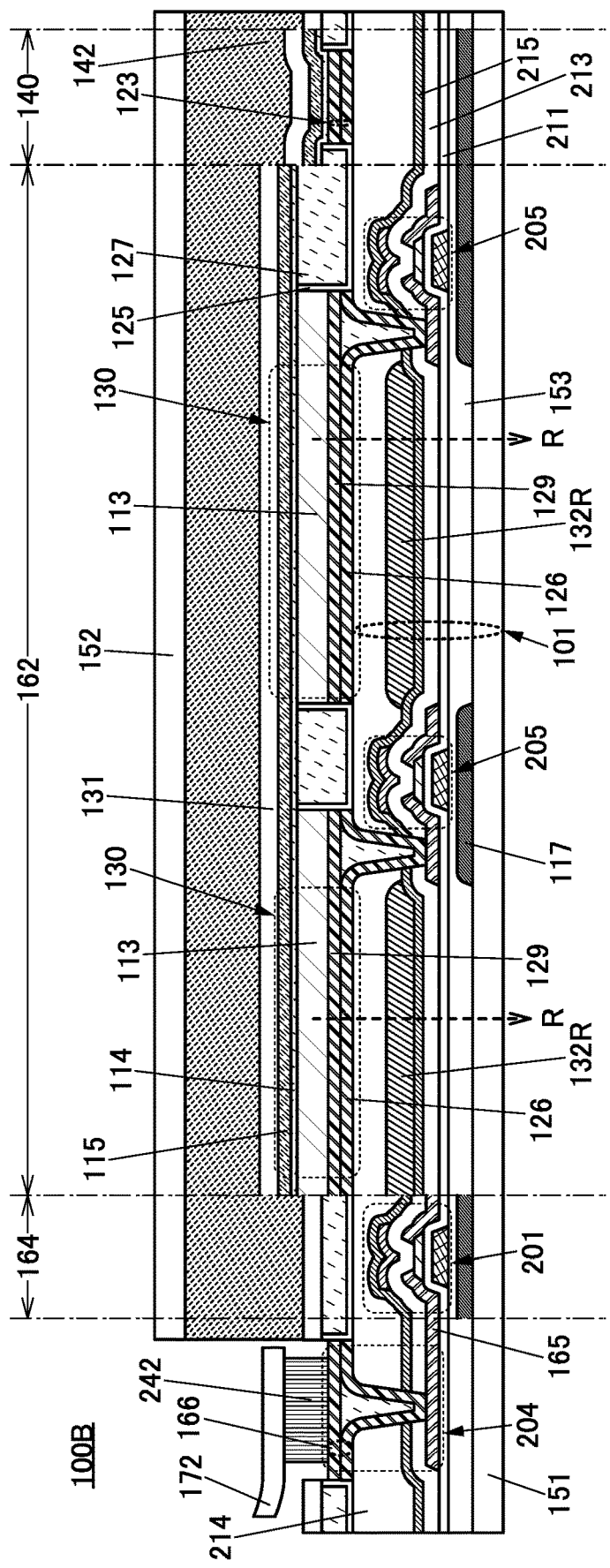
FIG. 16 is a cross-sectional view illustrating an example of a display apparatus.

A display apparatus 100B illustrated in FIG. 16 differs from the display apparatus 100A mainly in having a bottom-emission structure. Note that the description of portions similar to those of the display apparatus 100A is omitted.

For the display apparatus 100B, the pixel layout shown in Embodiment 1 can be used. Accordingly, subpixels that emit light of the same color are provided to be adjacent to each other. FIG. 16 illustrates a portion where two subpixels emitting red light are adjacent to each other.

Light emitted by the light-emitting device is emitted toward the substrate 151. For the substrate 151, a material having a high visible-light-transmitting property is preferably used. In contrast, there is no limitation on the light-transmitting property of a material used for the substrate 152.

In the display apparatus 100B, the conductive layer 126 and the conductive layer 129 each include a material transmitting visible light, and the common electrode 115 includes a material reflecting visible light.

The light-blocking layer 117 is preferably formed between the substrate 151 and the transistor 201 and between the substrate 151 and the transistor 205. FIG. 16 illustrates an example in which the light-blocking layer 117 is provided over the substrate 151, an insulating layer 153 is provided over the light-blocking layer 117, and the transistors 201 and 205 and the like are provided over the insulating layer 153.

Moreover, in the display apparatus 100B, the coloring layer 132R transmitting red light is provided between the insulating layer 215 and the insulating layer 214. The end portion of the coloring layer 132R preferably overlaps with the light-blocking layer 117. Light emitted by the light-emitting device 130 is extracted as red light to the outside of the display apparatus 100B through the coloring layer 132R.

FIGS. 17A to 17D illustrate cross-sectional structures of a region 138 including the conductive layer 126, the layer 128, and the vicinity thereof in the display apparatus 100A and the display apparatus 100B.

Figure 17A:
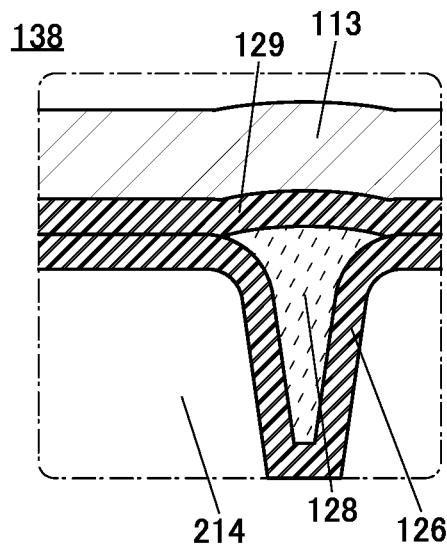
FIGS. 17A to 17D are cross-sectional views each illustrating an example of a display apparatus.

FIG. 15A and FIG. 16 each illustrate an example in which the top surface of the layer 128 and the top surface of the conductive layer 126 are substantially at the same level; however, the present invention is not limited to such an example. For example, as illustrated in FIG. 17A, the top surface of the layer 128 may be at a higher level than that of the conductive layer 126. In this case, the top surface of the layer 128 has a convex shape that is gently curved outward toward the center.

Figure 17B:
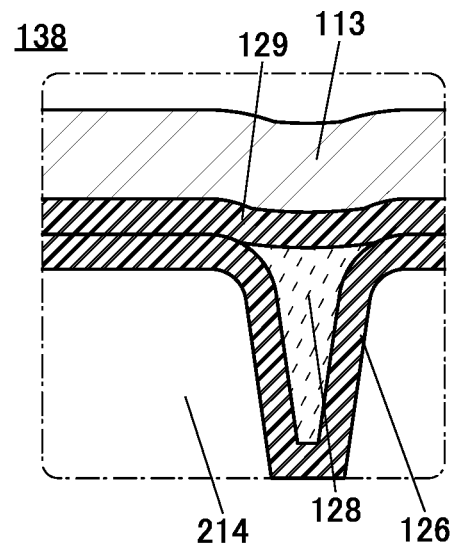

As illustrated in FIG. 17B, the top surface of the layer 128 may be at a lower level than that of the conductive layer 126. In this case, the top surface of the layer 128 has a concave shape that is gently recessed toward the center.

Figure 17C:
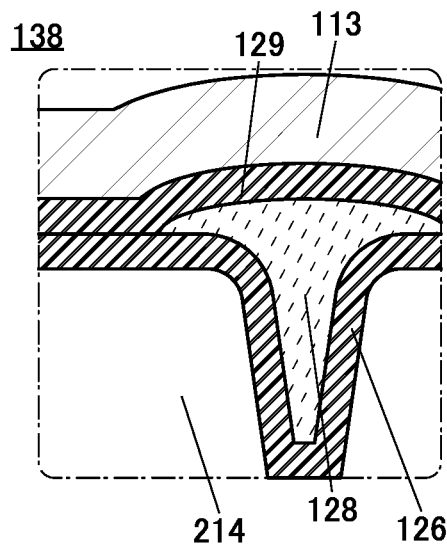

When the top surface of the layer 128 is at a higher level than that of the conductive layer 126 as illustrated in FIG. 17C, the upper portion of the layer 128 is formed to extend beyond a recessed portion in the conductive layer 126 in some cases. In this case, part of the layer 128 may be formed to cover part of the conductive layer 126 which is substantially flat.

Figure 17D:
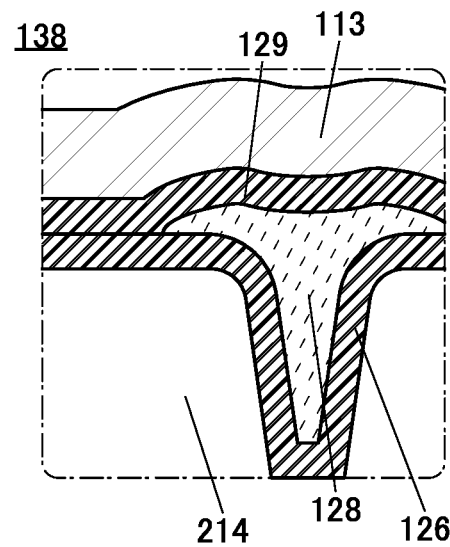

As illustrated in FIG. 17D, a part of the top surface of layer 128 has another depression portion in the structure of FIG. 17C, in some cases. The depression has a shape that is gently recessed toward the center.

This embodiment can be combined with any of the other embodiments as appropriate.

Embodiment 3

In this embodiment, a display apparatus of one embodiment of the present invention will be described with reference to FIGS. 18A and 18B, FIGS. 19A to 19C, FIG. 20, FIG. 21, FIG. 22, and FIG. 23.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 18A:
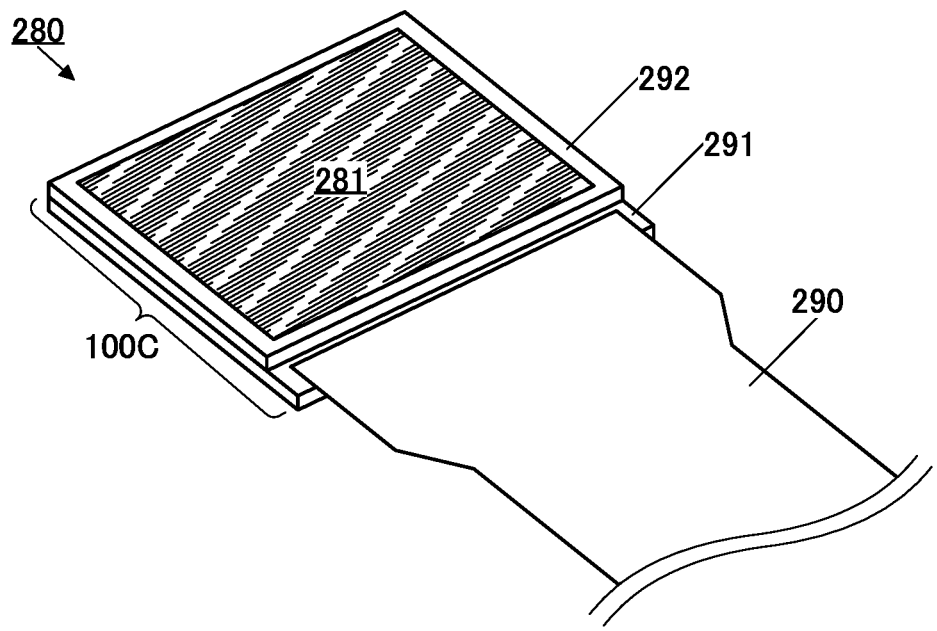
FIGS. 18A and 18B are perspective views illustrating an example of a display module.

FIG. 18A is a perspective view of a display module 280. The display module 280 includes a display apparatus 100C and an FPC 290. Note that the display apparatus included in the display module 280 is not limited to the display apparatus 100C and may be any of display apparatuses 100D to 100G described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 18B:
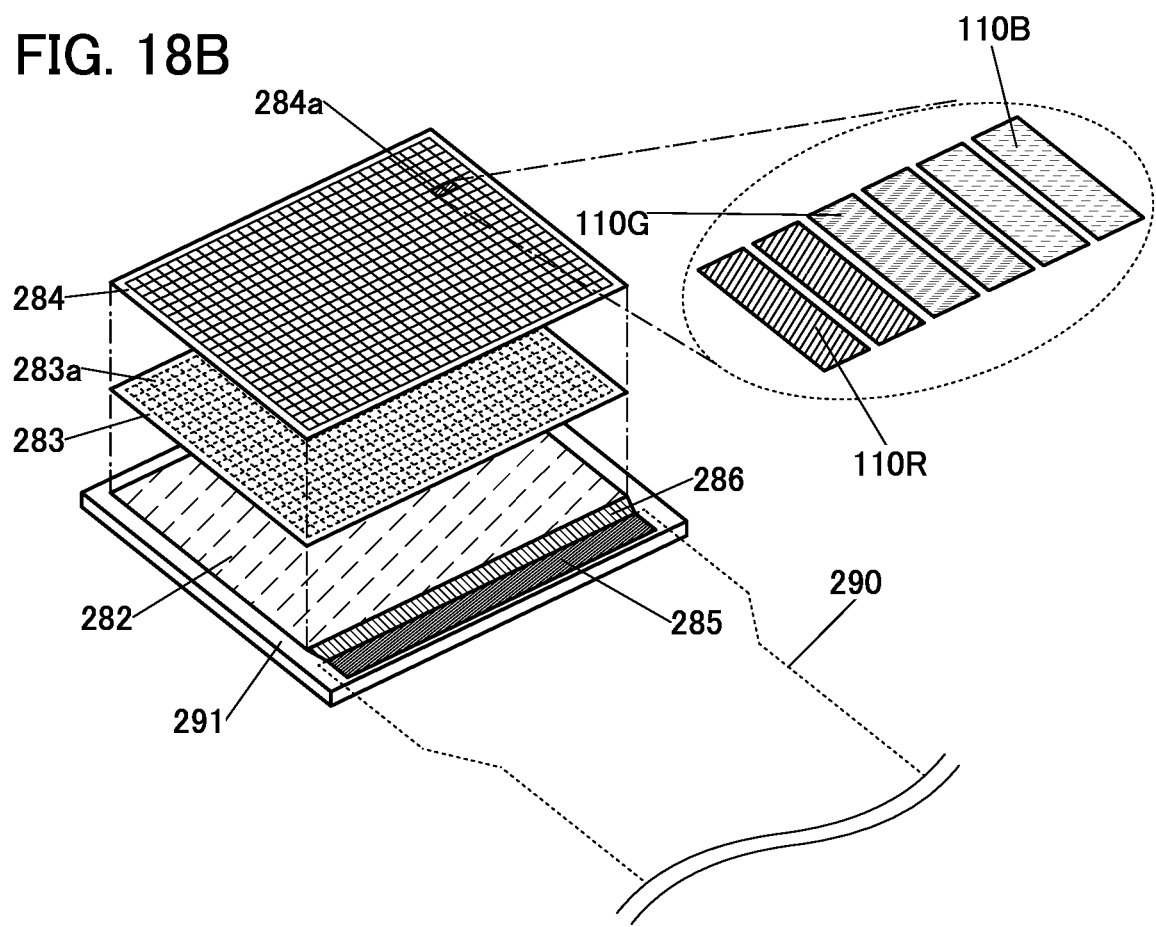

FIG. 18B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. Six subpixels are illustrated on the right side of FIG. 18B as an enlarged view of two pixels 284a. Two subpixels 110R emitting red light, two subpixels 110G emitting green light, and two subpixels 110B emitting blue light are lined up in this order. Embodiment 1 can be referred to as a pixel layout applicable to the pixel portion 284.

The pixel circuit portion 283 includes a plurality of pixel circuits 283a arranged periodically.

One pixel circuit 283a is a circuit that controls light emission of three light-emitting devices included in one pixel 284a. One pixel circuit 283a may be provided with three circuits each of which controls light emission of one light-emitting device. For example, the pixel circuit 283a can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display apparatus is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 100C]

Figure 19A:
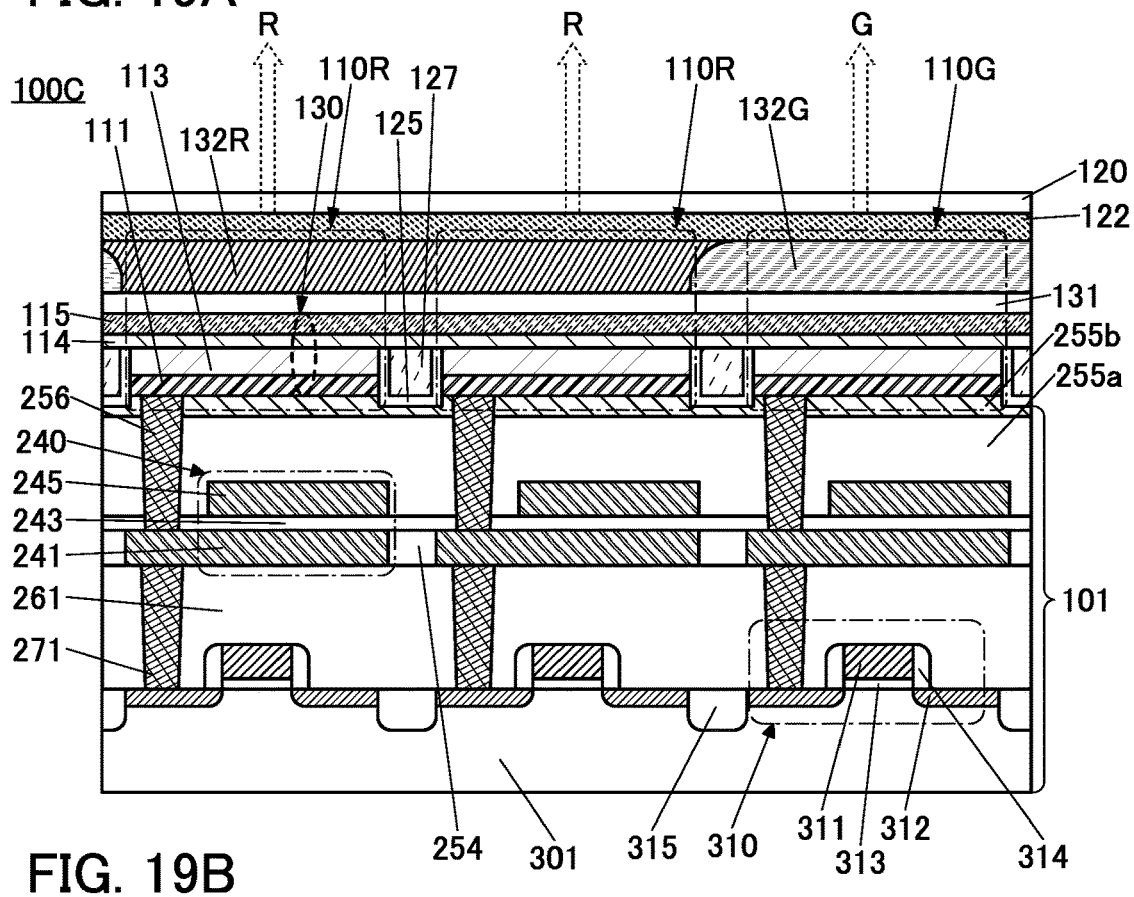
FIGS. 19A to 19C are cross-sectional views each illustrating an example of a display apparatus.

The display apparatus 100C illustrated in FIG. 19A includes a substrate 301, the light-emitting device 130, the coloring layer 132R, the coloring layer 132G, a capacitor 240, a transistor 310, and the like. The subpixel 110R includes the light-emitting device 130 and the coloring layer 132R, and the subpixel 110G includes the light-emitting device 130 and the coloring layer 132G. The light-emitting device 130 emits white light. The subpixel 110R has such a structure that light emitted by the light-emitting device 130 is extracted as red light to the outside of the display apparatus 100C through the coloring layer 132R. Similarly, the subpixel 110G has a structure that light emitted by the light-emitting device 130 is extracted as green light to the outside of the display apparatus 100C through the coloring layer 132G.

The pixel layout shown in Embodiment 1 can be employed for the display apparatus 100C. Thus, the pixel portion 284 includes a portion where subpixels emitting light of the same color are provided to be adjacent to each other. FIG. 19A illustrates a portion where two subpixels emitting red light are adjacent to each other.

The two subpixels 110R shares one coloring layer 132R. The EL layers 113 in the light-emitting devices 130 are separated between the two subpixels 110R. The light-emitting devices 130 in the two subpixels can be driven independently of each other.

The same structure can be employed for the light-emitting devices included in subpixels emitting different colors, and for example, a structure emitting white light can be employed. Specifically, the EL layers 113 included in respective light-emitting devices can have the same structure. In contrast, the EL layers 113 included in respective light-emitting device are separated from each other, which can inhibit generation of leakage current between light-emitting devices. Thus, the display quality of the display apparatus can be improved.

The substrate 301 corresponds to the substrate 291 illustrated in FIGS. 18A and 18B. A stacked-layer structure including the substrate 301 and the components thereover up to an insulating layer 255b corresponds to the layer 101 including a transistor in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255a is provided to cover the capacitor 240, and an insulating layer 255b is provided over the insulating layer 255a.

As each of the insulating layers 255a and 255b, a variety of inorganic insulating films such as an oxide insulating film, a nitride insulating film, an oxynitride insulating film, and a nitride oxide insulating film can be suitably used. As the insulating layer 255a, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferred that a silicon oxide film be used as the insulating layer 255a and a silicon nitride film be used as the insulating layer 255b. The insulating layer 255b preferably has a function of an etching protective film. Alternatively, a nitride insulating film or a nitride oxide insulating film may be used as the insulating layer 255a, and an oxide insulating film or an oxynitride insulating film may be used as the insulating layer 255b. Although this embodiment shows an example in which a depression portion is provided in the insulating layer 255b, a depression portion is not necessarily provided in the insulating layer 255b.

The light-emitting device 130 is provided over the insulating layer 255b. In this embodiment, the light-emitting device 130 has a structure similar to that of the stacked-layer structure illustrated in FIG. 2A. The side surface of the pixel electrode 111 and the side surfaces of the EL layer 113 are each covered with the insulating layer 125 and overlap with the insulating layer 127 with the insulating layer 125 provided therebetween. The common layer 114 is provided over the EL layer 113, the insulating layer 125, and the insulating layer 127, and the common electrode 115 is provided over the common layer 114.

The pixel electrode 111 of the light-emitting device is electrically connected to one of the source and the drain of the transistor 310 through a plug 256 embedded in the insulating layers 255a and 255b, the conductive layer 241 embedded in the insulating layer 254, and the plug 271 embedded in the insulating layer 261. The top surface of the insulating layer 255b and the top surface of the plug 256 are level with or substantially level with each other. A variety of conductive materials can be used for the plugs.

The protective layer 131 is provided over the light-emitting device 130. The coloring layers 132R and 132G are provided over the protective layer 131. The substrate 120 is bonded to the coloring layers 132R and 132G with the resin layer 122. Embodiment 1 can be referred to for the details of the light-emitting devices and the components thereover up to the substrate 120. The substrate 120 corresponds to the substrate 292 in FIG. 18A.

The end portion of the top surface of the conductive layer 111 is not covered with an insulating layer. Thus, the distance between adjacent light-emitting devices can be extremely shortened. Accordingly, the display apparatus can have high resolution or high definition.

Figure 19B:
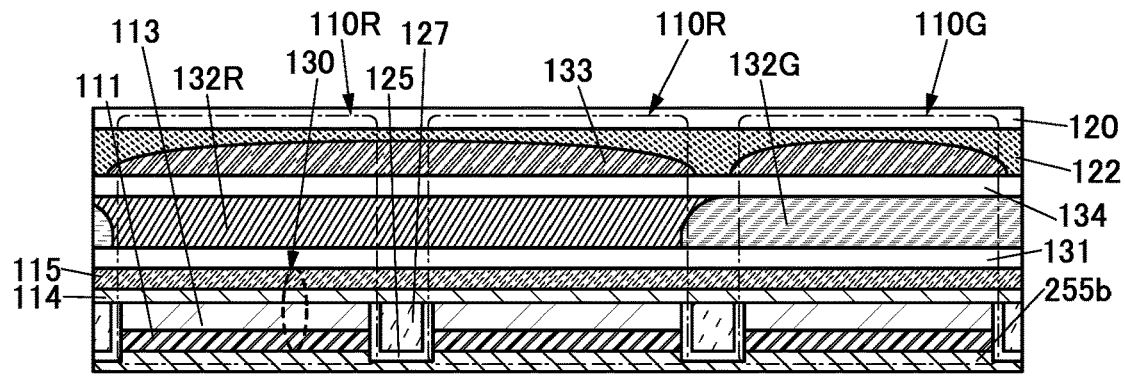
Figure 19C:
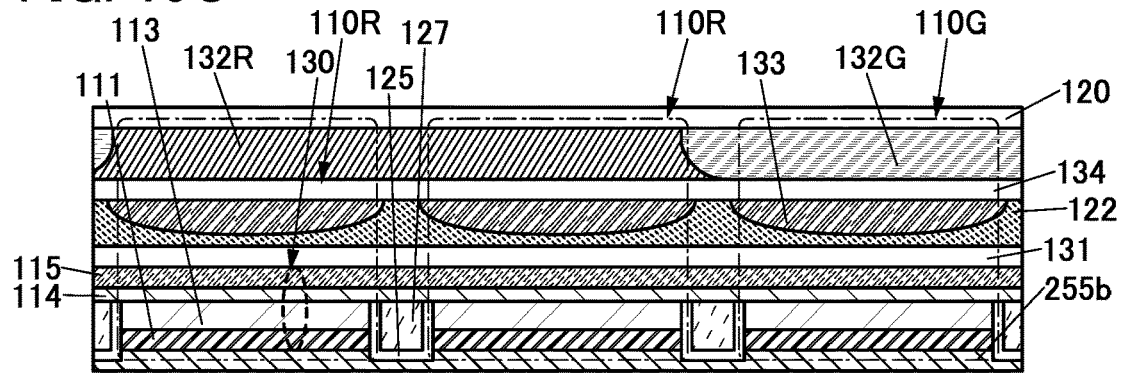

As illustrated in FIGS. 19B and 19C, a lens array 133 may be provided. Using the lens array 133 enables light emission of the light-emitting devices to be collected.

FIG. 19B illustrates an example in which the coloring layers 132R and 132G are provided over the light-emitting devices 130 with the protective layer 131 provided therebetween, an insulating layer 134 is provided over the coloring layers 132R and 132G, and the lens array 133 is provided over the insulating layer 134. The coloring layers 132R and 132G and the lens array 133 are directly formed over the substrate provided with the light-emitting devices 130, whereby the accuracy of positional alignment of the light-emitting device and the coloring layer or the lens array can be enhanced.

For the insulating layer 134, one or both of an inorganic insulating material and an organic insulating material can be used. The insulating layer 134 may have either a single-layer structure or a stacked-layer structure. The insulating layer 134 can be formed using a material that can be used for the protective layer 131, for example. When light emitted by the light-emitting device is extracted through the insulating layer 134, the insulating layer 134 preferably has a high visible-light-transmitting property.

In FIG. 19B, light emitted by the light-emitting device 130 passes through the coloring layer and then passes through the lens array 133, resulting in being extracted to the outside of the display device. It is preferable to shorten the distance between the light-emitting device and the coloring layer because color mixing can be inhibited and the viewing angle characteristics can be improved. Note that such a structure that the lens array 133 is provided over the light-emitting device 130 and the coloring layer is provided over the lens array 133 may be employed.

FIG. 19C illustrates an example in which the substrate 120 provided with the coloring layers 132R and 132G and the lens array 133 is bonded to the protective layer 131 with the resin layer 122. The substrate 120 is provided with the coloring layers 132R and 132G and the lens array 133, whereby the temperature of the heat treatment in forming these components can be increased.

In the example of FIG. 19C, the coloring layers 132R and 132G are provided in contact with the substrate 120, the insulating layer 134 is provided in contact with the coloring layers 132R and 132G, and the lens array 133 is provided in contact with the insulating layer 134.

In FIG. 19C, light emitted by the light-emitting device 130 passes through the lens array 133 and then passes through the coloring layers, resulting in being extracted to the outside of the display apparatus. Note that such a structure that the lens array 133 is provided in contact with the substrate 120, the insulating layer 134 is provided in contact with the lens array 133, and the coloring layers are provided in contact with the insulating layer 134 may be employed. In this case, light emitted by the light-emitting device 130 passes through the coloring layer and then passes through the lens array 133, resulting in being extracted to the outside of the display apparatus.

The lens array 133 may have a convex surface facing the substrate 120 side or a convex surface facing the light-emitting device 130.

The lens array 133 can be formed using at least one of an inorganic material and an organic material. For example, a material containing a resin can be used for the lens. Moreover, a material containing at least one of an oxide and a sulfide can be used for the lens. As the lens array 133, a microlens array can be used. The lens array 133 may be directly formed over the substrate or the light-emitting device. Alternatively, a lens array separately formed may be bonded.

[Display Apparatus 100D]

Figure 20:
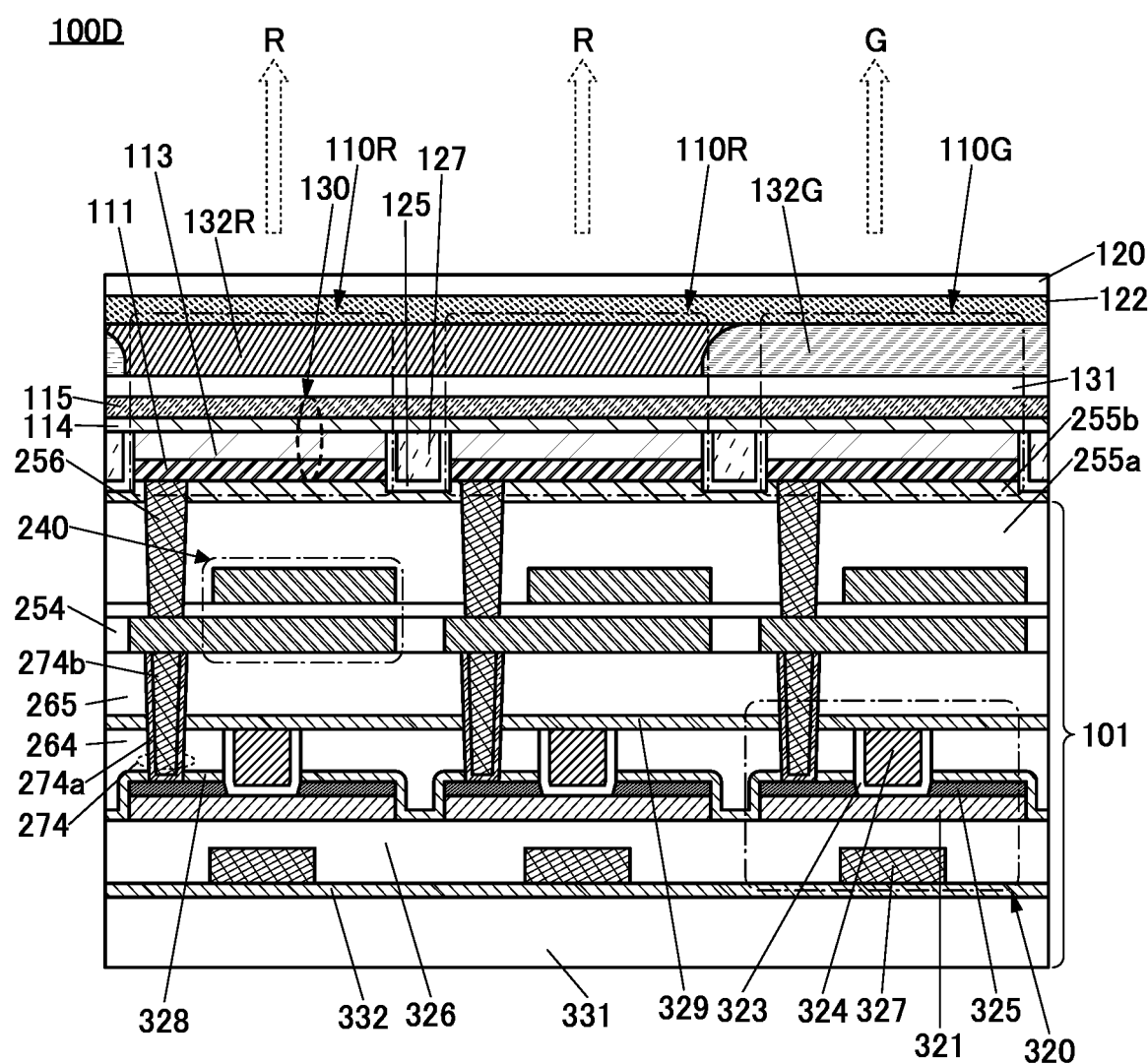
FIG. 20 is a cross-sectional view illustrating an example of a display apparatus.

The display apparatus 100D illustrated in FIG. 20 differs from the display apparatus 100C mainly in a structure of a transistor. Note that in the following description of display apparatuses, the description of portions similar to those of the above-described display apparatuses may be omitted.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIGS. 18A and 18B. A stacked-layer structure including the substrate 331 and the components thereover up to the insulating layer 255b corresponds to the layer 101 including a transistor in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321.

The pair of conductive layers 325 is provided on and in contact with the semiconductor layer 321, and functions as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328.

The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with the side surfaces of the insulating layers 264 and 328, the side surface of the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and insulating layers 329 and 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers the side surface of an opening formed in the insulating layers 265, 329, 264, and 328 and part of the top surface of the conductive layer 325, and a conductive layer 274b in contact with the top surface of the conductive layer 274a. For the conductive layer 274a, a conductive material in which hydrogen and oxygen are less likely to diffuse is preferably used.

The structures of the insulating layer 254 and the components thereover up to the substrate 120 in the display apparatus 100D are similar to those in the display apparatus 100C.

[Display Apparatus 100E]

Figure 21:
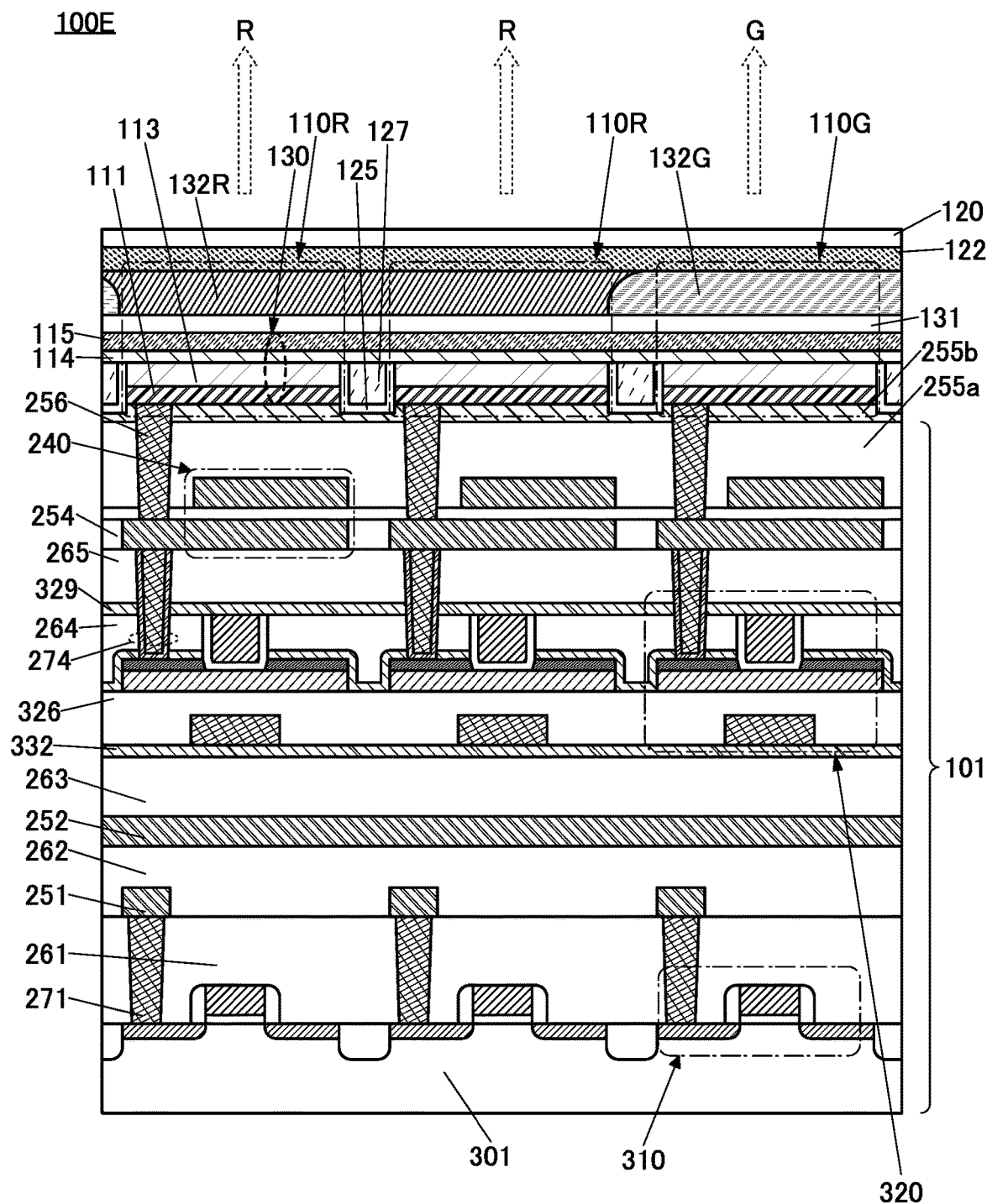
FIG. 21 is a cross-sectional view illustrating an example of a display apparatus.

The display apparatus 100E illustrated in FIG. 21 has a structure in which the transistor 310 whose channel is formed in the substrate 301 and the transistor 320 including a metal oxide in the semiconductor layer where the channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display portion.

[Display Apparatus 100F]

Figure 22:
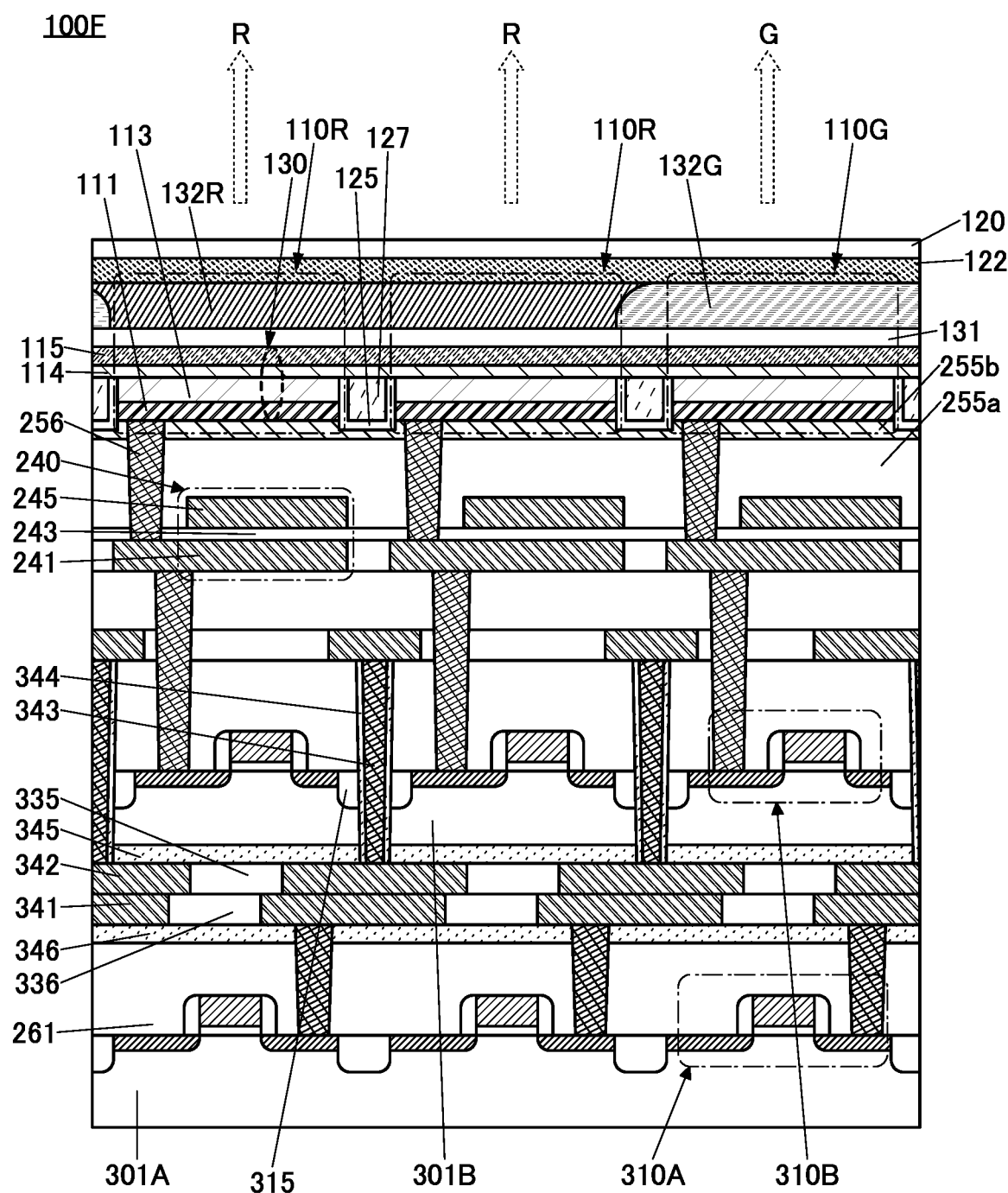
FIG. 22 is a cross-sectional view illustrating an example of a display apparatus.

The display apparatus 100F illustrated in FIG. 22 has a structure where a transistor 310A and a transistor 310B in each of which a channel is formed in a semiconductor substrate are stacked.

In the display apparatus 100F, a substrate 301B provided with the transistor 310B, the capacitor 240, and the light-emitting devices is attached to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 131 can be used.

The substrate 301B is provided with a plug 343 that penetrates the substrate 301B and the insulating layer 345. An insulating layer 344 is preferably provided to cover the side surface of the plug 343. The insulating layer 344 functions as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Apparatus 100G]

Figure 23:
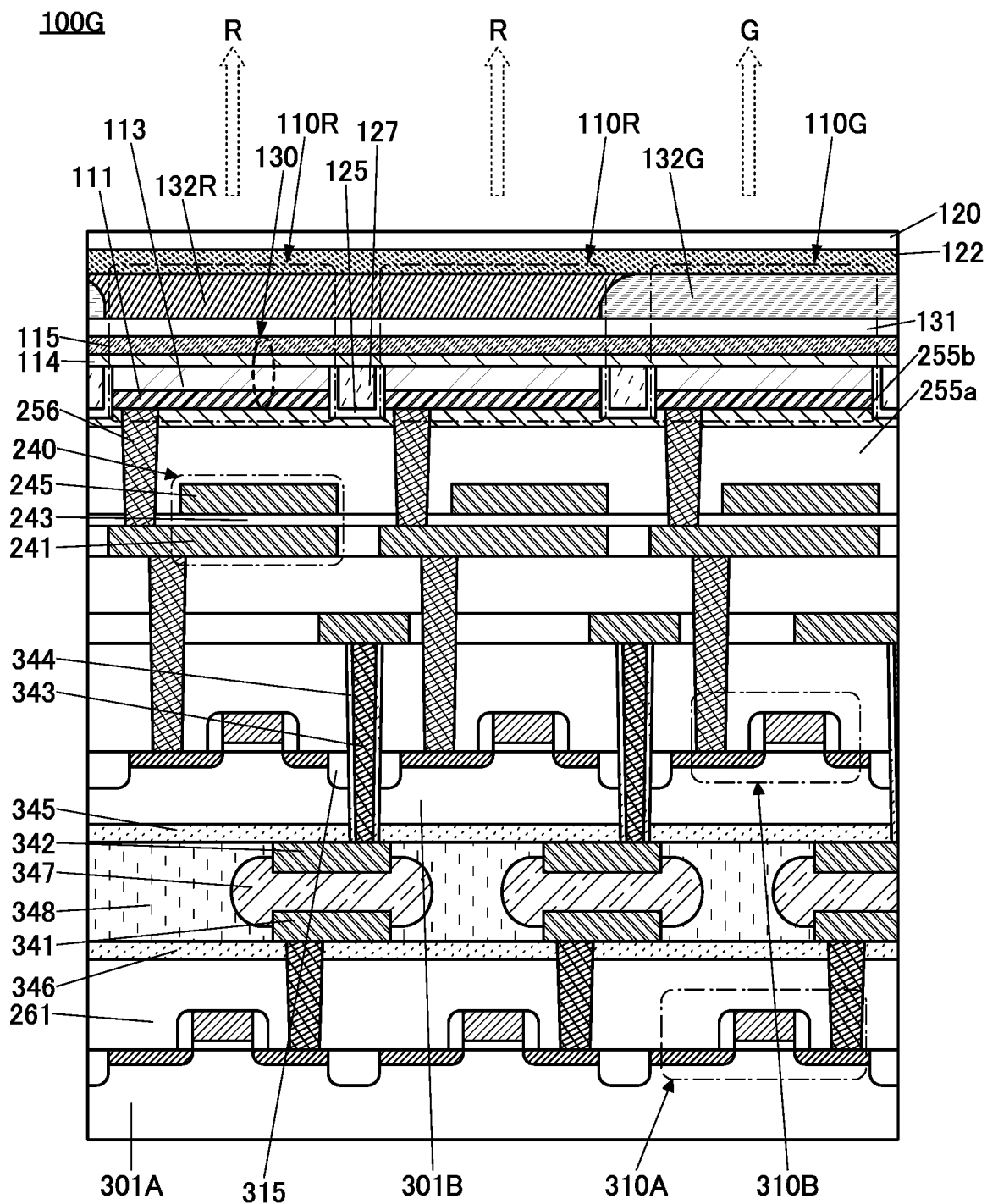
FIG. 23 is a cross-sectional view illustrating an example of a display apparatus.

Although FIG. 22 illustrates an example in which Cu-to-Cu direct bonding is used to bond the conductive layer 341 and the conductive layer 342, the present invention is not limited thereto. As illustrated in FIG. 23, the conductive layer 341 and the conductive layer 342 may be bonded to each other through a bump 347 in the display apparatus 100G.

As illustrated in FIG. 23, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

This embodiment can be combined with any of the other embodiments as appropriate.

Embodiment 4

In this embodiment, a light-emitting device that can be used in the display apparatus of one embodiment of the present invention will be described.

Figure 24A:
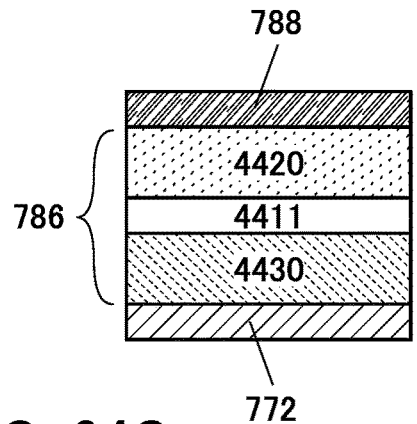
FIGS. 24A to 24F each illustrate a structure example of a light-emitting device.

As illustrated in FIG. 24A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 24A is referred to as a single structure in this specification.

Figure 24B:
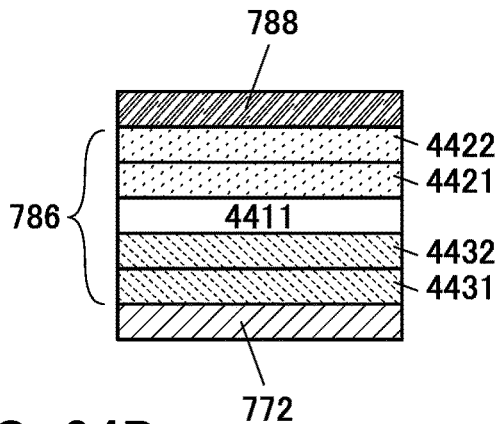

FIG. 24B is a modification example of the EL layer 786 included in the light-emitting device illustrated in FIG. 24A. Specifically, the light-emitting device illustrated in FIG. 24B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. For example, when the lower electrode 772 functions as an anode and the upper electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 functions as a cathode and the upper electrode 788 functions as an anode, the layer 4431 functions as an electron-injection layer, the layer 4432 functions as an electron-transport layer, the layer 4421 functions as a hole-transport layer, and the layer 4422 functions as the hole-injection layer. With such a layered structure, carriers can be efficiently injected to the light-emitting layer 4411, and the efficiency of the recombination of carriers in the light-emitting layer 4411 can be enhanced.

Figure 24C:
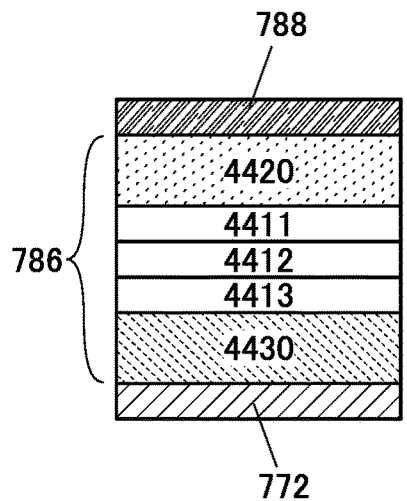
Figure 24D:
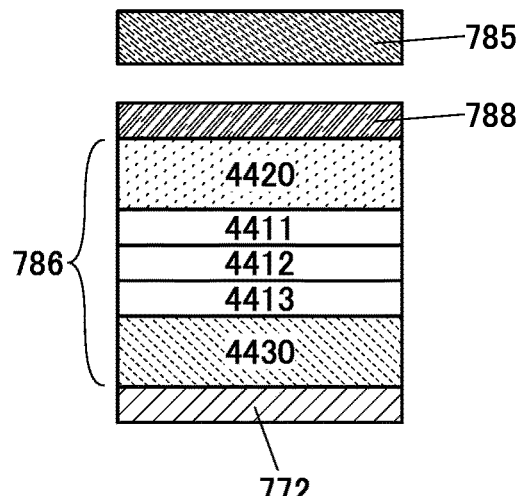

Note that structures in which a plurality of light-emitting layers (light-emitting layers 4411, 4412, and 4413) are provided between the layer 4420 and the layer 4430 as illustrated in FIG. 24C and FIG. 24D are other variations of the single structure.

Figure 24E:
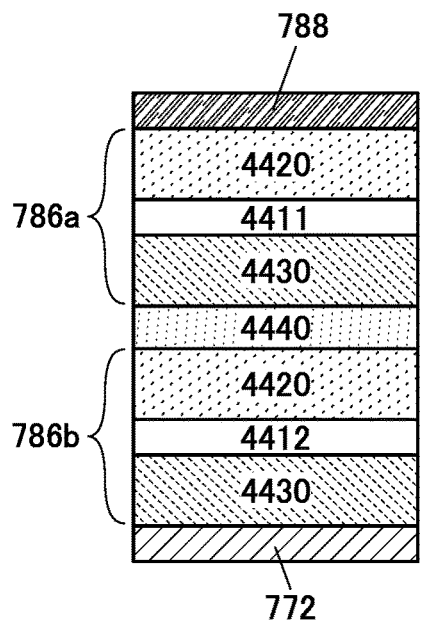
Figure 24F:
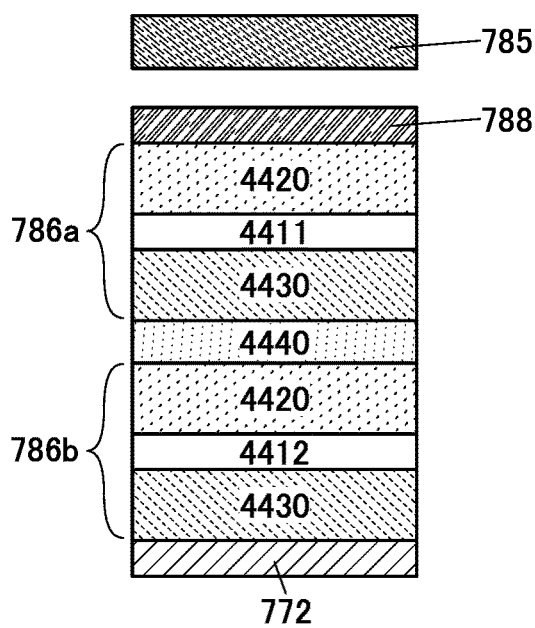

Structures in which a plurality of light-emitting units (EL layers 786a and 786b) are connected in series with a charge-generation layer 4440 therebetween as illustrated in FIG. 24E and FIG. 24F are referred to as a tandem structure in this specification. A tandem structure may be referred to as a stack structure. The tandem structure enables a light-emitting device capable of high luminance light emission.

In FIG. 24C and FIG. 24D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 24D.

Alternatively, light-emitting materials that emit light of different colors may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 24D. When white light passes through a color filter, light of a desired color can be obtained.

In FIG. 24E and FIG. 24F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 24F illustrates an example in which the layer 785 is further provided. One or both of a color conversion layer and a color filter (coloring layer) can be used as the layer 785.

In FIGS. 24C to 24F, the layer 4420 and the layer 4430 may each have a layered structure of two or more layers as in FIG. 24B.

A structure in which light-emitting devices that emit light of different colors (e.g., blue (B), green (G), and red (R)) are separately formed is referred to as a side-by-side (SBS) structure in some cases.

The emission color of the light-emitting device can be changed to red, green, blue, cyan, magenta, yellow, white, or the like depending on the material of the EL layer 786. When the light-emitting device has a microcavity structure, the color purity can be further increased.

In the light-emitting device that emits white light, the light-emitting layer preferably contains two or more kinds of light-emitting substances. In order to obtain white light, light-emitting substances may be selected so that colors of light emitted by the two light-emitting substances are complementary colors, or light-emitting substances may be selected so that colors of light emitted by two or more light-emitting substances are combined to be white. For example, in the case where white light is obtained with use of two light-emitting layers, the emission colors of the two light-emitting layers are complementary, so that the light-emitting device can emit white light as a whole. In the case where three or more light-emitting layers are used to obtain white light emission, a light-emitting device is configured to emit white light as a whole by combining emission colors of the three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

This embodiment can be combined with any of the other embodiments as appropriate.

Embodiment 5

In this embodiment, electronic devices of one embodiment of the present invention will be described with reference to FIGS. 25A to 25F, FIGS. 26A to 26F, FIGS. 27A to 27G, and FIGS. 28A to 28F.

Electronic devices of this embodiment are each provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have a high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display apparatus having one or both of such high definition and high resolution can further increase realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 25A to 25D. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figure 25A:
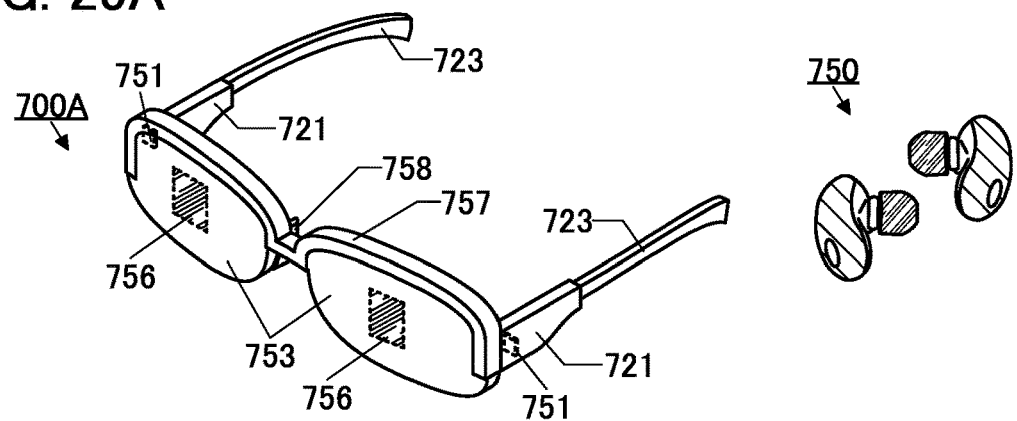
FIGS. 25A to 25D illustrate examples of electronic devices.
Figure 25B:
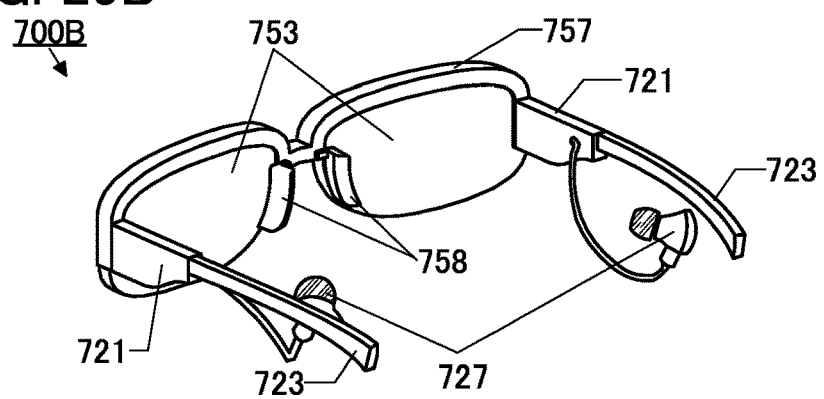

An electronic device 700A illustrated in FIG. 25A and an electronic device 700B illustrated in FIG. 25B each include a pair of display panels 751, a pair of housings 721, a communication portion (not illustrated), a pair of mounting portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions 756, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 25C:
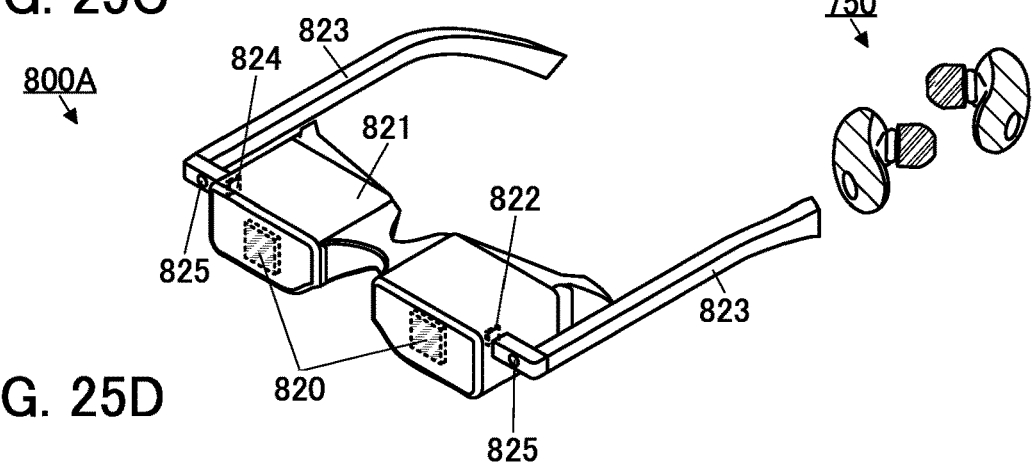
Figure 25D:
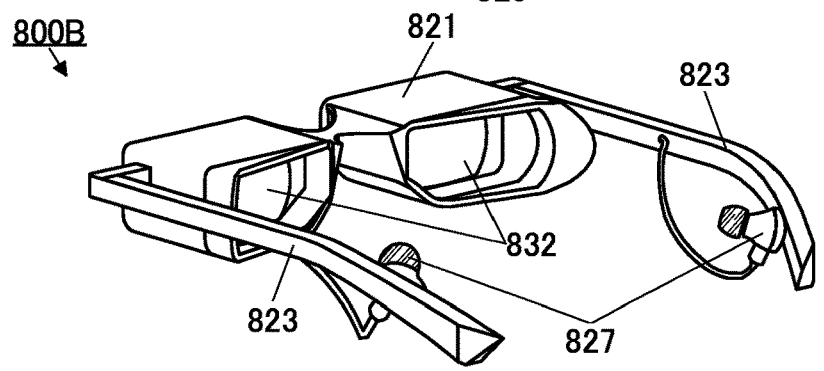

An electronic device 800A illustrated in FIG. 25C and an electronic device 800B illustrated in FIG. 25D each include a pair of display portions 820, a housing 821, a communication portion 822, a pair of mounting portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the mounting portions 823. FIG. 25C and the like show examples where the mounting portion 823 has a shape like a temple of glasses; however, one embodiment of the present invention is not limited thereto. The mounting portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portion 825 is provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the mounting portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 25A has a function of transmitting information to the earphones 750 with the wireless communication function. As another example, the electronic device 800A in FIG. 25C has a function of transmitting information to the earphones 750 with the wireless communication function.

The electronic device may include an earphone portion. The electronic device 700B in FIG. 25B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 25D includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferred because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

Figure 26A:
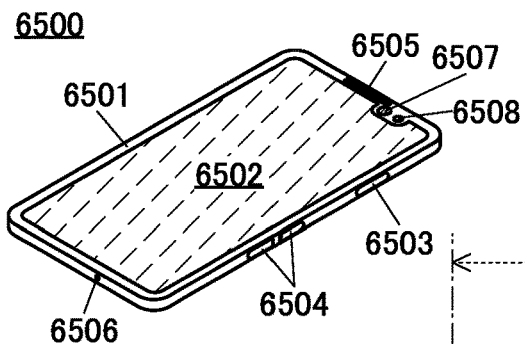
FIGS. 26A to 26F illustrate examples of electronic devices.

An electronic device 6500 illustrated in FIG. 26A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 26B:
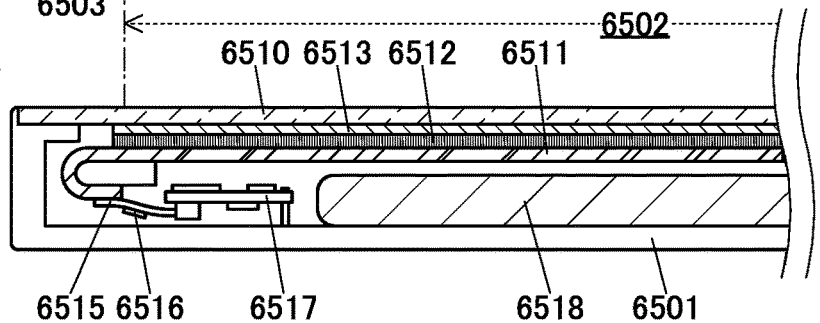

FIG. 26B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 26C:
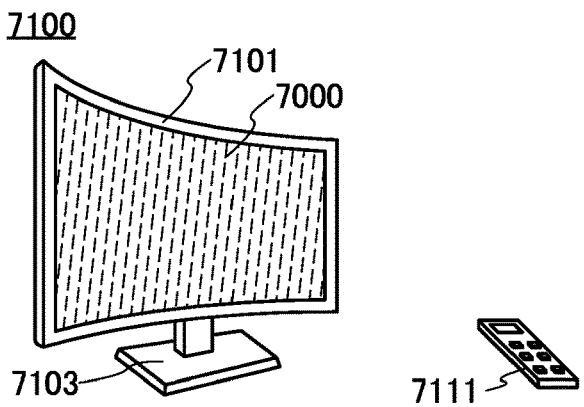

FIG. 26C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000.

Operation of the television device 7100 illustrated in FIG. 26C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 26D:
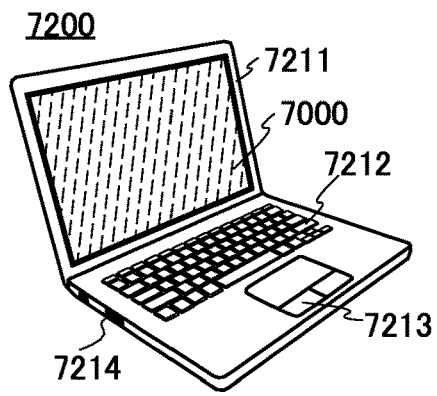

FIG. 26D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

Figure 26E:
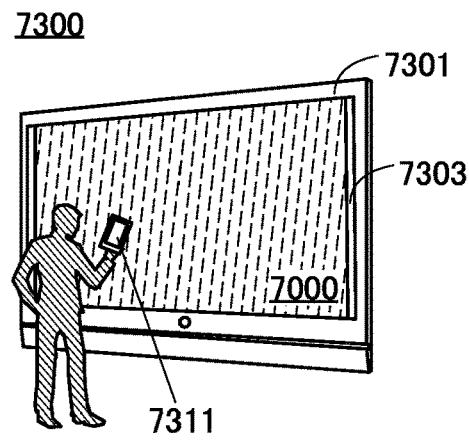
Figure 26F:
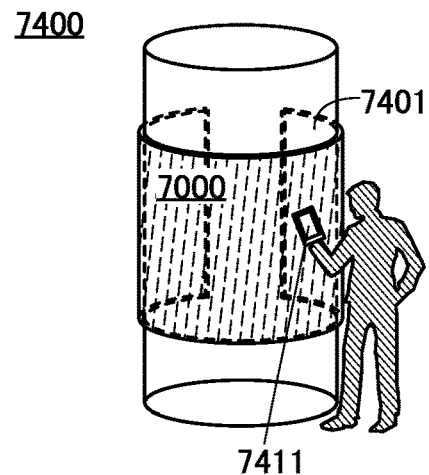

FIGS. 26E and 26F illustrate examples of digital signage.

Digital signage 7300 illustrated in FIG. 26E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 26F is digital signage 7400 attached to a cylindrical pillar 7401. The digital signage 7400 includes the display portion 7000 provided along a curved surface of the pillar 7401.

The display device of one embodiment of the present invention can be used in the display portion 7000 illustrated in each of FIGS. 26E and 26F.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 26E and 26F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 27A to 27G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

In FIGS. 27A to 27G, the display apparatus of one embodiment of the present invention can be used in the display portion 9001.

The electronic devices illustrated in FIGS. 27A to 27G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 27A to 27G will be described in detail below.

Figure 27A:
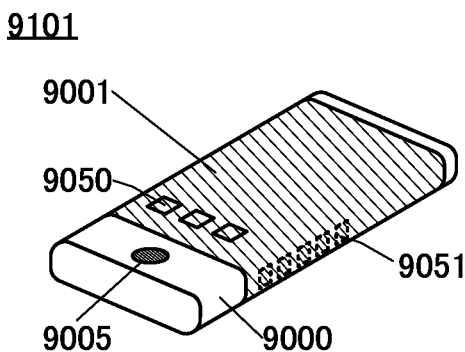
FIGS. 27A to 27G illustrate examples of electronic devices.

FIG. 27A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 27A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 27D:
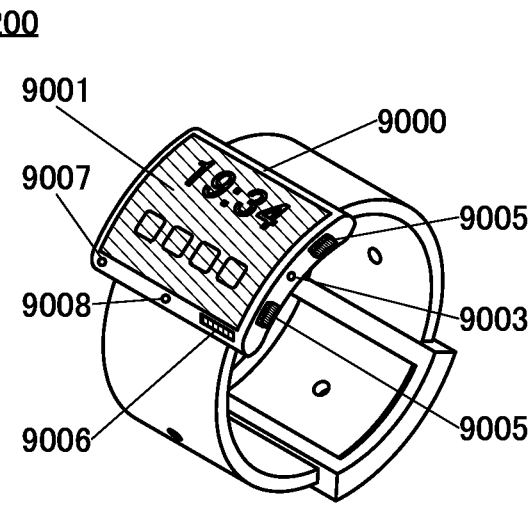
Figure 27B:
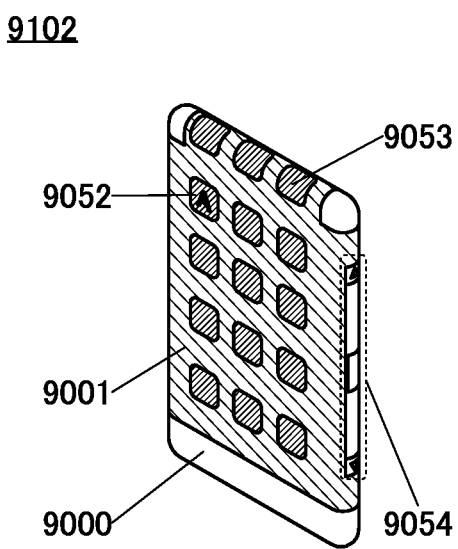

FIG. 27B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 27E:
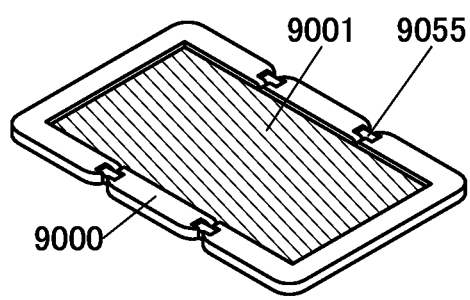
Figure 27C:
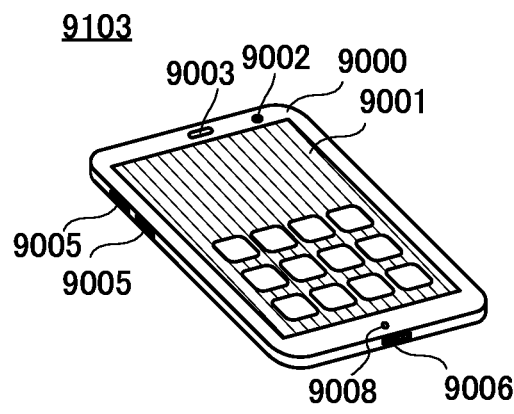

FIG. 27C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 27D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 27F:
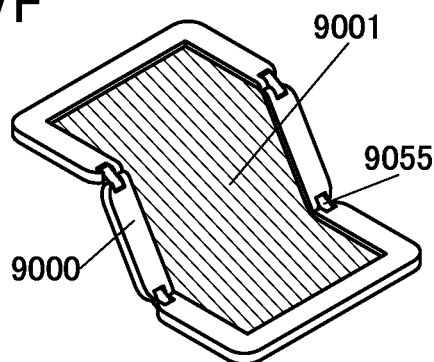
Figure 27G:
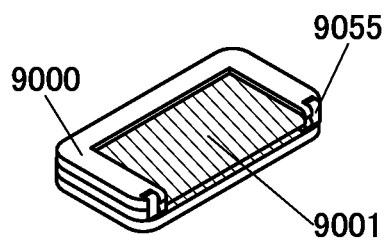

FIGS. 27E to 27G are perspective views of a foldable portable information terminal 9201. FIG. 27E is a perspective view showing the portable information terminal 9201 that is opened. FIG. 27G is a perspective view showing the portable information terminal 9201 that is folded. FIG. 27F is a perspective view showing the portable information terminal 9201 that is shifted from one of the states in FIGS. 27E and 27G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

Figure 28A:
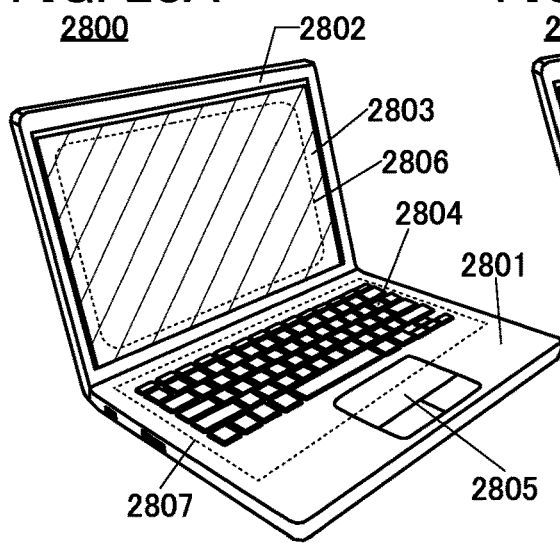
FIGS. 28A to 28F illustrate examples of electronic devices.
Figure 28B:
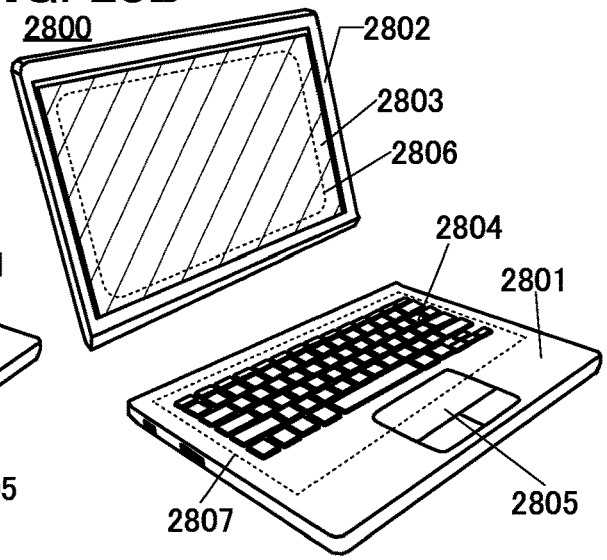

A personal computer 2800 illustrated in FIG. 28A includes a housing 2801, a housing 2802, a display portion 2803, a keyboard 2804, a pointing device 2805, and the like. A secondary battery 2807 is provided inside the housing 2801 and a secondary battery 2806 is provided inside the housing 2802. The display portion 2803 is the display device of one embodiment of the present invention, and has a touch panel function. As illustrated in FIG. 28B, the housing 2801 and the housing 2802 of the personal computer 2800 can be separated and the housing 2802 can be used alone as a tablet computer.

Figure 28C:
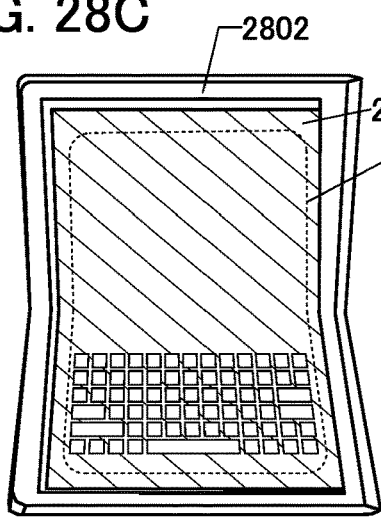

In a modification example of a personal computer illustrated in FIG. 28C, a flexible display is employed for the display portion 2803. With use of a flexible film as an exterior body, the secondary battery 2806 can be bendable secondary battery. Accordingly, the housing 2802, the display portion 2803, and the secondary battery 2806 can be used in a bent state as illustrated in FIG. 28C. At this time, part of the display portion 2803 can also be used as a keyboard as illustrated in FIG. 28C.

Figure 28D:
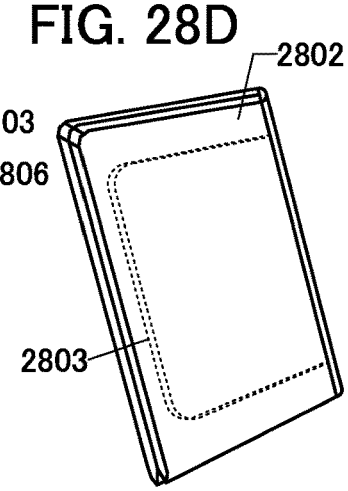
Figure 28E:
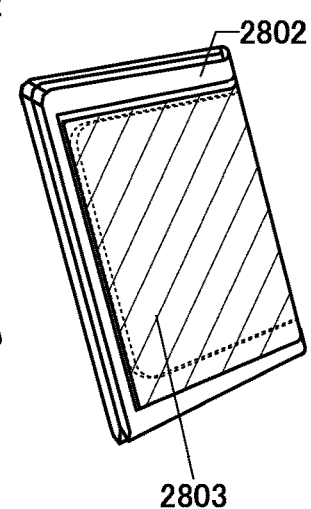

Furthermore, the housing 2802 can be folded so that the display portion 2803 is placed inward as illustrated in FIG. 28D, and the housing 2802 can be folded so that the display portion 2803 faces outward as illustrated in FIG. 28E.

Figure 28F:
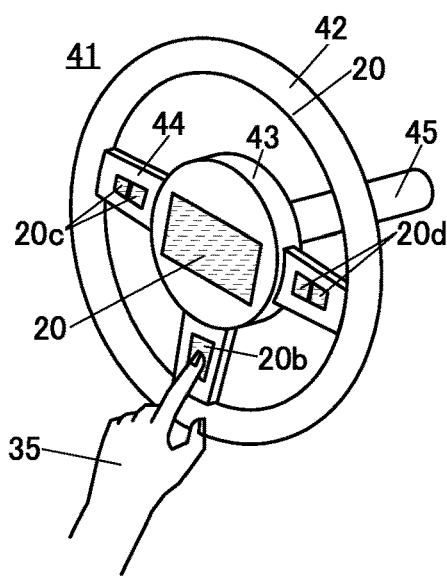

FIG. 28F is a perspective view of a steering wheel of a vehicle. A steering wheel 41 includes a rim 42, a hub 43, spokes 44, a shaft 45, and the like. A display portion 20 is provided on the surface of the hub 43. The display apparatus of one embodiment of the present invention can be used in the display portion 20. The three spokes 44 are each provided with a light-receiving and light-emitting portion. Specifically, the spoke 44 located on the lower side is provided with a light-receiving and light-emitting portion 20b; the spoke 44 located on the left side is provided with a plurality of light-receiving and light-emitting portions 20c; and the spoke 44 located on the right side is provided with a plurality of light-receiving and light-emitting portions 20d. When a driver holds a finger of a hand 35 over the light-receiving and light-emitting portion 20b, information on a fingerprint of the driver is acquired, and user authentication can be performed with the information. Touching the light-receiving and light-emitting portions 20c and 20d and the like, the driver can operate systems such as a navigation system, an audio system, and a call system provided in the vehicle. In addition, a variety of operations such as adjustment of a rearview mirror and a sideview mirror, turning on/off of an interior light, adjustment of luminance, and opening/closing a window are possible.

This embodiment can be combined with any of the other embodiments as appropriate.

This application is based on Japanese Patent Application Serial No. 2021-081730 filed with Japan Patent Office on May 13, 2021, the entire contents of which are hereby incorporated by reference.

What is claimed is:

1. A display apparatus comprising:
   a first subpixel;
   a second subpixel;
   a third subpixel;
   a fourth subpixel;
   a fifth subpixel; and
   a sixth subpixel,
   wherein the first subpixel, the second subpixel, and the third subpixel each emit light of a first color,
   wherein the fourth subpixel, the fifth subpixel, and the sixth subpixel each emit light of a second color,
   wherein the first color and the second color are different from each other,
   wherein the second subpixel is adjacent to the first subpixel in a first direction and adjacent to the third subpixel in a second direction,
   wherein the fifth subpixel is adjacent to the fourth subpixel in the first direction and adjacent to the sixth subpixel in the second direction,
   wherein the fifth subpixel is adjacent to the first subpixel in the first direction,
   wherein the first direction and the second direction intersect with each other,
   wherein the first subpixel comprises a first light-emitting device and a first region of a first color filter overlapping with the first light-emitting device,
   wherein the second subpixel comprises a second light-emitting device and a second region of the first color filter overlapping with the second light-emitting device,
   wherein the third subpixel comprises a third light-emitting device and a third region of the first color filter overlapping with the third light-emitting device,
   wherein the fourth subpixel comprises a fourth light-emitting device and a first region of a second color filter overlapping with the fourth light-emitting device,
   wherein the fifth subpixel comprises a fifth light-emitting device and a second region of the second color filter overlapping with the fifth light-emitting device,
   wherein the sixth subpixel comprises a sixth light-emitting device and a third region of the second color filter overlapping with the sixth light-emitting device, and
   wherein the first to sixth light-emitting devices each emit white light.

2. The display apparatus according to claim 1,
   wherein the first light-emitting device comprises a first EL layer with an island shape,
   wherein the second light-emitting device comprises a second EL layer with an island shape,
   wherein an inorganic insulating layer is provided in contact with at least part of a side surface of the first EL layer and at least part of a side surface of the second EL layer, and
   wherein an organic resin film is provided between the side surface of the first EL layer and the side surface of the second EL layer with the inorganic insulating layer therebetween.

3. The display apparatus according to claim 2,
   wherein the first light-emitting device comprises a common layer over the first EL layer,
   wherein the second light-emitting device comprises the common layer over the second EL layer, and
   wherein the common layer comprises at least one of a hole-injection layer, a hole-transport layer, a hole-blocking layer, an electron-blocking layer, an electron-transport layer, and an electron-injection layer.

4. A display module comprising:
   the display apparatus according to claim 1; and
   at least one of a connector and an integrated circuit.

5. An electronic device comprising:
   the display module according to claim 4; and
   at least one of a housing, a battery, a camera, a speaker, and a microphone.

6. The display apparatus according to claim 2, wherein the inorganic insulating layer comprises at least one of an oxide insulating film, a nitride insulating film, an oxynitride insulating film, and a nitride oxide insulating film.

7. A display apparatus comprising:
   a first subpixel;
   a second subpixel;
   a third subpixel;
   a fourth subpixel;
   a fifth subpixel; and
   a sixth subpixel,
   wherein the first subpixel, the second subpixel, and the third subpixel each emit light of a first color,
   wherein the fourth subpixel, the fifth subpixel, and the sixth subpixel each emit light of a second color,
   wherein the first color and the second color are different from each other,
   wherein a first pixel includes the first subpixel and the fourth subpixel,
   wherein a second pixel includes the second subpixel and the fifth subpixel,
   wherein a third pixel includes the third subpixel and the sixth subpixel,
   wherein the second subpixel is adjacent to the first subpixel in a first direction and adjacent to the third subpixel in a second direction,
   wherein the fifth subpixel is adjacent to the fourth subpixel in the first direction and adjacent to the sixth subpixel in the second direction,
   wherein the fifth subpixel is adjacent to the first subpixel in the first direction,
   wherein the first direction and the second direction intersect with each other,
   wherein the first subpixel comprises a first light-emitting device and a first region of a first color filter overlapping with the first light-emitting device,
   wherein the second subpixel comprises a second light-emitting device and a second region of the first color filter overlapping with the second light-emitting device,
   wherein the third subpixel comprises a third light-emitting device and a third region of the first color filter overlapping with the third light-emitting device,
   wherein the fourth subpixel comprises a fourth light-emitting device and a first region of a second color filter overlapping with the fourth light-emitting device, wherein the fifth subpixel comprises a fifth light-emitting device and a second region of the second color filter overlapping with the fifth light-emitting device, wherein the sixth subpixel comprises a sixth light-emitting device and a third region of the second color filter overlapping with the sixth light-emitting device, and wherein the first to sixth light-emitting devices each emit white light.

8. The display apparatus according to claim 7, wherein the first light-emitting device comprises a first EL layer with an island shape, wherein the second light-emitting device comprises a second EL layer with an island shape, wherein an inorganic insulating layer is provided in contact with at least part of a side surface of the first EL layer and at least part of a side surface of the second EL layer, and wherein an organic resin film is provided between the side surface of the first EL layer and the side surface of the second EL layer with the inorganic insulating layer therebetween.

9. The display apparatus according to claim 8, wherein the inorganic insulating layer comprises at least one of an oxide insulating film, a nitride insulating film, an oxynitride insulating film, and a nitride oxide insulating film.

10. The display apparatus according to claim 8, wherein the first light-emitting device comprises a common layer over the first EL layer, wherein the second light-emitting device comprises the common layer over the second EL layer, and wherein the common layer comprises at least one of a hole-injection layer, a hole-transport layer, a hole-blocking layer, an electron-blocking layer, an electron-transport layer, and an electron-injection layer.

11. A display module comprising:

the display apparatus according to claim 7; and at least one of a connector and an integrated circuit.

12. An electronic device comprising:

the display module according to claim 11; and at least one of a housing, a battery, a camera, a speaker, and a microphone.

13. A display apparatus comprising:

a first subpixel;

a second subpixel;

a third subpixel;

a fourth subpixel;

a fifth subpixel; and a sixth subpixel, wherein the first subpixel, the second subpixel, and the third subpixel each emit light of a first color, wherein the fourth subpixel, the fifth subpixel, and the sixth subpixel each emit light of a second color, wherein the first color and the second color are different from each other, wherein the second subpixel is adjacent to the first subpixel in a first direction and adjacent to the third subpixel in a second direction, wherein the fifth subpixel is adjacent to the fourth subpixel in the first direction and adjacent to the sixth subpixel in the second direction, wherein the fifth subpixel is adjacent to the first subpixel in the first direction, wherein the first direction and the second direction intersect with each other, wherein the first subpixel comprises a first light-emitting device and a first region of a first color filter overlapping with the first light-emitting device, wherein the second subpixel comprises a second light-emitting device and a second region of the first color filter overlapping with the second light-emitting device, wherein the third subpixel comprises a third light-emitting device and a third region of the first color filter overlapping with the third light-emitting device, wherein the fourth subpixel comprises a fourth light-emitting device and a first region of a second color filter overlapping with the fourth light-emitting device, wherein the fifth subpixel comprises a fifth light-emitting device and a second region of the second color filter overlapping with the fifth light-emitting device, wherein the sixth subpixel comprises a sixth light-emitting device and a third region of the second color filter overlapping with the sixth light-emitting device, wherein a protective layer comprising an inorganic material is provided on the first to sixth light-emitting devices, wherein the first color filter and the second color filter are provided over and in contact with the protective layer, and wherein the first to sixth light-emitting devices each emit white light.

14. The display apparatus according to claim 13, wherein the first light-emitting device comprises a first EL layer with an island shape, wherein the second light-emitting device comprises a second EL layer with an island shape, wherein an inorganic insulating layer is provided in contact with at least part of a side surface of the first EL layer and at least part of a side surface of the second EL layer, and wherein an organic resin film is provided between the side surface of the first EL layer and the side surface of the second EL layer with the inorganic insulating layer therebetween.

15. The display apparatus according to claim 14, wherein the inorganic insulating layer comprises at least one of an oxide insulating film, a nitride insulating film, an oxynitride insulating film, and a nitride oxide insulating film.

16. The display apparatus according to claim 14, wherein the first light-emitting device comprises a common layer over the first EL layer, wherein the second light-emitting device comprises the common layer over the second EL layer, and wherein the common layer comprises at least one of a hole-injection layer, a hole-transport layer, a hole-blocking layer, an electron-blocking layer, an electron-transport layer, and an electron-injection layer.

17. A display module comprising:

the display apparatus according to claim 13; and at least one of a connector and an integrated circuit.

18. An electronic device comprising:

the display module according to claim 17; and at least one of a housing, a battery, a camera, a speaker, and a microphone.

* * * * *